(12) United States Patent
Sako et al.

(10) Patent No.: US 7,324,423 B2
(45) Date of Patent: Jan. 29, 2008

(54) DATA RECORDING METHOD RECORDER AND DATA REPRODUCING METHOD AND DEVICE

(75) Inventors: Yoichiro Sako, Tokyo (JP); Akiya Saito, Kanagawa (JP); Yoshinobu Usui, Kanagawa (JP); Yoriaki Kanada, Kanagawa (JP); Tomihiro Nakagawa, Kanagawa (JP); Tatsuya Inokuchi, Tokyo (JP); Shunsuke Furukawa, Tokyo (JP); Takashi Kihara, Chiba (JP)

(73) Assignee: Sony Corporation, Tokyo (JP)

( * ) Notice: Subject to any disclaimer, the term of this patent is extended or adjusted under 35 U.S.C. 154(b) by 495 days.

(21) Appl. No.: 10/451,147

(22) PCT Filed: Oct. 25, 2002

(86) PCT No.: PCT/JP02/11109

§ 371 (c)(1),
(2), (4) Date: Jun. 27, 2003

(87) PCT Pub. No.: WO03/038822

PCT Pub. Date: May 8, 2003

(65) Prior Publication Data

US 2004/0052190 A1    Mar. 18, 2004

(30) Foreign Application Priority Data

Oct. 31, 2001  (JP)  .............................. 2001-335406
Nov. 9, 2001   (JP)  .............................. 2001-345330

(51) Int. Cl.
*G11B 5/09*  (2006.01)

(52) U.S. Cl. ................................. 369/59.24; 369/59.23
(58) Field of Classification Search ..................... None
See application file for complete search history.

(56) References Cited

U.S. PATENT DOCUMENTS 6,058,087 A * 5/2000 Tomita ..................... 369/47.22
6,177,892 B1 * 1/2001 Ko ............................. 341/106
6,850,573 B1 * 2/2005 Noda ......................... 375/262

FOREIGN PATENT DOCUMENTS

| JP | 8-69626 | 3/1996 |
|---|---|---|
| JP | 8-77717 | 3/1996 |
| JP | 8-149013 | 6/1996 |
| JP | 8-287620 | 11/1996 |
| JP | 2001-357536 | 12/2001 |
| JP | 2001357536 A * | 12/2001 |
| JP | 2002-109835 | 4/2002 |
| JP | 2002-124034 | 4/2002 |
| WO | 97/14144 | 4/1997 |

* cited by examiner

*Primary Examiner*—Wayne Young
*Assistant Examiner*—Adam R. Giesy
(74) *Attorney, Agent, or Firm*—Oblon, Spivak, McClelland, Maier & Neustadt, P.C.

(57) ABSTRACT

The present invention is relative with a method for recording further data on a recording medium on which there re pre-recorded data obtained on modulating M-bit data to N-bit data, where M<N. The further recorded data are recorded by changing a certain bit or bits of the N-bit data, with the remaining portion of the bits of the N-bit data being fixed.

92 Claims, 44 Drawing Sheets

| FRAME | |
|---|---|
| 1 | $S_0$ |
| 2 | $S_1$ |
| 3 | $P_1\ Q_1\ R_1\ S_1\ T_1\ U_1\ V_1\ W_1$ |
| 4 | $P_2\ Q_2\ R_2\ S_2\ T_2\ U_2\ V_2\ W_2$ |
| 5 | |
| 6 | · |
| · | · |
| · | · |
| · | |
| 95 | $P_{93}\ Q_{93}\ R_{93}\ S_{93}\ T_{93}\ U_{93}\ V_{93}\ W_{93}$ |
| 96 | $P_{94}\ Q_{94}\ R_{94}\ S_{94}\ T_{94}\ U_{94}\ V_{94}\ W_{94}$ |
| 97 | $P_{95}\ Q_{95}\ R_{95}\ S_{95}\ T_{95}\ U_{95}\ V_{95}\ W_{95}$ |
| 98 | $P_{96}\ Q_{96}\ R_{96}\ S_{96}\ T_{96}\ U_{96}\ V_{96}\ W_{96}$ |
| 1 | $S_0$ |
| 2 | $S_1$ |
| | $P_1\ Q_1\ R_1\ S_1\ T_1\ U_1\ V_1\ W_1$ |
| | $P_2\ Q_2\ R_2\ S_2\ T_2\ U_2\ V_2\ W_2$ |
| | · |
| | · |
| | · |

FIG.3

| | data bits | channel bits | | | |
|---|---|---|---|---|---|
| 0 | 00000000 | 01001000100000 | 64 | 01000000 | 01001000100100 |
| 1 | 00000001 | 10000100000000 | 65 | 01000001 | 10000100100100 |
| 2 | 00000010 | 10010000100000 | 66 | 01000010 | 10010000100100 |
| 3 | 00000011 | 10001000100000 | 67 | 01000011 | 10001000100100 |
| 4 | 00000100 | 01000100000000 | 68 | 01000100 | 01000100100100 |
| 5 | 00000101 | 00000100010000 | 69 | 01000101 | 00000100100100 |
| 6 | 00000110 | 00010000100000 | 70 | 01000110 | 00010000100100 |
| 7 | 00000111 | 00100100000000 | 71 | 01000111 | 00100100100100 |
| 8 | 00001000 | 01001001000000 | 72 | 01001000 | 01001001000100 |
| 9 | 00001001 | 10000001000000 | 73 | 01001001 | 10000001000100 |
| 10 | 00001010 | 10010001000000 | 74 | 01001010 | 10010001000100 |
| 11 | 00001011 | 10001001000000 | 75 | 01001011 | 10001001000100 |
| 12 | 00001100 | 01000001000000 | 76 | 01001100 | 01000001000100 |
| 13 | 00001101 | 00000001000000 | 77 | 01001101 | 00000001000100 |
| 14 | 00001110 | 00010001000000 | 78 | 01001110 | 00010001000100 |
| 15 | 00001111 | 00100001000000 | 79 | 01001111 | 00100001000100 |
| 16 | 00010000 | 10000000100000 | 80 | 01010000 | 10000000100100 |
| 17 | 00010001 | 10000010000000 | 81 | 01010001 | 10000010000100 |
| 18 | 00010010 | 10010010000000 | 82 | 01010010 | 10010010000100 |
| 19 | 00010011 | 00100000100000 | 83 | 01010011 | 00100000100100 |
| 20 | 00010100 | 01000010000000 | 84 | 01010100 | 01000010000100 |
| 21 | 00010101 | 00000010000000 | 85 | 01010101 | 00000010000100 |
| 22 | 00010110 | 00010010000000 | 86 | 01010110 | 00010010000100 |
| 23 | 00010111 | 00100010000000 | 87 | 01010111 | 00100010000100 |
| 24 | 00011000 | 01001000010000 | 88 | 01011000 | 01001000000100 |
| 25 | 00011001 | 10000000010000 | 89 | 01011001 | 10000000000100 |
| 26 | 00011010 | 10010000010000 | 90 | 01011010 | 10010000000100 |
| 27 | 00011011 | 10001000010000 | 91 | 01011011 | 10001000000100 |
| 28 | 00011100 | 01000000010000 | 92 | 01011100 | 01000000000100 |
| 29 | 00011101 | 00001000010000 | 93 | 01011101 | 00001000000100 |
| 30 | 00011110 | 00010000010000 | 94 | 01011110 | 00010000000100 |
| 31 | 00011111 | 00100000010000 | 95 | 01011111 | 00100000000100 |
| 32 | 00100000 | 00000000100000 | 96 | 01100000 | 01001000100010 |
| 33 | 00100001 | 10000100001000 | 97 | 01100001 | 10000100100010 |
| 34 | 00100010 | 00001000100000 | 98 | 01100010 | 10010000100010 |
| 35 | 00100011 | 00100100100000 | 99 | 01100011 | 10001000100010 |
| 36 | 00100100 | 01000100001000 | 100 | 01100100 | 01000100100010 |
| 37 | 00100101 | 00000100001000 | 101 | 01100101 | 00000000100010 |
| 38 | 00100110 | 01000000100000 | 102 | 01100110 | 01000000100100 |
| 39 | 00100111 | 00100100001000 | 103 | 01100111 | 00100100100010 |
| 40 | 00101000 | 01001001001000 | 104 | 01101000 | 01001001000010 |
| 41 | 00101001 | 10000001001000 | 105 | 01101001 | 10000001000010 |
| 42 | 00101010 | 10010001001000 | 106 | 01101010 | 10010001000010 |
| 43 | 00101011 | 10001001001000 | 107 | 01101011 | 10001001000010 |
| 44 | 00101100 | 01000001001000 | 108 | 01101100 | 01000001000010 |
| 45 | 00101101 | 00000001001000 | 109 | 01101101 | 00000001000010 |
| 46 | 00101110 | 00010001001000 | 110 | 01101110 | 00010001000010 |
| 47 | 00101111 | 00100001001000 | 111 | 01101111 | 00100001000010 |
| 48 | 00110000 | 00000100000000 | 112 | 01110000 | 10000000100010 |
| 49 | 00110001 | 10000010001000 | 113 | 01110001 | 10000010000010 |
| 50 | 00110010 | 10010010001000 | 114 | 01110010 | 10010010000010 |
| 51 | 00110011 | 10001000010000 | 115 | 01110011 | 00100000100010 |
| 52 | 00110100 | 01000010001000 | 116 | 01110100 | 01000010000010 |
| 53 | 00110101 | 00000010001000 | 117 | 01110101 | 00000010000010 |
| 54 | 00110110 | 00010010001000 | 118 | 01110110 | 00010010000010 |
| 55 | 00110111 | 00100010001000 | 119 | 01110111 | 00100010000010 |
| 56 | 00111000 | 01001000001000 | 120 | 01111000 | 01001000000010 |
| 57 | 00111001 | 10000000001000 | 121 | 01111001 | 00001001001000 |
| 58 | 00111010 | 10010000001000 | 122 | 01111010 | 10010000000010 |
| 59 | 00111011 | 10001000001000 | 123 | 01111011 | 10001000000010 |
| 60 | 00111100 | 01000000001000 | 124 | 01111100 | 01000000000010 |
| 61 | 00111101 | 00001000001000 | 125 | 01111101 | 00001000000010 |
| 62 | 00111110 | 00010000001000 | 126 | 01111110 | 00010000000010 |
| 63 | 00111111 | 00100000001000 | 127 | 01111111 | 00100000000010 | d1————d8     C1————C14

FIG.7

| | data bits | channel bits | | data bits | channel bits |
|---|---|---|---|---|---|
| 128 | 10000000 | 01001000100001 | 192 | 11000000 | 01000100100000 |
| 129 | 10000001 | 10000100100001 | 193 | 11000001 | 10000100010001 |
| 130 | 10000010 | 10010000100001 | 194 | 11000010 | 10010010010000 |
| 131 | 10000011 | 10001000100001 | 195 | 11000011 | 00001000100100 |
| 132 | 10000100 | 01000100100001 | 196 | 11000100 | 01000100010001 |
| 133 | 10000101 | 00000000100001 | 197 | 11000101 | 00000100010001 |
| 134 | 10000110 | 00010000100001 | 198 | 11000110 | 00010010010000 |
| 135 | 10000111 | 00100100100001 | 199 | 11000111 | 00100100010001 |
| 136 | 10001000 | 01001001000001 | 200 | 11001000 | 00001001000001 |
| 137 | 10001001 | 10000001000001 | 201 | 11001001 | 10000100000001 |
| 138 | 10001010 | 10010001000001 | 202 | 11001010 | 00001001000100 |
| 139 | 10001011 | 10001001000001 | 203 | 11001011 | 00001001000000 |
| 140 | 10001100 | 01000001000001 | 204 | 11001100 | 01000100000001 |
| 141 | 10001101 | 00000001000001 | 205 | 11001101 | 00000100000001 |
| 142 | 10001110 | 00010001000001 | 206 | 11001110 | 00000010010000 |
| 143 | 10001111 | 00100001000001 | 207 | 11001111 | 00100100000001 |
| 144 | 10010000 | 10000000100001 | 208 | 11010000 | 00000100100100 |
| 145 | 10010001 | 10000010000001 | 209 | 11010001 | 10000100010010 |
| 146 | 10010010 | 10010010000001 | 210 | 11010010 | 10010010010001 |
| 147 | 10010011 | 00100000100001 | 211 | 11010011 | 10000100100000 |
| 148 | 10010100 | 01000010000001 | 212 | 11010100 | 01000010010001 |
| 149 | 10010101 | 00000010000001 | 213 | 11010101 | 00000010010001 |
| 150 | 10010110 | 00010010000001 | 214 | 11010110 | 00010010010001 |
| 151 | 10010111 | 00100010000001 | 215 | 11010111 | 00100010010001 |
| 152 | 10011000 | 01001000000001 | 216 | 11011000 | 01001000010001 |
| 153 | 10011001 | 10000010010000 | 217 | 11011001 | 10000000010001 |
| 154 | 10011010 | 10010000000001 | 218 | 11011010 | 10010000010001 |
| 155 | 10011011 | 10001000000001 | 219 | 11011011 | 10001000010001 |
| 156 | 10011100 | 01000010010001 | 220 | 11011100 | 01000000010001 |
| 157 | 10011101 | 00001000000001 | 221 | 11011101 | 00000000010001 |
| 158 | 10011110 | 00010000000001 | 222 | 11011110 | 00010000010001 |
| 159 | 10011111 | 00100000000001 | 223 | 11011111 | 00100000010001 |
| 160 | 10100000 | 00001000100001 | 224 | 11100000 | 01000100000010 |
| 161 | 10100001 | 10000100001001 | 225 | 11100001 | 00000100000010 |
| 162 | 10100010 | 01000100010000 | 226 | 11100010 | 10000100010010 |
| 163 | 10100011 | 00000100100001 | 227 | 11100011 | 00100100000010 |
| 164 | 10100100 | 01000100001001 | 228 | 11100100 | 01000100010010 |
| 165 | 10100101 | 00000100001001 | 229 | 11100101 | 00000100010010 |
| 166 | 10100110 | 01000000100001 | 230 | 11100110 | 01000000100010 |
| 167 | 10100111 | 00100100001001 | 231 | 11100111 | 00100100010010 |
| 168 | 10101000 | 01001001001001 | 232 | 11101000 | 01001001001001 |
| 169 | 10101001 | 10000001001001 | 233 | 11101001 | 10000100000010 |
| 170 | 10101010 | 10010001001001 | 234 | 11101010 | 00001001001001 |
| 171 | 10101011 | 10001001001001 | 235 | 11101011 | 00001001001010 |
| 172 | 10101100 | 01000001001001 | 236 | 11101100 | 01000100000100 |
| 173 | 10101101 | 00000001001001 | 237 | 11101101 | 00000100000100 |
| 174 | 10101110 | 00010001001001 | 238 | 11101110 | 00010000100010 |
| 175 | 10101111 | 00100001001001 | 239 | 11101111 | 00100100000100 |
| 176 | 10110000 | 00000100100000 | 240 | 11110000 | 00000100100010 |
| 177 | 10110001 | 10000010001001 | 241 | 11110001 | 10000010010010 |
| 178 | 10110010 | 10010010001001 | 242 | 11110010 | 10010010010010 |
| 179 | 10110011 | 00100100001000 | 243 | 11110011 | 00001000100010 |
| 180 | 10110100 | 01000010001001 | 244 | 11110100 | 01000010010010 |
| 181 | 10110101 | 00000010001001 | 245 | 11110101 | 00000010010010 |
| 182 | 10110110 | 00010010001001 | 246 | 11110110 | 00010010010010 |
| 183 | 10110111 | 00100010001001 | 247 | 11110111 | 00100010010010 |
| 184 | 10111000 | 00010001001001 | 248 | 11111000 | 01001000010010 |
| 185 | 10111001 | 10000000001001 | 249 | 11111001 | 10000000010010 |
| 186 | 10111010 | 10010000001001 | 250 | 11111010 | 10010000010010 |
| 187 | 10111011 | 10001000001001 | 251 | 11111011 | 10001000010010 |
| 188 | 10111100 | 01000000001001 | 252 | 11111100 | 01000000010010 |
| 189 | 10111101 | 00001000001001 | 253 | 11111101 | 00000000010010 |
| 190 | 10111110 | 00010000001001 | 254 | 11111110 | 00010000010010 |
| 191 | 10111111 | 00100000001001 | 255 | 11111111 | 00100000010010 | d1----d8    C1----C14

```
              EFM           P Q R S T U V W
0X40h   PRE-MODULATION      0 1 0 0 0 0 0 0
(No,64) POST-MODULATION     0 1 0 0 1 0 0 0 1 0 0 1 0 0
                                     LAND
        NRZI                ⎤_PIT_⎡‾‾‾⎤_⎡‾⎤↓_L
  ↓

0X00h   PRE-MODULATION      0 0 0 0 0 0 0 0
(No,0)  POST-MODULATION     0 1 0 0 1 0 0 0 1 0 0 0 0 0
        NRZI
```

FIG.9B

```
0X41h   PRE-MODULATION      0 1 0 0 0 0 0 1
(No,65) POST-MODULATION     1 0 0 0 0 1 0 0 1 0 0 1 0 0
                                                 ↓_L
        NRZI
  ↓

0X01h   PRE-MODULATION      0 0 0 0 0 0 0 1
(No,1)  POST-MODULATION     1 0 0 0 0 1 0 0 0 0 0 0 0 0
        NRZI
```

FIG.9C

```
0X44h   PRE-MODULATION      0 1 0 0 0 1 0 0
(No,68) POST-MODULATION     0 1 0 0 0 1 0 0 1 0 0 1 0 0
                                                 ↓_L
        NRZI
  ↓

0X04h   PRE-MODULATION      0 0 0 0 0 1 0 0
(No,4)  POST-MODULATION     0 1 0 0 0 1 0 0 0 0 0 0 0 0
        NRZI
```

FIG.9D

```
0X47h   PRE-MODULATION      0 1 0 0 0 1 1 1
(No,71) POST-MODULATION     0 0 1 0 0 1 0 0 1 0 0 1 0 0
                                                 ↓_L
        NRZI
  ↓

0X07h   PRE-MODULATION      0 0 0 0 0 1 1 1
(No,7)  POST-MODULATION     0 0 1 0 0 1 0 0 0 0 0 0 0 0
        NRZI (X is don't care)
```

| $a_0$ | $a_1$ | contents | $a_2$ | $a_3$ | contents |
|---|---|---|---|---|---|
| 0 | 0 | one in disc | 0 | 0 | leading frame |
| 0 | 1 | one in session | 0 | 1 | succeeding frame |
| 1 | 0 | one in track | 1 | 0 | Reserve |
| 1 | 1 | Reserve | 1 | 1 | Reserve |

FIG. 19

DATA RECORDING METHOD RECORDER AND DATA REPRODUCING METHOD AND DEVICE

TECHNICAL FIELD

This invention relates to a method and apparatus for recording discrimination data used for discriminating recording data, such as contents data, recorded on a recording medium, and a method and apparatus for reproducing a recording medium, having the discrimination data recorded thereon.

This application claims priority of Japanese Patent Application No.2001-335406, filed on Oct. 31, 2002, and of Japanese Patent Application No.2001-345330, filed on Nov. 9, 2001, the entireties of which are incorporated by reference herein.

BACKGROUND ART

In the Compact Disc, referred to below simply as CD, used as a recording medium for contents data, such as musical numbers, the data obtained on 8-14 (eight-to-fourteen) modulation (EFM) are recorded by NRZI (non return to zero inverted) in which pulse polarities are inverted with [0] or [1]. Turning to the frame format for a CD, each frame is made up by 24-bit synchronization signals, followed by a 14-bit sub-code, followed in turn by recording data in which each symbol is made up by 14 bits. The sub-code is management data in which, prior to modulation, one symbol is formed by 8 bits, and which is stored in each frame. The respective bits of the sub-code are allocated to P to W, of which the sub-code P is used for example as a start flag for indicating the pause between musical numbers, the sub-code Q is used for recording e.g., the address information, and in which the remaining six sub-codes R to W are collected together and used e.g., for graphics.

Between the neighboring symbols, there are inserted three coupling bits. These coupling bits are used for evading violation of the EFM conversion rule when the symbols are connected together, and are selected so as to render the absolute value of the digital sum value (DSV) smaller.

In an optical disc, such as CD, there are occasions where discrimination data need to be post-recorded, after recording the recording data, such as contents data, in order to supervise the copyright of the recorded recording data. If this discrimination data is recorded as sub-code, one symbol in its entirety becomes a different one. For example, if the discrimination data is recorded in the sub-code Q, the sub-code P or the sub-codes R to W are changed, as a result of which the contents data, already recorded, become unreproducible.

The discrimination data, post-recorded on the optical disc, is recorded by fusing a light beam reflecting film by illuminating a light beam on the land on the substrate forming the optical disc, for not causing the reflection of the light beam, thereby forming a simulated pit.

Meanwhile, in the EFM, the minimum run length Tmin (minimum length between transitions) is set to 2, the maximum run length Tmax (maximum length between transitions) is set to 10 and coupling bits of [000], [100], [010] or [001] are inserted between symbols of 14-bit modulation patterns. If, in recording the discrimination data by changing the lands of the latter half of the modulation pattern into pits, [000] is selected as the succeeding coupling bits, it may be an occurrence that the maximum run length Tmax (maximum length between transitions) exceeds 11 after recording the discrimination data, thus violating the modulation rule.

In recording discrimination data, post-recorded on the optical disc, the recording position of the discrimination data is indefinite because the recording position may be a land or a pit depending on data ahead or in rear of the symbol in which to record the data. Since the pit is formed as a recess, it is low in reflectance, such that, if the reflective film is fused by illuminating a light beam in the pit area, the recording and/or reproducing apparatus is unable to detect the recorded data.

A DVD-ROM has been proposed as an optical disc currently used as a recording medium for contents data, such as music numbers. In the DVD-ROM, BCA (Burst Cutting Area) is defined to allow for recording, as additional information, the discrimination data for discriminating the main data, such as contents data.

The BCA is provided in an area of the disc different from the disc area where the main data, such as contents data, have been recorded. The optical disc, provided with the BCA, can be reproduced except by a dedicated recording and/or reproducing apparatus or a dedicated reproducing apparatus.

The discrimination data is recorded on the individual optical discs and, in order not to deteriorate the production efficiency, needs to be of a data volume such as allows for recording within a preset time interval, such as several seconds. On the other hand, if the recording speed in the recording apparatus is increased such that the data recording volume per unit time is increased, it becomes possible to increase the data volume of the discrimination data. Thus, in providing a new optical disc, the recording capacity of a recordable area for e.g., discrimination data is sometimes set so as to be larger than the data volume of the actually recorded data, in such case, it is necessary to record e.g., the data length of the discrimination data.

DISCLOSURE OF THE INVENTION

It is therefore an object of the present invention to provide a data recording method and apparatus and a data reproducing method and apparatus in which data for discriminating the main data, such as contents data, may be recorded as additional data in an area where data have already been recorded, as compatibility is maintained with respect to pre-existing formats, and a recording medium where the discrimination data has already been recorded.

It is another object of the present invention to provide a data recording method and apparatus and a data reproducing method and apparatus in which, even after recording the discrimination data for discriminating the main data, such as contents data, recording may be made so as not to violate the modulation rule of main data recorded on the recording medium, and a recording medium where the discrimination data has already been recorded.

It is yet another object of the present invention to provide a provide a data recording method and apparatus and a data reproducing method and apparatus in which the capacity of data, post-recorded on the recording medium, such as discrimination data, can be easily extended, and a recording medium where the discrimination data has already been recorded.

For accomplishing the above object, the present invention provides a recording method in which, on a recording medium, having pre-recorded thereon data modulated from M bit data to N bit data, where M<N, further data are recorded in such a manner that a certain bit or bits of the N bits are changed, with the remaining bits of the N-bit data being fixed.

Preferably, the N-bit data are pre-recorded on the recording medium as a pattern of crests and recesses composed of bit parts and land parts between the bit parts and the coupling bits positioned between the N-bit data in which the certain bit or bits have been changed and N-bit data next following the first-stated N-bit data are selected so as to be changed from the land part to the pit part or vice versa.

The present invention also provides a recording apparatus comprising a head unit for scanning a recording medium having pre-recorded thereon data obtained on modulating M-bit data into N-bit data, where M<N, as a pattern of crests and recesses composed of bit parts and land parts between the bit parts, a controller for controlling whether or not discrimination data is to be recorded based on data read out from the head unit, and a signal processing unit for processing the discrimination data for recording and for supplying output data to the head unit. The head unit records the discrimination data so that the certain bit or bits of the N-bit data are changed, with the remaining bits of the N-bit data being fixed.

The present invention also provides a method for reproducing data modulated from M bit data to N bit data, where M<N, from a recording medium having the data pre-recorded thereon, the recording medium also having further data recorded thereon so that a certain bit or bits of the N-bit data are changed, with the remaining portion of the bits of the N-bit data being fixed, in which the method comprises reading out the data from the recording medium, extracting the remaining portion of the bits of the N-bit data of the read-out data, determining whether or not the remaining portion of the bits of the N-bit data extracted is of a fixed value, and giving a decision that there is no error if the extracted remaining portion of the N-bit data is of a fixed value.

The present invention also provides a method for reproducing data modulated from M bit data to N bit data, where M<N, from a recording medium having the data pre-recorded thereon, the recording medium also having further data recorded thereon so that a certain bit or bits of the N-bit data are changed, with the remaining portion of the bits of the N-bit data being fixed, in which the method comprises reading out the data from the recording medium, extracting the remaining portion of the bits of the N-bit data of the read-out data, determining whether or not the remaining portion of the bits of the N-bit data extracted is of a fixed value, and reproducing the further recorded data if the extracted remaining portion of the N-bit data is determined to be of the fixed value.

The present invention also provides a method for reproducing data modulated from M bit data to N bit data, where M<N, from a recording medium having the data pre-recorded thereon, the recording medium also having further data recorded thereon so that a certain bit or bits of the N-bit data are changed, with the remaining portion of the bits of the N-bit data being fixed, in which the method comprises reading out the data from the recording medium, detecting whether or not the certain bit or bits of the N-bit data read out is of a fixed value, and reproducing the further recorded data if the extracted remaining portion of the N-bit data is of the fixed value.

The present invention also provides a reproducing apparatus comprising a head unit for reading out data from a recording medium on which data modulated from M bit data to N bit data and on which the data so modulated are pre-recorded, where M<N, and on which further data are recorded so that a certain bit or bits of the N-bit data are changed, with the remaining portion of the bits of the N-bit data being fixed, a demodulating unit for demodulating the data read out by the head unit, and a controller for extracting the remaining portion of the bits of the N-bit data read out by the head unit, verifying whether or not the remaining portion of the bits of the N-bit data extracted is of a fixed value, and for supplying the further recorded data to the demodulating unit if the extracted remaining portion of the bits of the N-bit data is verified to be of the fixed value.

The present invention also provides a recording medium on which data modulated from M bit data to N bit data are pre-recorded, where M<N, and on which further data are recorded so that a certain bit or bits of the N-bit data are changed, with the remaining portion of the bits of the N-bit data being fixed.

Preferably, the N-bit data are pre-recorded on the recording medium as a pattern of crests and recesses composed of bit parts and land parts between the bit parts and wherein the coupling bits positioned between the N-bit data in which the certain bit or bits have been changed and N-bit data next following the first-stated N-bit data are changed from the land part to the pit part or vice versa.

Other objects, features and advantages of the present invention will become more apparent from reading the embodiments of the present invention as shown in the drawings.

BRIEF DESCRIPTION OF THE DRAWINGS

FIG. 3 illustrates details of the sub-coding frame format.

FIG. 7 illustrates an EFM conversion table.

FIG. 8, continuing from FIG. 7, illustrates the EFM conversion table shown in FIG. 7.

FIGS. 9A to 9D illustrate sub-codes of areas for recording discrimination data.

FIG. 19 illustrates the contents of an index.

BEST MODE FOR CARRYING OUT THE INVENTION

Figure 1:
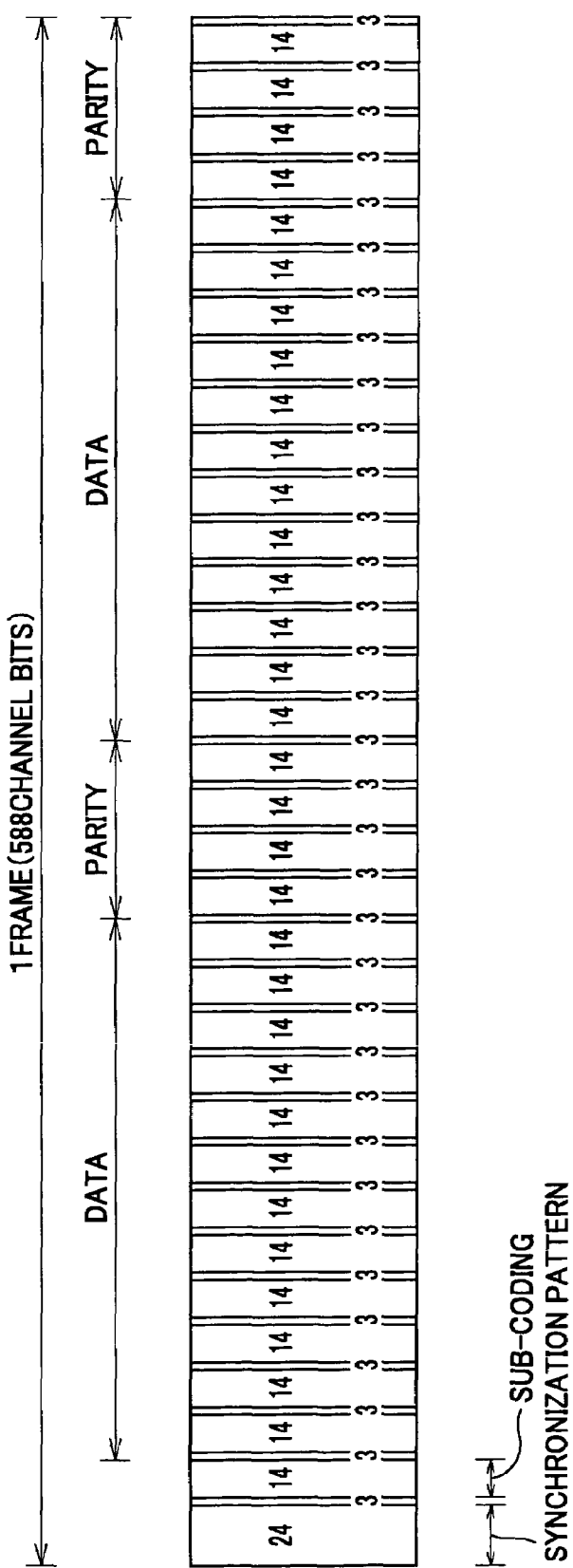
FIG. 1 illustrates the signal format of an optical disc embodying the present invention.

Referring to the drawings, an optical disc embodying the present invention, a method and an apparatus for recording data on this optical disc, and a method and an apparatus for reproducing data recorded on this optical disc, according to a first embodiment of the present invention, are explained in detail.

In the optical disc according to the present invention, a lead-in area, in which to record TOC (table of contents) data, is provided towards an inner rim of the disc, a data recording area, in which to record recording data, such as contents data, is provided on a radially outer side of the lead-in area, and a lead-out area is provided on a radially outer side of the data recording area. On this optical disc, there are recorded data by the same recording format as that for a CD. That is, data modulated by eight to fourteen modulation (EFM) are recorded in accordance with a recording format shown in FIG. 1. That is, referring to FIG. 1, each frame begins with a 24-bit synchronization signal (a pattern of 11T, 11T', where ' denotes transition, and 2T, or an inverted pattern thereof), followed by one symbol (14 bits) of sub-coding, followed in turn by 32 symbols of data and parity, so that each frame is made up by 588 channel bits. Between neighboring symbols, a 3-bit symbol [000], [100], [010] or [010] is inserted as coupling bits.

Figure 2:
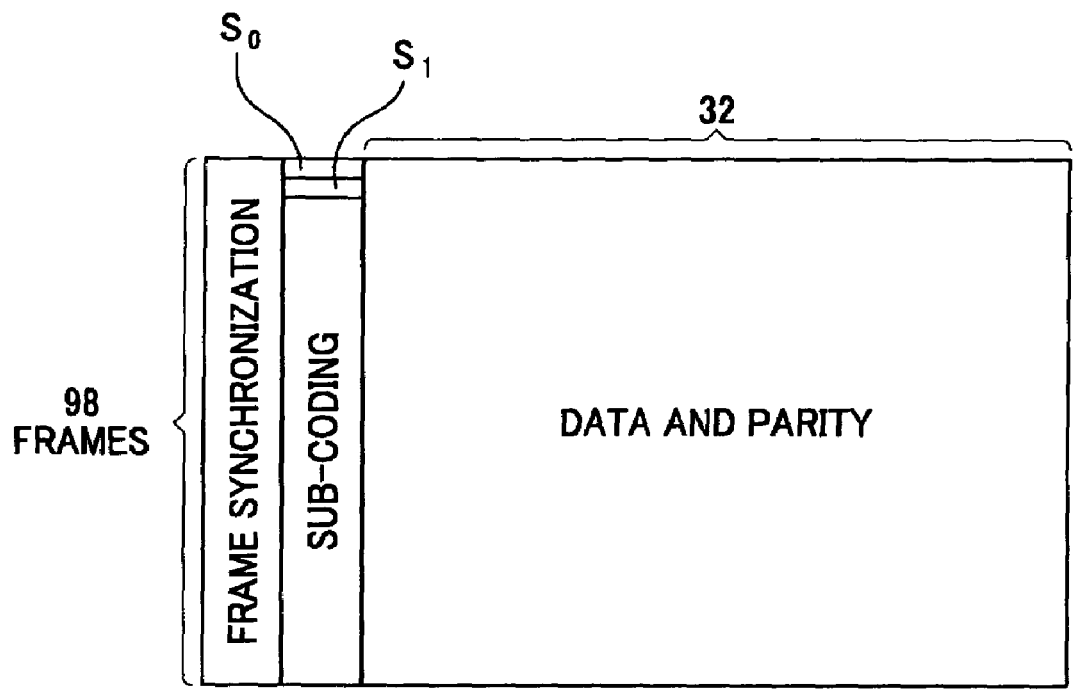
FIG. 2 illustrates a sub-coding frame format.

As the sub-coding, one symbol, made up by 8 bits, is recorded in each frame. In this sub-coding, discrimination data for discriminating individual optical discs is recorded, in addition to e.g., the address information. The 8-bit data, forming the sub-coding, are allocated to channels P, Q, R, S, T, U, V and W. The sub-coding for 98 frames forms a block, as shown in FIG. 2. This block begins with synchronization signals $S_0$, $S_1$ for discriminating the leading end of the block. For these synchronization signals $S_0$, $S_1$, the patterns not used for the EFM conversion table are used. That is, as shown in FIG. 3, 96 bytes of the sub-coding, excluding the 2 bytes of the synchronization signals, form one block. Each block of each of the channels P to W of the sub-codes is formed by 96 bits (98 bits inclusive of the synchronization bits) of from P1-W1 to P96-W96.

The P channel of the sub-codes is used for example, as a start flag indicating a point between one musical number and the next, while the Q-channel is used for recording e.g., the address information or discrimination data. The 6 channels from R to W are collectively used as user bits for graphics or error check.

Figure 4:
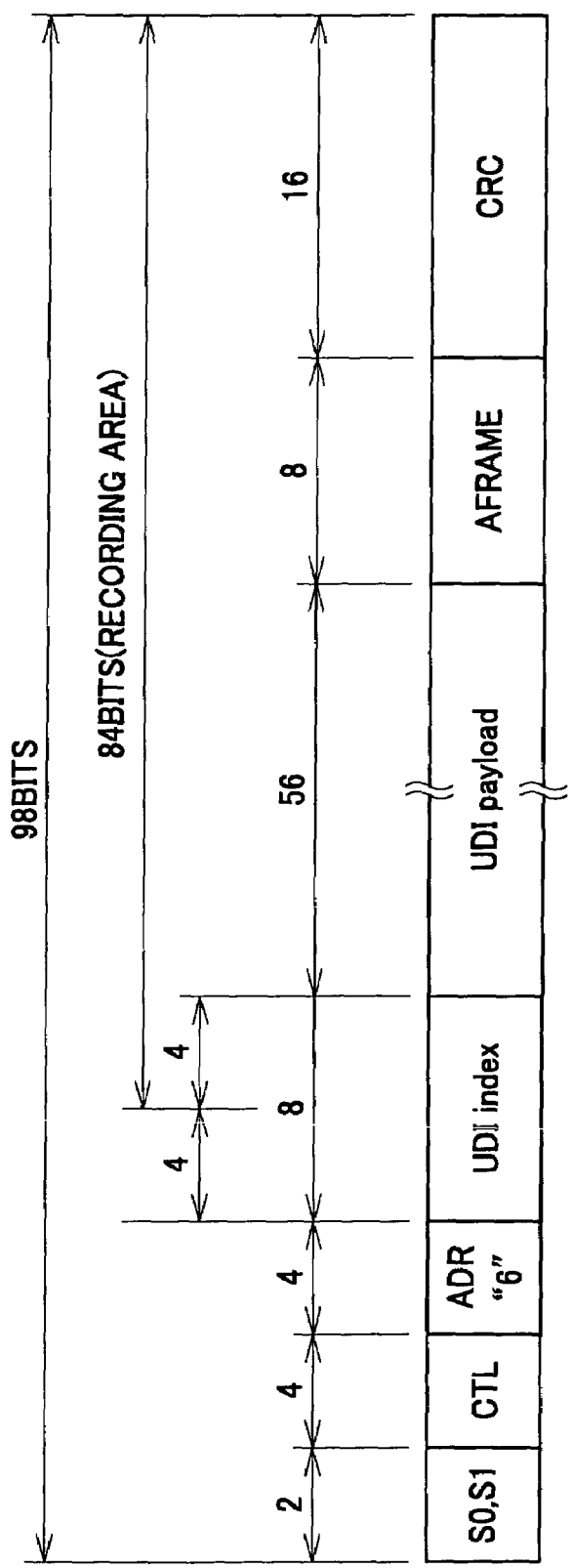
FIG. 4 illustrates the format of a sub-code Q channel.

Reference is had to FIG. 4 for illustrating the frame structure of the Q-channel for recording the discrimination data. Looking from the leading end, this Q-channel frame of 98 bits is made up by 2 bits of synchronization signals S0, S1, 4 bits of CTL, 4 bits of ADR for discriminating the recording and/or reproducing mode of the discrimination data, 8 bits of UDI index, as an index to the discrimination data, UDI payload, as a payload in which to store 56 bits of the discrimination data, AFRAME of 8 bits of the address information, and CRC (Cyclic Redundancy Code) of 16 bits of the error correction code. Meanwhile, 84 bits from the lower 4 bits of the UDI index to the CRC represent a recording area.

In the 8 bits of the UDI index, there are recorded the recordable time and the pre-recorded time of the discrimination data for the optical disc. In the UDI payload, there are recorded, as discrimination data for the optical disc 1, an ID of a record selling company as a distributer of the optical disc 1, the record number for discriminating the optical disc 1, a country number for discriminating the selling country of the optical disc 1, an ID of a manufacturing plant of the optical disc, an ID for discriminating a device by which the optical disc was produced, a serial number of the optical disc, and a detection code, such as MDC (modification detection code) for detecting whether or not the data has been modified.

Prior to recording the discrimination data of the optical disc, an initial value of [1], for example, is recorded in each of the bits from the lower 4 bits of URI index to the CRC of the block. In this area, recessed pits not reflecting a light beam are virtually formed by thermally recording data in a reflective film at a recording position, whereby [1] is complemented to [0], such that optical disc discrimination data is recorded by the pattern of the virtually formed pits and lands, in a manner which will be explained subsequently. In an area other than the recording area, predetermined data, such as contents data, is recorded by a pattern of recessed pits and lands, as in the case of the ROM type optical disc. Meanwhile, it is sufficient that the recording area is an area at least for the payload and for the error correction code such that it is possible that this frame in its entirety is recordable and [1] is recorded as an initial value so that the entire frame is formed entirely by lands.

In the R to W channels, the area for recording the discrimination data is of a fixed value, which is the same before and after the recording of the discrimination data. That is, in an area where the discrimination data is recorded, sub-code data is recorded so that, when the data bits of the pre-modulation 8-bit sequence prior to the recording of the discrimination data are compared to the channel bits of the demodulated 8-bit sequence subsequent to the recording of the discriminated data, the values of the R to W channels will be the same at least for the third and the following bits.

This optical disc is basically a replay-only recording medium, such that recording data such as contents data are recorded by a pit pattern of lands and recesses. In the above-described preset sub-code recording area of the optical disc, there is recorded, as the post-recorded information, the discrimination data for discriminating each individual optical disc.

Figure 5:
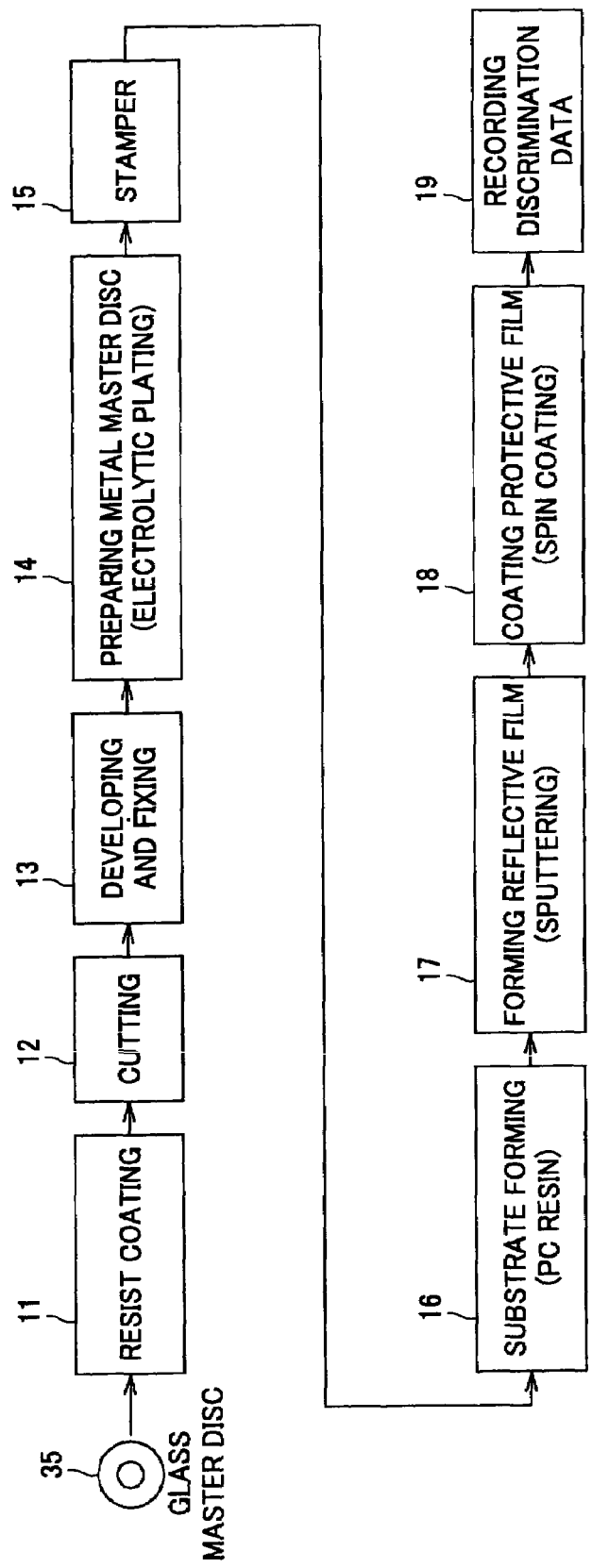
FIG. 5 illustrates the manufacturing process of an optical disc.

The manufacturing method for the above-described optical disc is now explained. In manufacturing the optical disc, a photoresist is coated on a glass master disc in a resist coating step 11, and a pit pattern of lands and recesses, corresponding to the data for recording, is cut with laser light in a cutting step 12 to form a master disc, as shown in FIG. 5. The master disc, in which the pit pattern has now been formed by laser cutting, is developed and fixed in a development-fixing step 13. The resulting master disc is subjected to electrolytic plating on its surface, in a metal master disc forming step 14, to form a metal master disc as a mother disc. In the next stamper forming step 15, a stamper is formed from the metal master disc The so formed stamper is set in a casting metal die, in a substrate forming step 16, to form a disc substrate from a transparent resin material, such as polycarbonate or acrylic resin, using an injecting molding unit. The disc substrate, formed in this step, has transcribed thereto the pit pattern formed on the master disc by the cutting step 12. In the next reflective film forming step 17, a reflective film is formed, such as by sputtering, on the surface of the disc substrate carrying the pit pattern. With the optical disc according to the present invention, discrimination data are written once (post-recorded) by exploiting this reflective film.

For recording the discrimination data, the reflective film, used for the optical disc, needs to be formed of a material which allows for data recording. The reflective film is formed of a material which, while having the reflectance of the order of magnitude which is substantially the same as the reflective film used for CD or DVD, may have the reflectance for the read-out light beam changed by thermal recording employing a light beam. That is, the reflective film is formed by a metal film the reflectance of which to the readout light beam is changed in a range from not less than 0.5% to not larger than 10% as a result of thermal recording. Specifically, the reflective film is formed by an aluminum alloy comprised of aluminum and a trace amount of germanium mixed thereto. In a protective film forming step 18, a protective film is formed by coating a UV light curable resin on the reflective film by spin coating and illuminating the UV light for curing the resin. With the so formed optical disc, a light beam is illuminated from the disc side coated with the protective film to record and/or reproduce data. In the next discrimination data recording step 19, discrimination data is formed by dissolving the reflective film for forming simulated pits.

Figure 6:
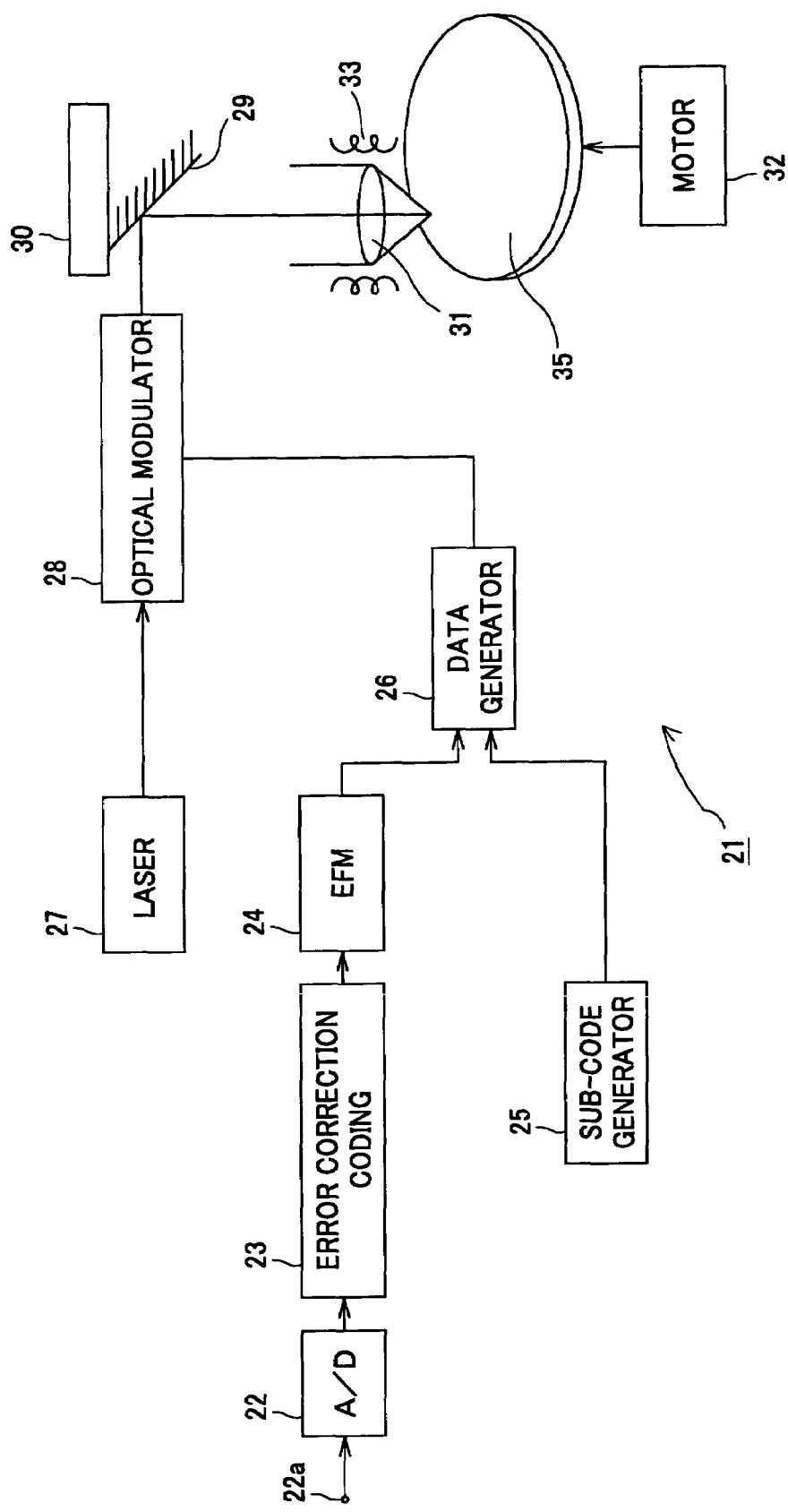
FIG. 6 is a block diagram showing a cutting device for producing a stamper.

A cutting device 21 for manufacturing a master disc by laser-cutting a pit pattern of lands and recesses corresponding to data for recording in cutting step 12 is now explained. Referring to FIG. 6, this cutting device 21 includes an A/D converter 22, supplied with sampled data for recording via an input terminal 22a, an error correction encoding circuit 23 for applying error correction encoding to the digital signals output from the A/D converter 22, a modulation circuit 24 for modulating an encoded output, a sub-code generator 25 for generating the sub-codes, and a data generator 26 for summing an output of the modulation circuit 24 to data from the sub-code generator 25 to generate recording data. The cutting device 21 also includes a laser source 27, such as a gas laser, for example, an argon laser or He—Cd laser, an optical modulator 28 for modulating the laser light based on data from the data modulator 26 by, for example, an EOM (Electrical Optical Modulator) exploiting the Pockels effect, or an AOM (Acoustic-Optical Modulator) exploiting ultrasonic waves, a mirror 29 for reflecting the modulated laser light, a movable mechanism 30 for moving the mirror 29, an objective lens 31 for collecting the laser light for illuminating a glass master disc 35, a motor 32 for rotating the glass master disc 35, and an objective lens driving mechanism 33 for driving the objective lens 31 in the focusing direction which is the direction of the optical axis of the objective lens 31.

The error correction encoding circuit 23 encodes e.g., by sampling analog contents into samples and encoding the resulting samples by the combination of the cross-interleaving and the order four cross-interleaved Reed-Solomon codes (CIRC), using the algorithm of the cross-interleaved Reed-Solomon codes (CIRC), to output the resulting encoded data to the modulation circuit 24.

The modulation circuit 24 modulates the encoded output of the error correction encoding circuit 23 in accordance with the EFM algorithm to output the resulting modulated data to the data generator 26. Specifically, the modulation circuit 24 transforms a 8-bit sequence into a 14-bit recording code sequence, with the minimum run length Tmin(minimum length between transitions) being 2 and the maximum run length Tmax (maximum length between transitions) being 10, in accordance with the EFM conversion table shown in FIGS. 7 and 8.

The sub-code generator 25 generates sub-codes, such as the address information, responsive to the data for recording, and transforms the so generated sub-codes in the form of a 8-bit data sequence into a 14-bit recording code sequence by EFM. Specifically, the sub-code generator 25 generates, as the sub-codes for the area for recording the discrimination data, data bits of the 8-bit data sequence in the EFM conversion table shown in FIGS. 7 and 8, and transforms the so generated data bits into a 14-bit recording code sequence. Specifically, the sub-code generator 25 generates, as the sub-codes for the area for recording the discrimination data, data bits of the 8-bit sequence, obtained on demodulating the as-modulated 14-bit recording code sequence for the recorded discrimination data, in which the second bit from the leading bit, that is the sub-code Q channel, is complemented from [1] to [0], and in which the third bit from the leading bit to the trailing bit, that is the sub-code R to W channels, are of the same bit. This data is selected to satisfy the condition that, when the reflective film is fused to form simulated pits by illuminating the light beam to the lands between the pits in the 14-bit pattern resulting from the EFM, the newly formed pit length will satisfy the modulation rule of EFM which states that the maximum length between transitions Tmax and the minimum length between transitions Tmin shall be 10 and 2, respectively.

The sub-code generator 25 selects the 64th 0X40h [01000000] in the decimal notation of the EFM conversion table, as the sub-code of an area in which to record the discrimination data, as shown for example in FIG. 9A. The reason is that 0X40h on EFM gives a 14-bit pattern [01001000100100] and that, if the third land L of the pattern modulated with NRZI is irradiated with a light beam to fuse the reflective film to form a simulated pit, a 14-bit pattern [01001000100000] is produced, which on demodulation gives the same pattern as the number zero 0th [00000000] except the upper second bit Q channel.

The sub-code generator 25 selects the 65th 0X41h [01000001] in the decimal notation of the EFM conversion table, as the sub-code of an area in which to record the discrimination data, as shown for example in FIG. 9B. The reason is that 0X41h on EFM gives a 14-bit pattern [10000100100100] and that, if the second land L of the pattern modulated with NRZI is irradiated with a light beam to fuse the reflective film to form a simulated pit, a 14-bit pattern [10000100000000] is produced, which on demodulation gives the same pattern as the first 0X01h [00000001] except the upper second bit Q channel.

The sub-code generator 25 selects the 68th 0X44h [01000100] in the decimal notation of the EFM conversion table, as the sub-code of an area in which to record the discrimination data, as shown for example in FIG. 9C. The reason is that 0X44h on EFM gives a 14-bit pattern [01000100100100] and that, if the third land L of the pattern modulated with NRZI is irradiated with a light beam to fuse the reflective film to form a simulated pit, a 14-bit pattern [01000100000000] is produced, which on demodulation gives the same pattern as the fourth 0X04h [00000100] except the upper second bit Q channel.

The sub-code generator 25 selects the 71st 0X47h [01000111] in the decimal notation of the EFM conversion table, as the sub-code of an area in which to record the discrimination data, as shown for example in FIG. 9D. The reason is that 0X47h on EFM gives a 14-bit pattern [00100100100100] and that, if the second land L of the pattern modulated with NRZI is irradiated with a light beam to fuse the reflective film to form a simulated pit, a 14-bit pattern [01001000000000] is produced, which on demodulation gives the same pattern as the 0th 0X07h [00000111] except the upper second bit Q channel.

The sub-code generator 25 generates the above sub-code, as a sub-code for an area in which to record the discrimination data, converts a preset land into a pit to complement the Q-channel of the 8-bit sequence from [1] to [0] depending on the data to be recorded to enable the recording of the discrimination data. By setting the channels R to W so as to be fixed before and after the recording of the discrimination data, the recording and/or reproducing apparatus is able to detect the area where the discrimination data is to be or has been recorded.

Referring to FIG. 6, EFM modulated recording data is input to the data generator 26 from the modulation circuit 24, while the sub-codes are also input to the data generator from the sub-code generator 25. The data generator 26 inserts 3-bit coupling bits between neighboring 14-bit blocks of the recording code sequences. Specifically, the data generator 26 selects, from [000], [100], [010] and [001], the coupling bits which satisfy the EFM conversion rule of the maximum length between transitions Tmax=10 and the minimum distance between transitions Tmin=2 and in which the absolute value of the digital sum value (DSV) is smaller to reduce the low frequency components, and inserts the so selected 3-bit coupling bits in-between the 14-bit blocks of the recording code sequences. The data generator 26 forms a 17-bit recording code sequence to generate data shown in FIG. 1 to output the so generated data to the optical modulator 28.

With the above-described cutting device 21, when the sampled data to be recorded are input to the A/D converter 22, the A/D converter transforms the data from the analog signals into digital signals, to output the so generated digital signals to the error correction encoding circuit 23. This error correction encoding circuit 23 applies encoding, which is the combination of the cross-interleaving and the order four cross-interleaved Reed-Solomon codes, to send the resulting encoded data to the modulation circuit 24. This modulation circuit 24 modulates the data with EFM. That is, the modulation circuit 24 transforms the data for recording from 8 bits into 14 bits, based on the EFM table, shown in FIGS. 7 and 8, to output the resulting data to the data generator 26. On the other hand, the sub-code generator 25 generates 8-bit sub-codes, such as the address information, associated with data for recording, and transforms the so generated sub-codes into 14-bit data, which are output to the data generator 26. This data generator 26, fed with data from the modulation circuit 24 and with data, e.g., sub-codes, from the sub-code generator 25, sums these data together, and inserts 3-bit coupling bits in-between neighboring 14-bit blocks to generate data for recording. These data for recording are modulated with NRZI and output to the optical modulator 28.

On the other hand, the laser source 27 radiates the laser light which is input to the optical modulator 28. This optical modulator modulates the laser light based on an input from the data generator 26. That is, when fed with [1] from the data generator 26, the optical modulator modulates the laser light. The laser light, modulated by the optical modulator, falls on the mirror 29. This mirror 29 is moved by the movable mechanism 30 for sweeping the laser light across the inner and outer peripheries of the glass master disc 35. The laser light is collected by the objective lens 31 so as to be illuminated by the spindle motor 32, as a rotationally driving unit, on the glass master disc 35, rotated at for example the CLV (constant linear velocity). The objective lens 31 is displaced at this time along the optical axis of the laser light by the objective lens driving mechanism 33 by way of performing focusing control.

Figure 10:
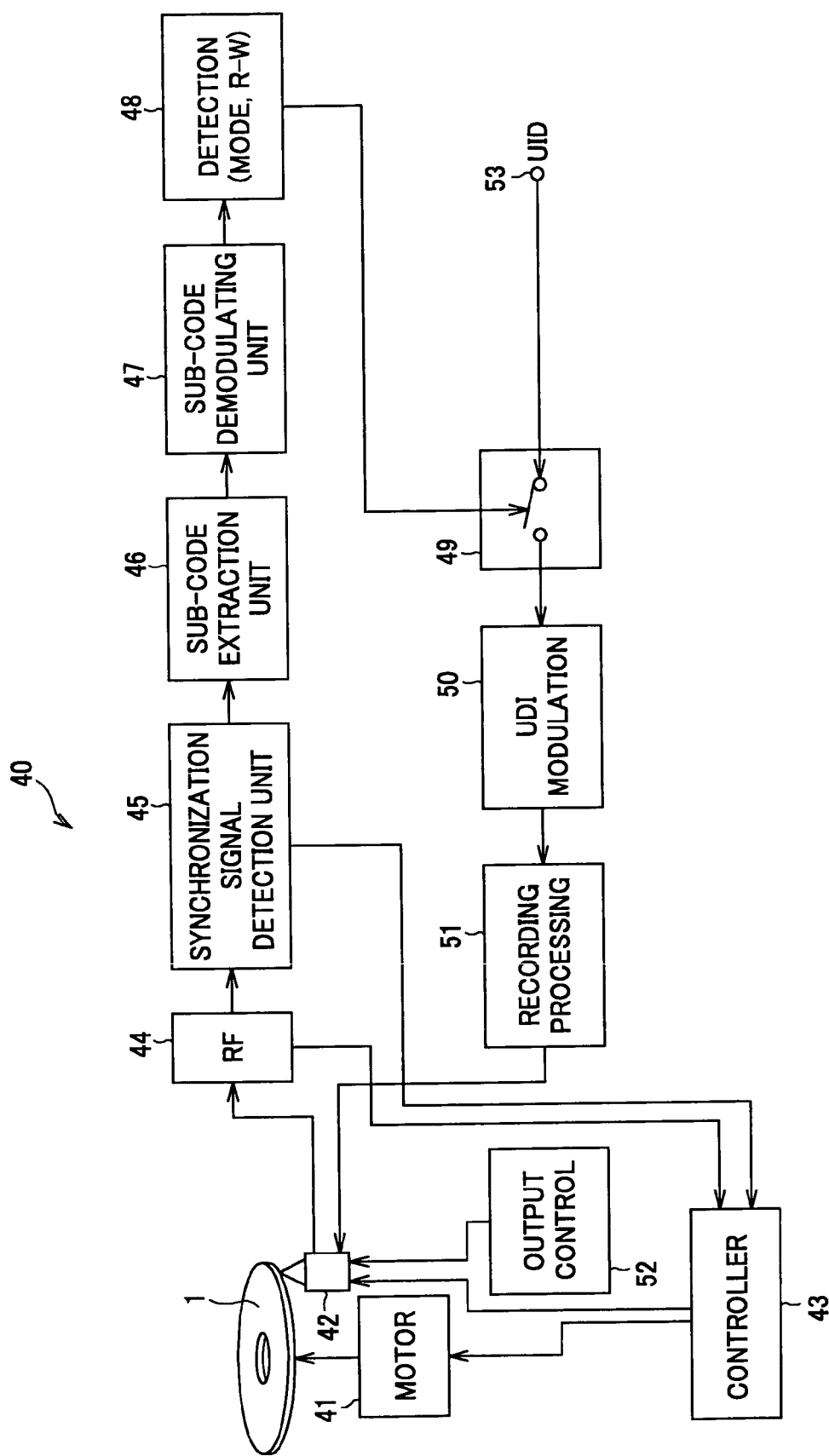
FIG. 10 is a block diagram for illustrating a recording apparatus for discrimination data.

Referring to FIG. 10, a data recording apparatus 40, recording discrimination data on the optical disc used in the discrimination data recording step 19, is now explained. This data recording apparatus 40 includes a spindle motor 41, for rotationally driving the optical disc 1, embodying the present invention, an optical pickup 42 for radiating a light beam to the optical disc 1 and for detecting the reflected return beam, a controller 43 for exercising focusing servo control and tracking servo control of the objective lens of the optical pickup 42 and for controlling the rotation of the spindle motor 41, an RF amplifier 44 for generating e.g., RF signals from a detection output of the optical pickup 42, a synchronization signal detection unit 45 for detecting the synchronization signal from the RF signal and for generating clocks, a sub-code extraction unit 46 for extracting sub-codes from the RF signals, a sub-code demodulating unit 47 for demodulating EFM modulated 14-bit sub-codes to 8 bits for generating sub-codes for P to W channels, and a detection unit 48 for detecting sub-codes of the R to W channels. The data recording apparatus 40 also includes, as a recording system for recording discrimination data for the optical disc 1, a switching unit 49 for switching the inputs of the discrimination data to be recorded on the optical disc 1, a modulating unit 51 for performing recording processing in recording the discrimination data on the optical disc 1, a recording processor 51 for performing recording processing in recording the discrimination data on the optical disc 1, and an output controller 52 for controlling the outputting of the light beam radiated by the optical pickup 42.

A disc table, not shown, is mounted as one to a spindle shaft of the spindle motor 41. The disc table is engaged in a center opening of the optical disc 1 and thereby clamped as the center of rotation of the optical disc 1 is kept in coincidence with the center of rotation of the spindle shaft. The spindle motor 41 causes rotation of the optical disc 1 in unison with the optical disc 1.

The optical pickup 42 includes a semiconductor laser, as a light source for radiating a light beam, an objective lens for collecting the light beam radiated from the semiconductor laser, and a photodetector for detecting the return light beam reflected back from the reflective film of the optical disc 1. The light beam, radiated from the semiconductor laser, is collected by the objective lens, so as to be illuminated on the signal recording surface of the optical disc 1. The laser output of the semiconductor laser is controlled by the output controller 52. When reproducing data recorded on the optical disc 1, under control by the output controller 52, the semiconductor laser radiates a light beam at a standard output. When recording the discrimination data recorded, the semiconductor laser radiates a light beam at an output level higher than in reproduction in order to fuse the reflective film to effect thermal recording.

The return light beam, reflected back from the signal recording surface of the optical disc 1, is converted into electrical signals, by a photodetector, which photodetector then outputs the converted electrical signals to the RF amplifier 44. The objective lens is supported by an objective lens driving mechanism, such as a bi-axial actuator, and is displaced in the focusing direction parallel to the optical axis of the objective lens and in a tracking direction perpendicular to the optical axis of the objective lens.

The RF amplifier 44 generates RF signals, focusing error signals and tracking error signals, based on an output signal of the photodetector forming the optical pickup 42. The focusing error signals are generated by for example an astigmatic method, while the tracking error signals are generated by a three beam method or by a push-pull method. The RF amplifier 44 outputs the focusing error signals and the tracking error signals to the controller 43.

From the RF signals, the synchronization signal detection unit 45 detects frame synchronization signals, shown in FIG. 1, while detecting synchronization signals used in decoding sub-codes shown in FIGS. 2 and 3. The synchronization signal detection unit 45 generates clocks from the synchronization signals.

Based on the focusing error signals and the tracking error signals, supplied from the RF amplifier 44, the controller 43 generates focusing servo signals and tracking servo signals, and outputs these servo signals to a driving circuit of the objective lens driving mechanism of the optical pickup 42. Based on the focusing servo signals and tracking servo signals, the objective lens, held by the objective lens driving mechanism, is displaced in the focusing direction parallel to the optical axis of the objective lens and in the tracking direction perpendicular to the optical axis of the objective lens. The controller 43 also generates rotational servo signals, so that the clocks generated from the synchronization signals will be synchronized in frequency and phase with the reference clocks from a quartz oscillator. The spindle motor 41 accordingly causes rotation of the optical disc at for example the CLV.

From data input from the RF amplifier 44, the sub-code extraction unit 46 extracts the 14-bit sub-coding, provided next to the frame synchronization signals, to output the so extracted sub-coding to the sub-code demodulating unit 47. Based on the EFM conversion table, the sub-code demodulating unit 47 converts the 14-bit data into 8-bit data. The sub-code demodulating unit 47 forms one block from 98 frames, and generates sub-codes of the P, Q, R, S, T, U, V and W channels. That is, the sub-code demodulating unit 47 generates from P1-W1 to P96-W96, that is 96 bit sub-codes.

The detection unit 48 detects the mode for recording the discrimination data, while detecting R to W channels of the sub-codes. That is, the detection unit 48 detects, from the ADR of the Q-channel, whether or not the mode is that of recording discrimination data. The detection unit 48 detects whether the R to W channels of the sub-codes are of fixed values saved in the memory. That is, the detection unit 48 detects whether the R to W channels are [000000] for FIG. 9A, [000001] for FIG. 9B, [000100] for FIG. 9C or [000111] for FIG. 9D. If the data of the R to W channels, input from the sub-code demodulating unit 47, are of fixed values, the sub-code demodulating unit 47 turns the switching unit 49 on to input the discrimination data from input terminal 53 to the modulation unit 50. If the data of the R to W channels, input from the sub-code demodulating unit 47, are not of fixed values, the detection unit 48 assumes that the recording area is not that for the discrimination data and turns the switching unit 49 off to disable the recording of the discrimination data on the optical disc 1.

The modulation unit 50 modulates the discrimination data, input from the input terminal 53, in accordance with a preset modulation system, and outputs the modulated discrimination data to the recording processor 51. This recording processor 51 performs necessary recording processing for recording on the optical disc 1 and outputs the recording-processed data on the optical pickup 42.

Figure 11:
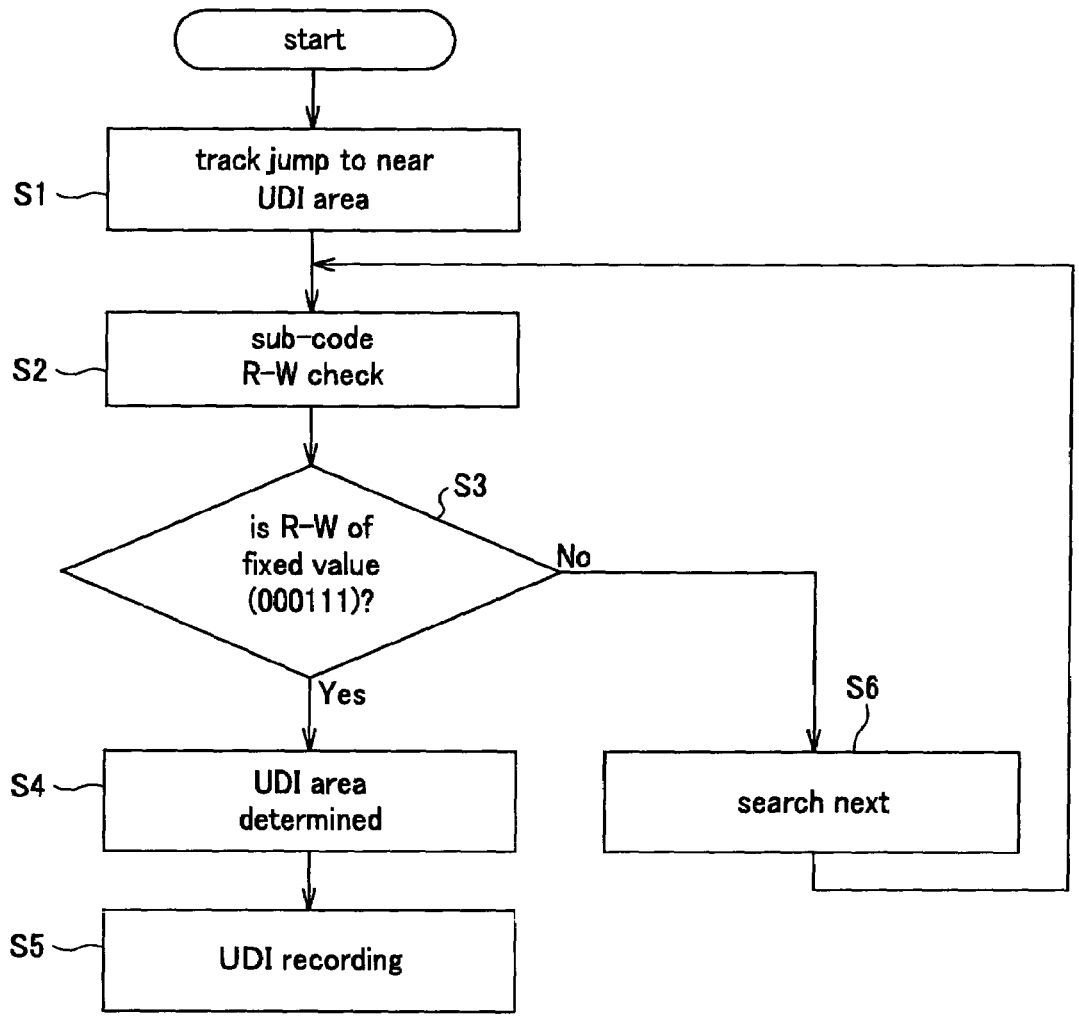
FIG. 11 is a flowchart for illustrating the operation for recording the discrimination data on an optical disc in a data recording apparatus.

Referring to FIG. 11, the operation of recording the discrimination data by the data recording apparatus 40 is now explained. If a user presses a recording button for discrimination data, the data recording apparatus 40 drives the spindle motor 41 at CLV. Simultaneously, the optical pickup 42 radiates a light beam on the optical disc 1. The output controller 52 controls the semiconductor laser of the optical pickup for radiating the light beam at a standard output. The optical pickup 42 commences to read out data as focusing servo control and tracking servo control are exercised by the controller 43.

In a step S1, the data recording apparatus 40 causes the optical pickup 42 to perform track jump to the vicinity of the discrimination data, in order to record the discrimination data in a preset area. In a step S2, the sub-code extraction unit 46 of the data recording apparatus 40 extracts the sub-code in the vicinity of the recording area of the discrimination data. The sub-code demodulating unit 47 demodulates the so extracted sub-codes. The detection unit 48 extracts the R to W channels of the sub-codes to check the data. In a step S3, the detection unit 48 checks whether or not the sub-codes of the R to W channels, as read out from the optical disc 1, are of preset fixed values. If the sub-codes of the R to W channels, as read out from the optical disc 1, are coincident with the fixed values saved in e.g., a memory, the data recording apparatus 40 proceeds to a step S4 and, if otherwise, to a step S6. The reason is that the discrimination data has not been recorded in the frame of the Q channel of the sub-codes of the optical disc 1 shown in FIG. 4, such that an area for recording the discriminated data cannot be identified. For example, if the combination of 0X47h and 0X07h, shown in FIG. 9D, is used, the detection unit 48 checks whether or not the sub-code of the R-W channels is [000111]. If the sub-code is [000111], the data recording apparatus 40 proceeds to a step S4. If the sub-code is not [000111], the data recording apparatus 40 proceeds to a step S6.

It is also possible for the detection unit 48 of the data recording apparatus 40 to detect whether or not the ADR of the Q channel specifies the discrimination data recording mode, prior to proceeding to the step S3, and to proceed to the step S3 if this detection has been made.

In the step S4, the detection unit 48 determines that the area of the optical disc currently accessed is the area for recording the discrimination data, based on the coincidence of the sub-code of the R to W channels read out from the optical disc 1 with the fixed value saved in e.g., a memory, and accordingly turns on the switching unit 49.

In a step S5, the data recording apparatus 40 commences to record the discrimination data. That is, the discrimination data (UID) is input at the input terminal 53 and supplied via switching unit 49 to the modulation unit 50 where the data is processed with preset modulation. The data is then processed with recording in the recording processor 51 so as to be then input to the optical pickup 42. The output controller 52 changes the output of the semiconductor laser from the standard level to the high level in order to effect thermal recording of the discrimination data by fusing the reflective film. The data recording apparatus 40 records data in the recording area for the sub-codes of the Q channel shown in FIG. 4, that is in 84 bits from the lower 4 bits of the UDI index to the CRC. Specifically, the data recording apparatus 40 records the recordable time or the pre-recorded time in the lower 4 bits of the UDI index, and records the discrimination data in the 56-bit UDI payload, while recording the address information, such as frame number, in the 8-bit AFRAME and recording the error correction code in the 16-bit CRC, in this order.

Figure 12:
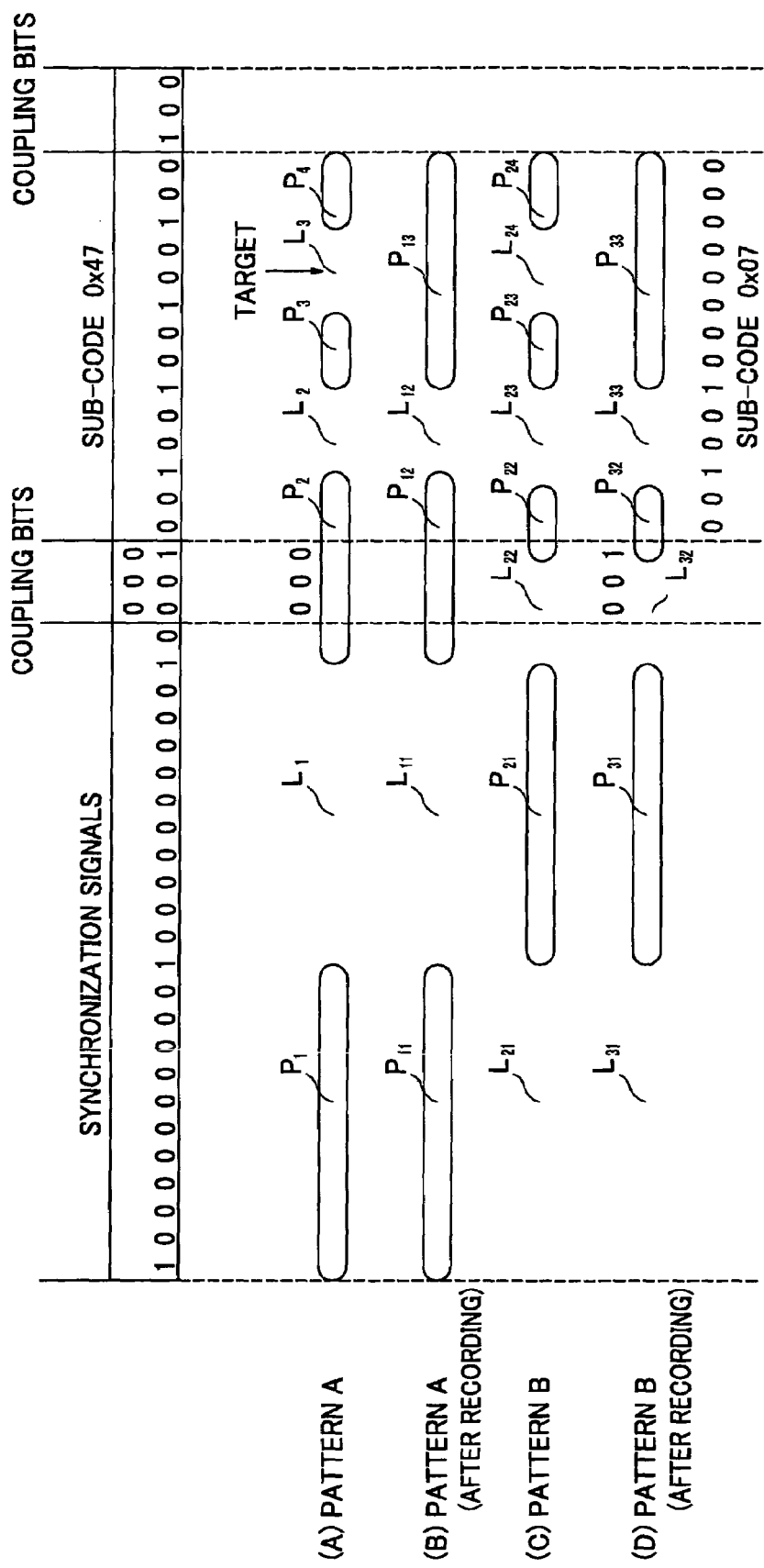
FIG. 12 illustrates a recording example of discrimination data for changing 0X47h to 0X07h.

Referring to FIG. 12, the method for recording these data is now explained. Meanwhile, in the embodiment, shown in FIG. 12, 0X47h shown in FIG. 9D, is changed to 0X07h. Prior to the recording of the discrimination data, a pre-recording pattern A of the discrimination data is such that coupling bits [100] are inserted next to the 24-bit frame synchronization signal, a [00100100100100] (0X47h) sub-code is then recorded and coupling bits [100] are subsequently recorded, as shown in (A) of FIG. 12. On the optical disc 1, a 11T land L1 is provided next to the 11T long pit P1, a 7T pit P2 is then provided, a 3T land L2 is then provided, a 3T pit P3 then is provided, a 3T land L3 then is provided, and a 3T pit P4 then is provided. The data recording apparatus 40 illuminates a high output light beam from the pit P3 to the pit P4 to fuse the reflective film to effect thermal recording to form a pit at the site of the land L3 virtually connecting to the pit P3 and to the pit P4 to provide the post-recording pattern A shown in (B) of FIG. 12. That is, a pattern [00100100000000] (0X07h) is recorded in the sub-code area in the post-recording pattern A. Consequently, the 11T long pit P11, the 11T long land L11, the 7T long pit P12, 3T long land L12 and the 9T long pit P13 are provided in this order on the optical disc 1.

Turning to the case in which the pattern of the frame synchronization signals is the reverse of the above case, a pattern B prior to the recording of the discrimination data B is such that, as shown in (C) of FIG. 12, a 24-bit frame synchronization signal is followed by coupling bits [001], by a sub-code [00100100100100] (0X47h) and by coupling bits [100], in this order. On the optical disc 1, there are recorded a 11T long land L21, a 11T long pit P22, a 4T land L22, a 3T pit P22, a 3T land L23, a 3T pit P23, a 3T land L24 and a 3T pit P24, in this order. The data recording apparatus 40 illuminates a high-output light beam across the pits P23 and P24 to fuse the reflective film to effect thermal recording to form a pit virtually interconnecting the pits P23 and P24 in the position of the land L24 to provide the post-recording patten B as shown in (D) FIG. 12. Thus, a pattern [00100100000000] (0X07h) is recorded in the sub-code area in the post-recording pattern B, Consequently, a 11T long land L31, a 11T long pit P31, a 4T long L32, a 3T long pit P32, a 3T long land L33 and a 9T long pit P33 are provided in this order on the optical disc 1.

Thus, the data recording apparatus 40 forms a pattern of pits and lands, corresponding to the discrimination data, by the on/off of the high output light beam, thereby recording discrimination data in the Q channel sub-code.

If, in the step S3 of FIG. 11, the detection unit 48 has determined that the sub-codes of the R to W channels read out from the optical disc 1 are not coincident with the preset fixed values, the detection unit determines in a step S6 that the area of the optical disc 1 now being accessed is not the area of recording the discrimination data and turns off the switching unit 49 to inhibit the inputting of the discrimination data to continue the search. The detection unit then reverts to the step S2.

In the above-described method, the recording area for the discrimination data may be identified with the sub-code of the R to W channels, such that the discrimination data can be recorded in the so identified area.

Figure 13:
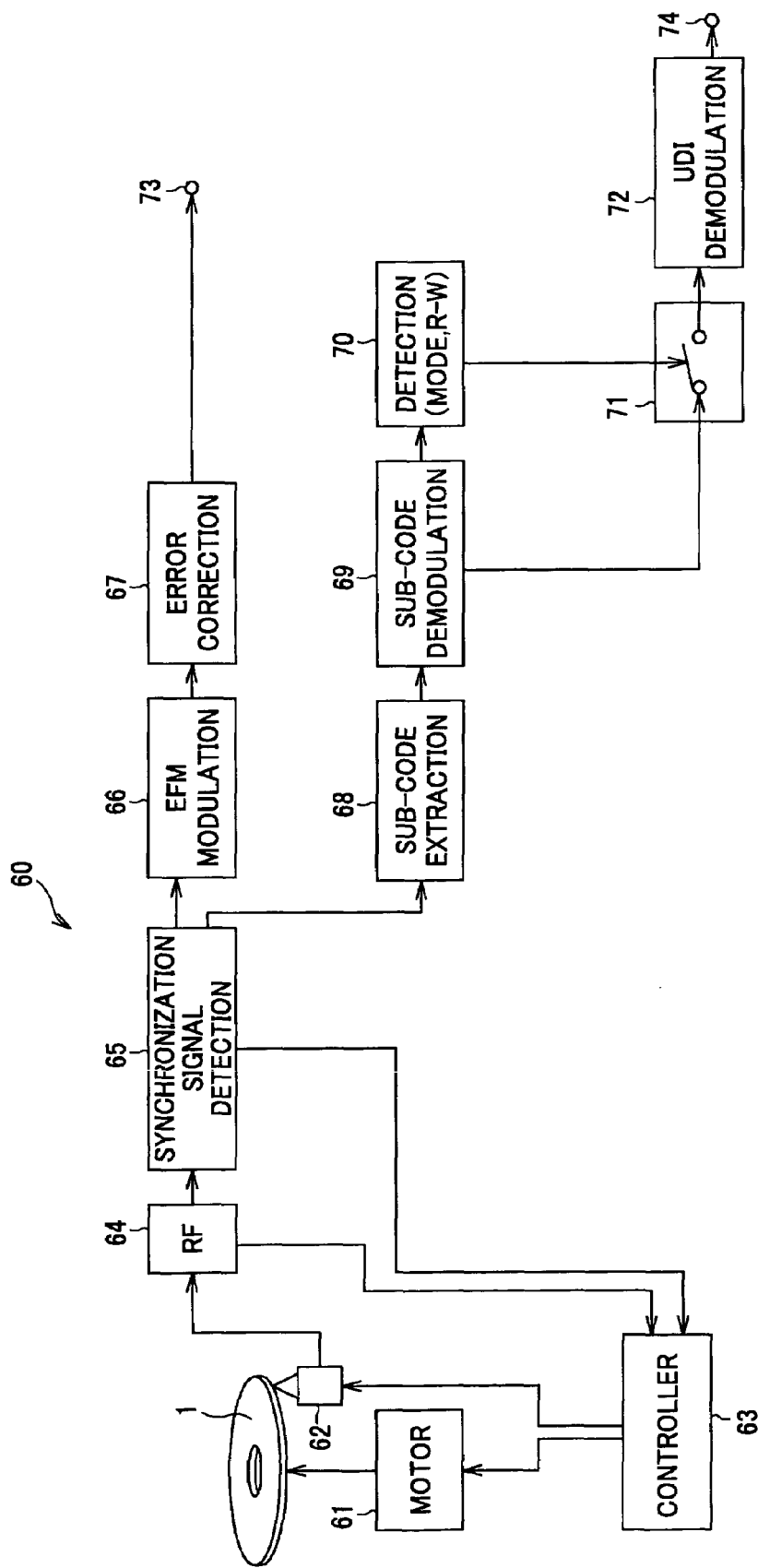
FIG. 13 is a block diagram showing a data reproducing apparatus for reproducing an optical disc embodying the present invention.

Referring to FIG. 13, a data reproducing apparatus 60 for reproducing the optical disc 1, having the discrimination data recorded thereon by the data recording apparatus 40 as described above, is hereinafter explained. The data reproducing apparatus 60 includes a spindle motor 61 for rotationally driving the optical disc 1, having the discrimination data recorded thereon, an optical pickup 62, radiating the light beam to the optical disc 1 and detecting the reflected return light beam, a controller 63 for performing focusing servo control and the tracking servo control of the objective lens of the optical pickup and for performing rotational control of the spindle motor 61, an RF amplifier 64 for generating RF signals from an output of the optical pickup 62, a synchronization signal detection unit 65 for detecting the synchronization signal from the RF signals for generating clocks, a demodulating unit 66 for demodulating EFM modulated recording data, such as contents data, and an error correction processor 67 for error correcting the demodulated data.

The data reproducing apparatus 60 also includes a sub-code extraction unit 68 for extracting the sub-codes from the RF signals, a sub-code demodulating unit 69 for demodulating the EFM modulated 14-bit sub-codes into 8 bits for generating sub-codes for P to W channels, a detection unit 70 for detecting the sub-codes for R to W channels, a switching unit 71 for switching the outputs of the discrimination data recorded on the optical disc 1 and a demodulating unit 72 for demodulating the discrimination data.

A disc table, not shown, is mounted as one to a spindle shaft of the spindle motor 61. The disc table is engaged in a center opening of the optical disc 1 and thereby clamped as the center of rotation of the optical disc 1 is kept in coincidence with the center of rotation of the spindle shaft. The spindle motor 61 causes rotation of the optical disc 1 in unison with the optical disc 1.

The optical pickup 62 includes a semiconductor laser, as a light source for radiating a light beam, an objective lens for collecting the light beam radiated from the semiconductor laser, and a photodetector for detecting the return light beam reflected back from the reflective film of the optical disc 1. The light beam, radiated from the semiconductor laser, is collected by the objective lens, so as to be illuminated on the signal recording surface of the optical disc 1. It is noted that, in reproducing data, the semiconductor laser radiates a light beam at a standard output. The return light beam, reflected back from the signal recording surface of the optical disc 1, is converted by the photodetector into electrical signals, which are output by the photodetector to the RF amplifier 64. The objective lens is held by an objective lens driving mechanism, such as a bi-axial actuator, and is displaced in the focusing direction parallel to the optical axis of the objective lens and in the tracking direction perpendicular to the optical axis of the objective lens.

The RF amplifier 64 generates RF signals, focusing error signals and tracking error signals, based on the output signal of the photodetector forming the optical pickup 62. For example, the focusing error signals are generated by e.g., an astigmatic method, while the tracking error signals are generated by a three-beam method, or a push-pull method. The RF amplifier 64 outputs the RF signals to the demodulating unit 66 for demodulating the EFM modulated data, while outputting the focusing error signals and the tracking error signals to the servo controller 63.

The synchronization signal detection unit 65 detects the frame synchronization signals, shown in FIG. 1, from the RF signals, while detecting the synchronization signals, used in decoding the sub-codes shown in FIGS. 2 and 3. The synchronization signal detection unit 65 generates clocks based on the detected synchronization signals.

The servo controller 63 generates the focusing servo signals and the tracking servo signals, based on the focusing error signals and the tracking error signals, input from the RF amplifier 64, to output the so generated signals to a driving circuit for the objective lens driving mechanism of the optical pickup 62. Thus, the objective lens, held by the objective lens driving mechanism, is displaced, based on the focusing servo signals and the tracking servo signals, in the focusing direction parallel to the optical axis of the objective lens and in the tracking direction perpendicular to the optical axis of the objective lens. The servo controller 63 also generates rotational servo signals, so that the clocks generated from the synchronization signals will be synchronized in frequency and phase with the reference clocks from the quartz oscillator. The spindle motor 61 accordingly causes rotation of the optical disc at for example the CLV.

The demodulating unit 66 demodulates recording data, such as contents data, in accordance with the EFM algorithm. Specifically, the demodulating unit 66 converts the 14-bit recording code sequence into a 8-bit data bit sequence, in accordance with the EFM conversion table shown in FIGS. 7 and 8. The error correction processor 67 demodulates the modulated recording data in accordance with the algorithm, such as CIRC, to output the demodulated data to an output terminal 73. For example, if the recording data is audio data, the audio data output from the output terminal 73 is converted by a D/A converter from digital signals to analog signals which then are output at an acoustic transducer such as a loudspeaker, an earphone or a headphone.

The sub-code extraction unit 68 extracts, from the data input from the RF amplifier 64, the 14-bit sub-coding, provided next to the frame synchronization signals, to output the so extracted signals to the sub-code demodulating unit 69. Based on the EFM conversion table, the sub-code demodulating unit 69 converts the 14-bit data into 8-bit data. The sub-code demodulating unit 69 forms one block with 98 frames, to generate sub-codes of P, Q, R, S, T, U, V and W channels. That is, the sub-code demodulating unit 47 generates from P1-W1 to P96-W96, that is 96 bit sub-codes.

The detection unit 70 detects the mode for recording the discrimination data, while detecting R to W channels of the sub-codes. That is, the detection unit 70 detects from the ADR of the Q-channel whether the mode is that of recording discrimination data. The detection unit 70 detects whether the R to W channels of the sub-codes are of fixed values saved in the memory. That is, the detection unit 70 detects whether the R to W channels are [000000] for FIG. 9A, [000001] for FIG. 9B, [000100] for FIG. 9C or [000111] for FIG. 9D. If the data of the R to W channels, input from the sub-code demodulating unit 69, is of a fixed value, the detection unit 70 turns the switching unit 71 on to input the discrimination data input from sub-code extraction unit 68 to the demodulation unit 72. If the data of the R to W channels, input from the sub-code demodulating unit 69, is not of a fixed value, the detection unit 70 deems that the recording area is not that for the discrimination data and turns the switching unit 71 off to inhibit the inputting of the discrimination data from the sub-code extraction unit 68 to the demodulation unit 72.

The demodulating unit 72 for the discrimination data is supplied from the sub-code demodulating unit 69 with the Q channel sub-codes through the switching unit 71. The demodulating unit 72 for the discrimination data refers to e.g., the prerecorded time recorded in the UDI index shown in FIG. 4 to demodulate the discrimination data recorded in the UDI payload, while performing error correction processing, using CRC, to output the demodulated discrimination data at an output terminal 74.

The data readout operation by the data reproducing apparatus 60 is now explained. When a replay button is pressed by a user, the data reproducing apparatus 60 actuates the spindle motor 61 to cause rotation of the optical disc 1 loaded on the disc table forming the disc loading section at a constant linear velocity. Simultaneously, the optical pickup 62 illuminates a light beam on the optical disc 1. At this time, the optical pickup 62 illuminates the light beam at a standard output. The optical pickup 62 begins to read out data as focusing control and tracking control are exercised by the servo controller 63.

Figure 14:
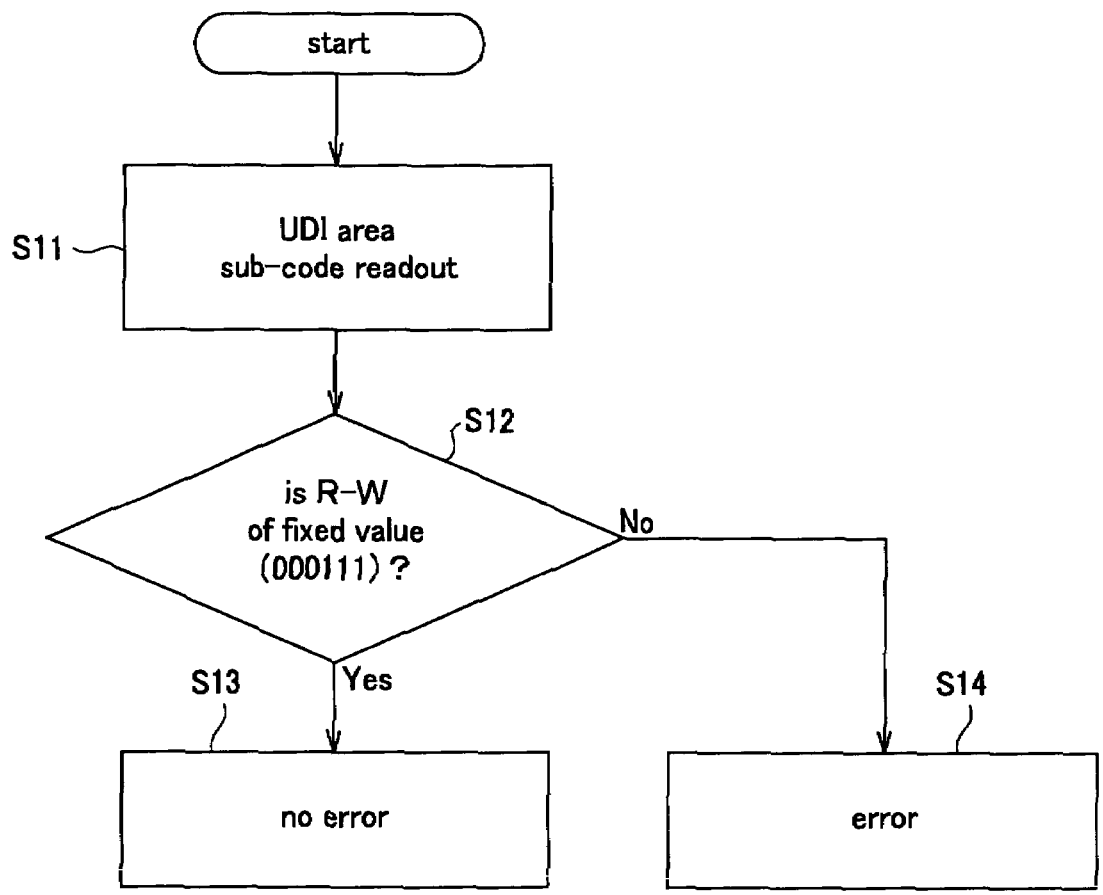
FIG. 14 is a flowchart for illustrating an error check method.

The case of using the sub-codes of the R to W channels of the optical disc 1 for error check is explained with reference to FIG. 14. In a step S11, the data reproducing apparatus 60 accesses the recording area of the discrimination data and, under the state of the reproducing mode for the discrimination data, extracts the sub-codes in the sub-code extraction unit 68 to demodulate the so extracted sub-codes by the sub-code demodulating unit 69. In a step S12, the detection unit 70 extracts the R to W channels of the sub-codes of each frame to check the data. The detection unit 70 checks whether or not the sub-codes of the R to W channels read out from the optical disc 1 are of a predetermined value. For example, if the combination of 0X47h and 0X07h, shown in FIG. 9D, is used, the detection unit 70 checks whether or not the sub-code of the R to W channels is [000111]. When the detection unit 70 has determined that the sub-code of the R to W channels is a fixed value, that is, is [000111], the data reproducing apparatus 60 proceeds to a step S13. When the detection unit 70 has determined that the sub-code of the R to W channels is not a fixed value, that is, is not [000111], the data reproducing apparatus 60 proceeds to a step S14.

When the detection unit 70 has determined that the sub-code of the R to W channels is a fixed value, the data reproducing apparatus 60 determines, in the step S13, that there is no error.

When the detection unit 70 has determined that the sub-code of the R to W channels is not coincident with a fixed value, the data reproducing apparatus 60 determines, in the step S14, that there persists an error. For example, if the demodulating unit for the discrimination data 72 has detected an error as a result of the CRC check of the Q channel, the bit of the Q channel of the frame detected by the detection unit 70 is complemented and the CRC check is again performed to correct the error.

In the above-described method, the error check may be achieved by determining whether or not the fixed value saved in e.g., a memory of the data reproducing apparatus 60 is coincident with the sub-code of the R to W channel as read out from the optical disc, with the use of the sub-code of the R to W channels which is of a fixed value.

Figure 15:
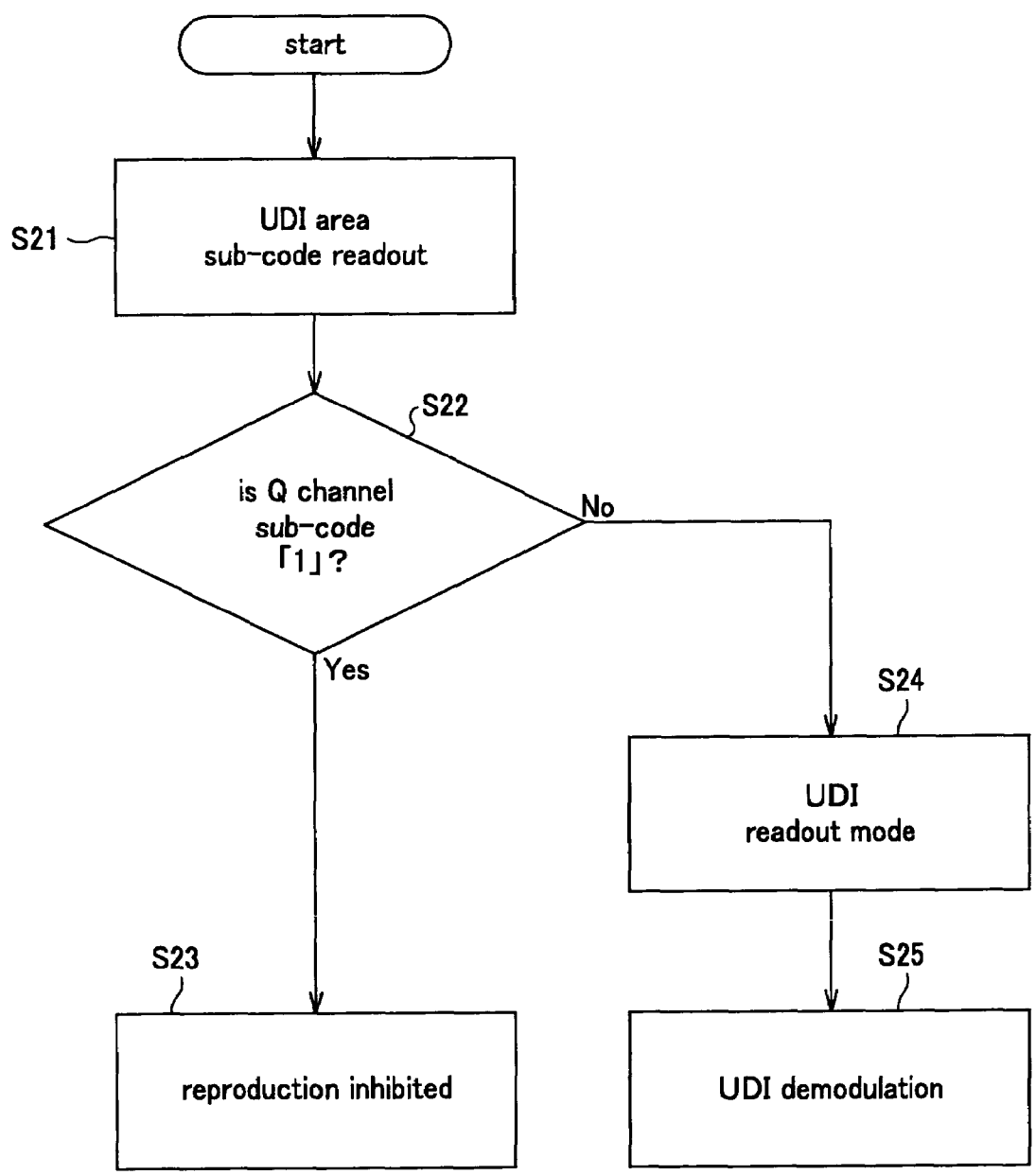
FIG. 15 is a flowchart for illustrating the reproduction controlling method employing a Q-channel sub-code.
Figure 16:
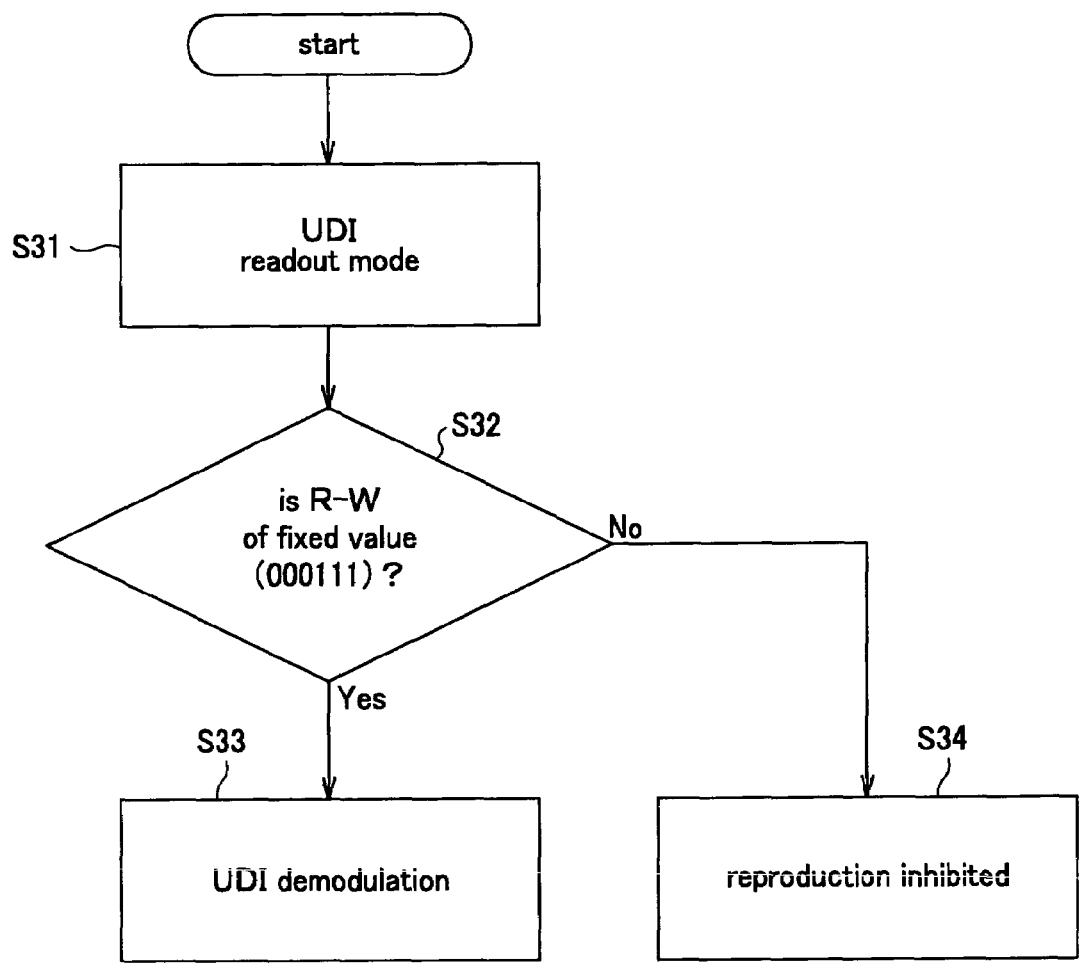
FIG. 16 is a flowchart for illustrating a reproduction controlling method employing sub-codes of R to W channels.

This data reproducing apparatus 60 is also able to control the data reproduction as follows: In a step S21 of FIG. 15, the data reproducing apparatus 60 accesses the recording area for the discrimination data and extracts the sub-codes in the sub-code extraction unit 68 to demodulate the extracted sub-codes in the sub-code demodulating unit 69. In a step S22, the detection unit 70 reads out the Q-channel of the sub-codes to check whether or not at least the recordable area shown in FIG. 4 is all [1]. The reason is that, in the optical disc not having discrimination data recorded thereon, no virtual pits are formed by fusing the reflective film for recording the discrimination data, so that at least the recordable area of the Q channel is all [1]. Of course, if the entire frame of the Q channel is the recordable area, it suffices to check whether or not the sub-codes of the Q channel are all [1]. If the recordable area of the Q channel is all [1], the data reproducing apparatus 60 proceeds to a step S23 and, if otherwise, to a step S24.

If the recordable area of the Q channel is all [1], the data reproducing apparatus 60 in a step S23 turns off the switching unit 71 to inhibit the readout of the discrimination data as well as to inhibit the reproduction of e.g., contents data recorded on the optical disc 1. The reason is that the optical disc 1, the recordable area of the Q channel of which is all [1], is an optical disc on which no discrimination data has been recorded and hence was illicitly distributed prior to recording the discrimination data.

If, when the recordable area of the Q channel is not all [1], the detection unit 70 of the data reproducing apparatus 60 has detected in the step S24, with the ADR of the Q channel, that the area being accessed is that of the discrimination data, the data reproducing apparatus 60 sets the reproducing mode of reading out the discrimination data. In the next step S25, the reproducing apparatus 60 reads out and demodulates the discrimination data to then permit the processing of reproducing the contents data recorded on the optical disc 1.

With the above-described method, in which it is checked whether or not the recordable area of the Q channel is all [1], it is possible to limit reproduction of e.g., the optical disc illicitly distributed prior to the recording of the discrimination data. Moreover, with this method, it is possible to limit the reproduction of the illicit optical disc produced using a stamper produced on peeling off the protective film or the reflective film of the optical disc 1 and on transcribing the pit pattern of the lands and grooves of the disc substrate. It is because the discrimination data are recorded on fusing the reflective film to form virtual pits and hence are not of a pattern of the lands and grooves.

The data reproducing apparatus 60 is also able to control the data reproduction as follows: If, in a step S31, the detection unit 70 of the data reproducing apparatus 60 has detected with the ADR of the Q channel that the area is the recording area for the discrimination data, the data reproducing apparatus 60 sets a reproducing mode of reading out the discrimination data. In the next step S32, the detection unit 70 of the data reproducing apparatus 60 extracts the R to W channels of the sub-codes to check whether or not the sub-code of the R to W channels, read out from the optical disc 1, is of a preset fixed value. For example, if the combination of 0X47h and 0X07h, shown in FIG. 9D, is used, the detection unit 70 determines whether or not the sub-code of the R to W channels is [000111]. If the detection unit 70 of the data reproducing apparatus 60 has verified that the sub-code of the R to W channels is of the fixed value, that is [000111], the data reproducing apparatus 60 proceeds to a step S33 and, if the detection unit 70 has verified that the sub-code of the R to W channels is not [000111], the data reproducing apparatus 60 proceeds to a step S34.

If the detection unit 70 of the data reproducing apparatus 60 has verified that the sub-code of the R to W channels is of the fixed value, the data reproducing apparatus 60 verifies, in the step S33, that the currently loaded optical disc 1 is authorized and turns on the switching unit 71 to render the discrimination data readable. When supplied with the sub-code of the Q channel, from the sub-code demodulating unit 69 through the switching unit 71, the demodulating unit for the discrimination data 72 refers to e.g., the pre-recorded time, recorded on the UDI index shown in FIG. 4, to demodulate the discrimination data recorded on the UDI payload, while correcting the demodulated data for errors, with the aid of the CRC, and outputting the resulting data to the output terminal 74. The data reproducing apparatus 60 commences to reproduce the contents data recorded on the optical disc 1.

When the detection unit 70 of the data reproducing apparatus 60 has determined that the sub-code of the R to W channels is not coincident with the fixed value, the data reproducing apparatus 60 in the step S34 determines that the currently loaded optical disc is not authorized, or is of a different sort, and turns the switching unit 71 off to inhibit the readout of the discrimination data. For example, the data reproducing apparatus 60 inhibits the processing downstream of the processing of reproducing the contents data recorded on the optical disc 1. With this method, it is possible to limit the reproduction of the illicitly distributed optical disc or the optical disc of a different sort.

Figure 17:
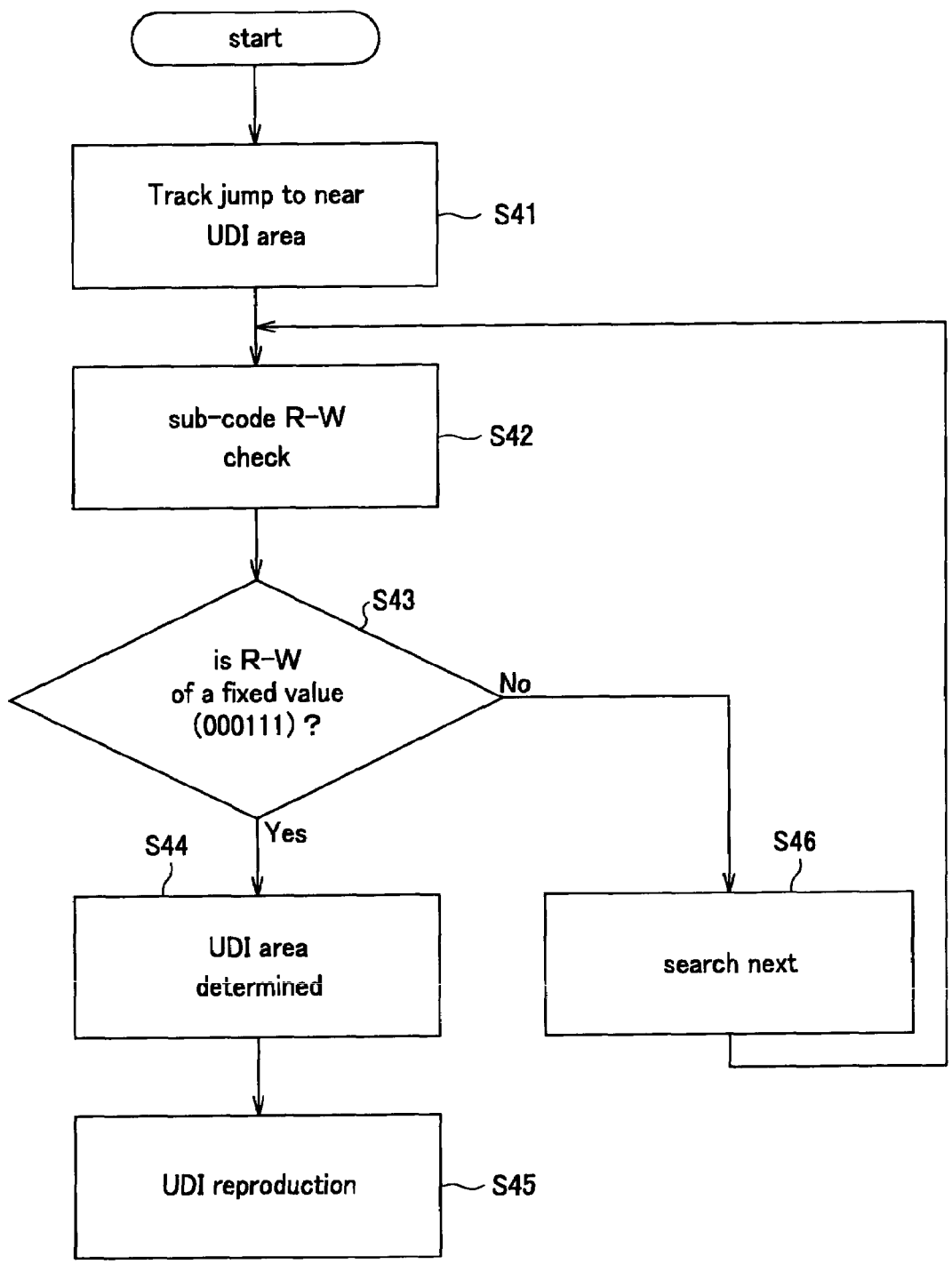
FIG. 17 is a flowchart for illustrating another reproduction controlling method employing sub-codes of R to W channels.

The present data reproducing apparatus 60 is also able to control the data reproduction. Referring to FIG. 17, the data reproducing apparatus 60 in a step S41 causes the optical pickup 62 to perform track jump to near the recording area for the discrimination data in order to specify the area where the discrimination data has been recorded. In the next step S42, the data reproducing apparatus 60 causes the sub-code extraction unit 68 to extract the sub-code in the vicinity of the recording area for the discrimination data, while causing the sub-code demodulating unit 69 to demodulate the so extracted sub-code. The detection unit 70 extracts the R to W channels of he sub-code to check the data. In the next step S43, the detection unit 70 checks whether or not the sub-code of the R to W channels, read out from the optical disc 1, is of the pre-set fixed value. If the sub-code of the R to W channels, read out from the optical disc 1, is coincident with the fixed value saved in e.g., a memory, the data reproducing apparatus 60 proceeds to a step S44 and, if otherwise, to a step S46. For example, if the combination of 0X47h and 0X07h, shown in FIG. 9D, is used, the detection unit 70 checks whether or not the sub-code of the R to W channels is [000111]. If the sub-code is [000111], the data reproducing apparatus 60 proceeds to the step S44 and, if otherwise, to the step S46.

In the step S44, the detection unit 70 determines that the area of the optical disc currently accessed is the area where the discrimination data has been recorded, based on coincidence of the sub-code of the R to W channels, read out from the optical disc 1, with the fixed value stored in e.g., the memory. Thus, the switching unit 71 is turned on to enable the readout of the discrimination data. When supplied with the sub-code of the Q channel, from the sub-code demodulating unit 69 through switching unit 71, the demodulating unit for the discrimination data 72 refers to e.g., the pre-recorded time, recorded on the UDI index shown in FIG. 4, to demodulate the discrimination data recorded on the UDI payload. The demodulating unit for the discrimination data also corrects the demodulated data for errors, using the CRC, to output the resulting data to the output terminal 74. The data reproducing apparatus 60 commences the processing of reproducing e.g., the contents data recorded on the optical disc 1.

If, in the step S43, the detection unit 70 has determined that the sub-code of the R to W channels, read out from the optical disc 1, is not coincident with the preset fixed value, the detection unit determines, in the step S46, that the area of the optical disc 1 currently accessed is not an area for recording the discrimination data, to turn off the switching unit 71 to inhibit the inputting of the discrimination data. The detection unit 70 continues its search to revert to the step S42.

With the above-described method, the recording area of the discrimination data may be identified with the sub-code of the R to W channels to read out the discrimination data recorded in this specified area.

With the optical disc 1 according to the present invention, described above, since the sub-code of the R to W channels, excluding the Q channel, is of a fixed value before and after the recording of the discrimination data, so that, by using this fixed value, the recording area for the discrimination data can be identified, during recording or reproduction of the discrimination data. The data reproducing apparatus 60 is able to detect whether or not an error has occurred, by detecting whether or not the sub-code of the R to W channels, read out from the optical disc 1, is different from this fixed value. The discrimination data is not recorded by pits and lands, forming the pattern of crests and grooves, but is formed by fusing the reflective film to inhibit the reflection of the light beam. Consequently, the discrimination data is not transcribed to an unauthorized optical disc manufactured by using a stamper prepared by peeling off the protective film or the reflective film of the optical disc and by transcribing the pit pattern of crests and grooves, thus imposing limitations on the reproduction of the optical disc prepared by persons with malignant intention.

Referring to the drawings, a second embodiment of the optical disc, a method and an apparatus for recording data on this optical disc and a method and apparatus for reproducing the data recorded on the optical disc, is hereinafter explained.

In the optical disc, used here, as in the above-described optical disc, a lead-in area for recording TOC (table-of-contents) data is recorded on the inner rim side, and a data recording area for recording the recording data, such as contents data, is provided on a radially outer side of the lead-in area. A lead-out area is provided on the radially outer side of the data recording area. The data recorded to the same recording format as the CD, that is, the 8-14 (eight-to-fourteen) modulated data (data modulated by EFM), are recorded to the recording format shown in FIG. 1.

Figure 18:
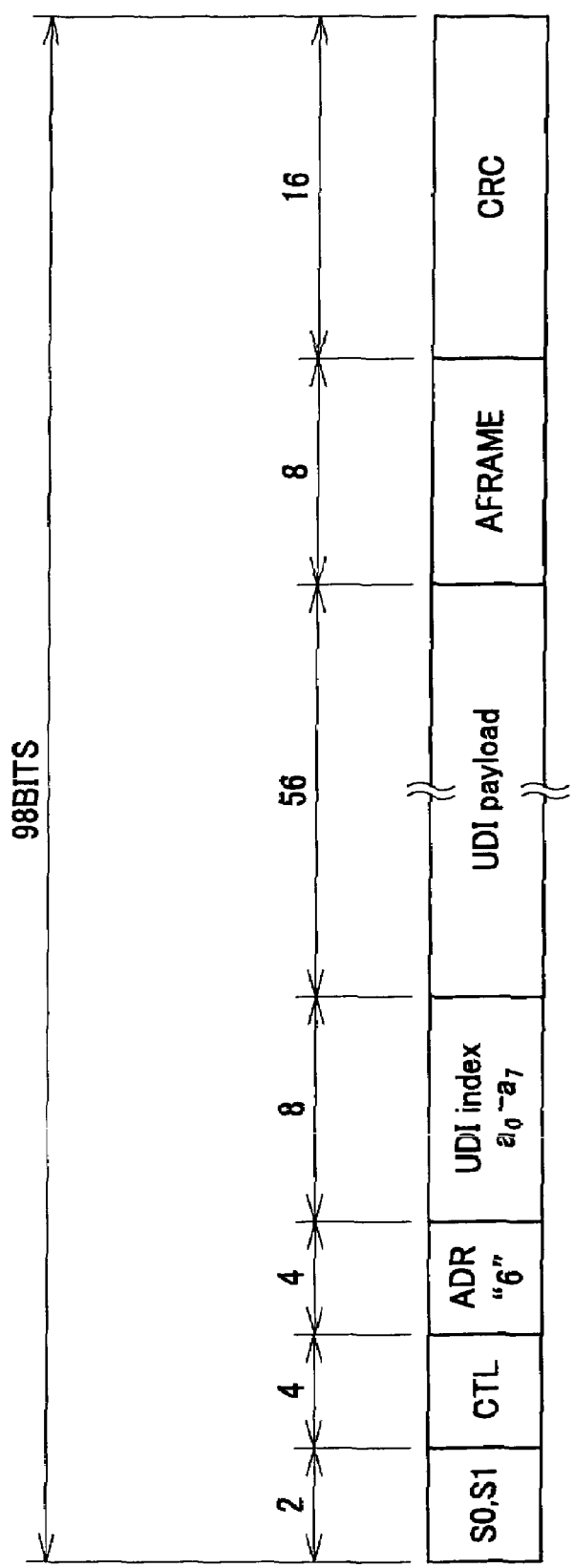
FIG. 18 illustrates the format of the sub-code Q-channel recorded on an optical disc embodying the present invention.

Referring to FIG. 18, the frame structure of the Q channel, in which there is recorded the discrimination data for the optical disc, used here, is now explained in detail. The frame of this Q channel is made up by a total of 98 bits, namely S0 and S1, as 2-bit synchronization signals, 4-bit CTL, a 4-bit ADR, for discriminating the recording and/or reproducing mode of the discrimination data, 8-bit UDI index, as index to the discrimination data, a UDI payload, as a payload, in which to store 56-bit discrimination data, an 8-bit AFRAME, as address information, and the 16-bit CRC (Cyclic Redundancy Code) as error correction code, beginning from the leading end.

The 8-bit UDI index is made up by eight bits of $a_0$ to $a_7$. Referring to FIG. 19, the two bits of $a_0$ and $a_1$ are allocated to specify where the area for recording the discrimination data is provided. Specifically, [00] denotes that there is one recordable area for discrimination data in the disc, [01] denotes that there is one recordable area for discrimination data in one session, [10] and denote that there is one recordable area for discrimination data in each track, and [11] denotes a reserve.

The two bits of $a_2$ and $a_3$ are allocated to specify a frame. Specifically, [00] indicates a leading frame, that is a header, and [01] denotes that there is a succeeding frame, while [10] and [00] denote reserve. The four bits of $a_4$ to $a_7$ record data indicating a frame (sector) in which the discrimination data is recorded with 0 to 15. The sectors where the discrimination data is recorded are 100 sectors (100 frames of the sub-code: 64 bits) to 1600 sectors (1600 frames of the sub-codes: 1024 bits). The discrimination data are recorded in terms of 100 sectors (100 frames) as a unit.

For example, if $a_2$ and $a_3$ are [00], the number of the sum total of the frames (sectors) is recorded in $a_4$ to $a_7$, that is the header, so that, when the leading end is accessed, the size of the recordable area can be specified. When $a_2$ and $a_3$ are [01], $a_4$ to $a_7$ denote the frame number as counted from the beginning end, thus enabling the frame position to be specified. Thus, if the length of the discrimination data is not up to the sum total of the number of frames (sectors), it is possible with the optical disc to specify the frame other than the area where the discrimination data is recorded as being a non-recorded area.

In the 56-bit UDI payload, there are recorded, as discrimination data for the optical disc, a recording company ID for a record company, as the distributor of the optical disc, a record number for discriminating the optical disc, a country number for discriminating the company where the optical disc is sold, a producer ID for identifying the optical disc producing plant, a manufacturing device ID for identifying the device used for manufacturing the optical disc, detection codes, such as MDC (Modification Detection Code), for detecting whether or not data has been modified, and encryption key for main data, such as contents data.

Meanwhile, the discrimination data are recorded so as not to be astride plural tracks. The reason is that, while the P channel is [1], representing the pause of reproduction (null time), for the area between tracks, the P channel may be changed to [0] if the discrimination data is here recorded. The recording speed of the discrimination data is 75 sub-code frames/second, with the recording time for one disc being e.g., 5 seconds. If the recording time is longer than this, the recording of the discrimination data takes excessive time, thus lowering the production efficiency of the optical disc. Thus, the recording quantity of the discrimination data can be increased if the recording speed is faster than this.

In the block from the lower fourth bit of the UDI index to the CRC, there is unexceptionally recorded e.g., [1] as initial value before recording the discrimination data. In this area, pits of recesses not reflecting the light or reflecting only a small amount of light is virtually formed by thermally recording data in the reflective film at the recording position and thereby complemented to [0] so that discrimination data of the optical disc is recorded by the pattern of virtually formed pits and lands. In the area other than the recordable area, preset data, such as contents data, are recorded by the pattern of pits and lands, as in the ROM type optical disc. Meanwhile, it is sufficient that the recordable area is at least the UDI index, UDI payload and CRC where the values are changed from one optical disc to another. Thus, this frame in its entirety may be a recordable area and, as an initial value, [1] may be recorded so that the area in its entirety becomes the land.

The R to W channels are of fixed values in an area for recording the discrimination data and are designed to be of the same value before and after the recording of the discrimination data. That is, such sub-codes are recorded that if, in the area for recording the discrimination data, the pre-modulation data bits of the 8-bit sequence prior to the recording of the discrimination data are compared to the demodulated channel bits of the 8-bit sequence subsequent to the recording of the discrimination data, the values of the R to W channels at least downstream of the third bit will be the same bits.

This optical disc is basically a replay-only recording medium in which recording data such as contents data are recorded as a pit pattern composed of crests and recesses. In the recordable area of the preset sub-code of the optical disc, there are recorded, as post-recorded data, the discrimination data for discriminating the respective optical discs.

This optical disc is again manufactured by the process already explained with reference to FIG. 5. A cutting device 121, used in the cutting process for laser-cutting the pit pattern of crests and recesses, corresponding to the data to be recorded on the optical disc, for producing a master disc, has a basic structure in common with the cutting device 21, already explained with reference to FIG. 6, and additionally includes a decision unit 34 for discriminating the recordable area for the discrimination data.

In the following explanation of the cutting device 121, the parts used in common with the device shown in FIG. 6 are indicated with common reference numerals and are not explained specifically.

Figure 20:
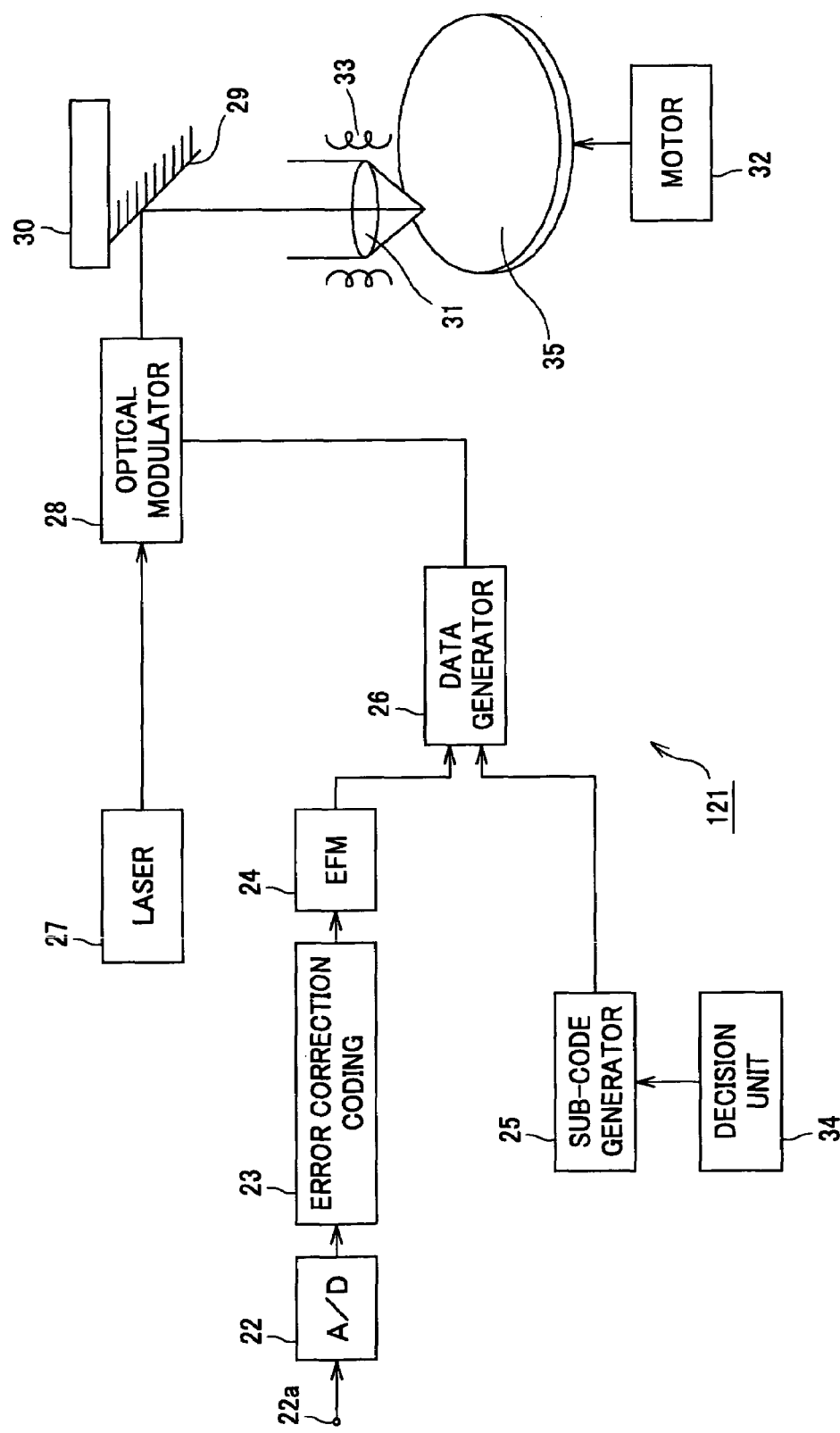
FIG. 20 is a block diagram showing another cutting device for producing a stamper.

The sub-code generator 25 of the cutting device 121, shown in FIG. 20, the sub-codes, including the address information for data, is generated in an area for recording main data, such as contents data, and are modulated by EFM for converting 8-bit sequence data bits into a 14-bit recorded code string.

The sub-code generator 25 generates, as a sub-code of the area in which to record the discrimination data, data bits of the 8-bit sequences in the EFM conversion table shown in FIGS. 8 and 9, described above, to convert the data bits into a 14-bit recording code sequence. Specifically, the sub-code generator 25 generates, as the sub-codes of the area in which to record the discrimination data, such data bits of the 8-bit data sequence, obtained on recording the discrimination data in an as-modulated 14 bit recording data sequence and on demodulation, in which the second bit from the leading end of the 8-bit data sequence, that is the sub-code Q channel, is complemented from [1] to [0] and in which the third bit from the leading end to the trailing end bit, that is to the sub-code R to W channels, will be the same bits. These data bits are selected so that, when the reflective film is fused to form simulated pits by illuminating the light beam on the lands defined between the pits, in the 14-bit pattern obtained on EFM, the newly formed bit string will satisfy the EFM modulation rule that the maximum length between transitions Tmax and the minimum length between transitions shall be 10 and 2, respectively.

Here again, the sub-code generator 25 selects the number 64 0X40h [01000000] in the decimal notation of the EFM conversion table as a sub-code of the area in which to record the discrimination data, as shown in FIG. 9A.

Moreover, the sub-code generator 25 selects the 65th 0X41h [01000001] in the decimal notation of the EFM conversion table as a sub-code of the area in which to record the discrimination data, as shown in FIG. 9B.

Also, the sub-code generator 25 selects the 68th 0X44h [01000100] in the decimal notation of the EFM conversion table as a sub-code of the area in which to record the discrimination data, as shown in FIG. 9C.

Additionally, the sub-code generator 25 selects the 71st 0X47h [01000111] in the decimal notation of the EFM conversion table as a sub-code of the area in which to record the discrimination data, as shown in FIG. 9D.

The sub-code generator 25 generates the above-described sub-codes, as the sub-codes of the area in which to record the discrimination data, so that a preset land is changed to a pit, specifically, so that the Q channel of the 8-bit sequence is complemented from [1] to [0], responsive to the data for recording, to enable the recording of the discrimination data. By setting the channels R to W so as to be of fixed values before and after the recording of the discrimination data, the area in which the discrimination data is to be recorded or have been recorded can be detected by the recording and/or reproducing apparatus.

To the sub-code generator 25 of the cutting apparatus 121, shown in FIG. 20, there is connected a decision unit 34 for identifying a recordable area for the discrimination data. The decision unit 34 determines whether the sub-code recorded in an area for recording main data, such as contents data, is to be generated by the sub-code generator 25, or the sub-code recorded in the recordable area for recording the discrimination data is to be generated by the sub-code generator 25. When the main data, such as contents data, are recorded, the decision unit 34 controls the sub-code generator 25 so that the sub-code generator 25 will generate the sub-codes including e.g., the address information concordant with the data to convert the so generated sub-codes by EFM from the data bits of the 8-bit sequences to the 14-bit recording code sequence. When the area being accesses is the recordable area for recording the discrimination data, the decision unit 34 controls the sub-code generator 25 so that the sub-code generator 25 will generate the data bits of the 8-bit sequences, shown in FIGS. 9A to 9D, in the EFM conversion table shown in FIGS. 8 and 9, to convert the so generated data bits into the 14-bit recording code sequence.

The data generator 26 is supplied not only with the recording data, modulated with EFM, from the modulation circuit 24, but with the sub-codes from the sub-code generator 25, as shown in FIG. 20. The data generator 26 inserts 3-bit coupling bits in-between the 14-bit blocks of the recording code sequences. Specifically, the data generator 26 selects, from among [000], [100], [010] and [001], such coupling bits which will satisfy the EFM conversion rule of the maximum length between transitions Tmax=10 and the minimum length between transitions Tmin=2 and which will reduce the absolute value of the DSV (digital sum value) to reduce the low frequency components further and inserts three coupling bits in-between the 14-bit blocks of the recording code sequences. The data generator 26 generates data shown in FIG. 1, with the recording code sequence being 17 bits long. The data generator outputs the so generated data to the optical modulator 28.

Figure 21:
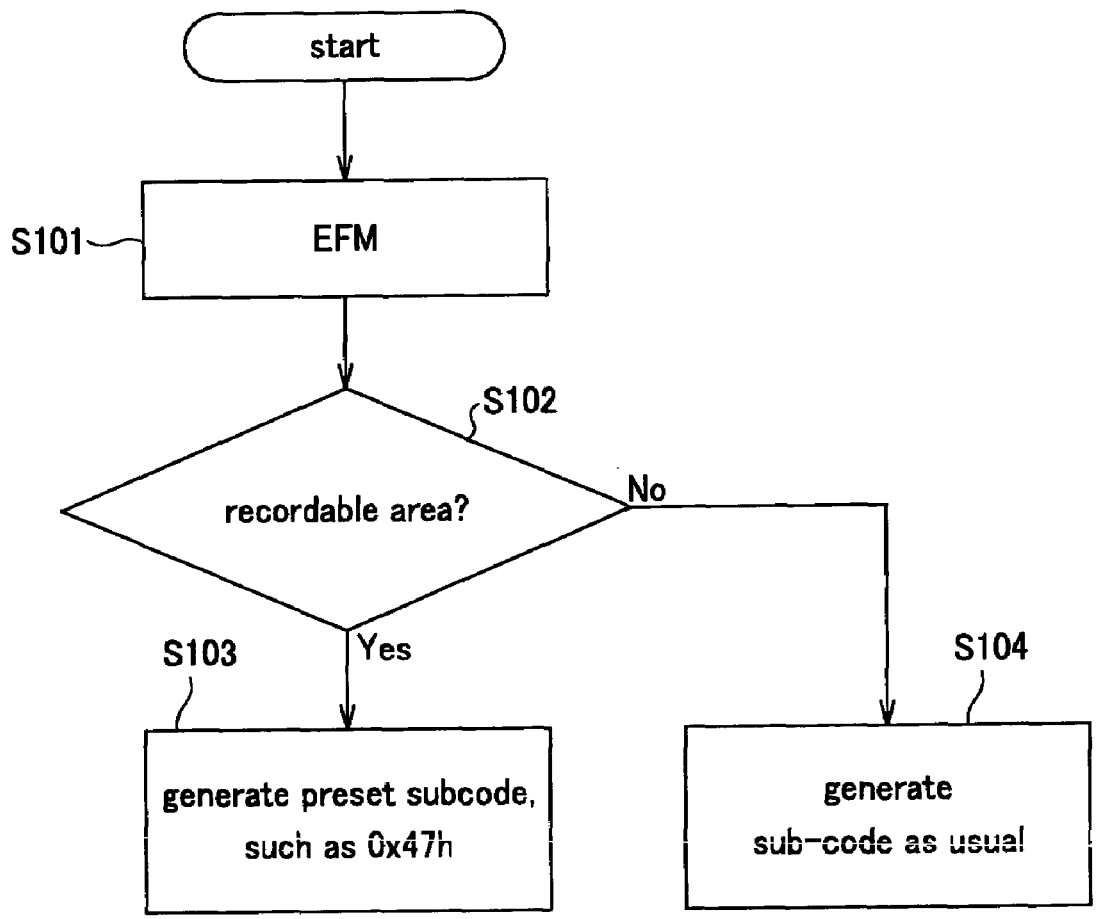
FIG. 21 is a flowchart for illustrating the sequence of generating a sub-code.

The operation of the cutting device 121, shown in FIG. 20, constructed as described above, is now explained by referring to FIG. 21.

When sampled data for recording is input via input terminal 22a to the A/D converter 22, the A/D converter 22 converts the data from analog signals into digital signals to output the resulting data to the error correction encoding circuit 23. The error correction encoding circuit 23 encodes the resulting samples by the combination of cross-interleaving and four-order Reed-Solomon codes to output the encoded signals to the modulation circuit 24. The modulation circuit 24 in a step S101 modulates the encoded output from the error correction encoding circuit 23 in accordance with the EFM algorithm to output the resulting modulated signals to the data generator 26. The sub-code generator 25 generates sub-codes including the address information concordant with data, in an area for recording main data, such as contents data, and converts the so generated sub-codes by EFM form the data bits of the 8-bit sequence into the 14-bit recording code sequence. The sub-code generator 25 generates, as the sub-codes of the area recording the discrimination data, the data bits of the 8-bit sequence in the EFM conversion table shown in FIGS. 8 and 9, to convert the so generated data bits into a 14-bit recording code sequence.

In a step S102, the decision unit 34 checks whether or not an area under consideration is an area in which to record the discrimination data. Specifically, the decision unit 34 may determine at least the areas of the UDI index, UDI payload and CRC, the values of which are changed from one optical disc shown in FIG. 4 to another, as the recordable area for the discrimination data. Of course, the entirety of the Q channel sub-codes may be determined as being the recordable area for the discrimination data. If the area in question is the area in which to record the discrimination data, the decision unit 34 proceeds to a step S103. If the area in question is not an area in which to record the discrimination data, that is if the area in question is an area in which to record main data, such as contents data, in the usual mode, the decision unit 34 proceeds to a step S104.

If the area in question is the area in which to record the discrimination data, the sub-code generator 25 in the step S103 generates, as special sub-codes, data bits of the 8-bit sequence, obtained on demodulating the as-modulated 14-bit recording code sequence, into which the discrimination data have been recorded, on the condition that the second bit from the leading end of the as-demodulated data bits of the 8-bit sequences, that is the sub-code Q channel, is complemented from [1] to [0] and that the bits beginning from the third bit from the leading bit to the trailing end bit, that is to the sub-code R to W channels, are the same bits. These data bits may be exemplified by 0X40h, 0X41h, 0X44h or 0X47h, as shown in FIGS. 9A to 9D. The sub-code generator 25 converts these sub-codes into the 14-bit recording code string, in accordance with the EFM conversion table shown in FIG. 9.

If the area in question is the area in which to record the main data, such as contents data, the sub-code generator 25 in a step S104 generates sub-codes, including the address information, corresponding to the data, and converts the so generated sub-codes into the 14-bit recording code sequence in accordance with the EFM conversion table shown in FIGS. 8 and 9.

The data generator 26 is supplied with data from the modulation circuit 24 and with data, such as sub-codes, from the sub-code generator 25, sums these data together, and inserts 3-bit coupling bits, not violating the EFM conversion rule, inbetween the 14-bit blocks, to generate recording data, which then is modulated with NRZI and output to the optical modulator 28.

The laser source 27 radiates a laser light beam which is input to the optical modulator 28. The optical modulator modulates the laser light based on the input from the data generator 26. That is, when [1] is input from the data generator 26, the optical modulator modulates the laser light. The laser light modulated by the optical modulator is incident on the mirror 29. This mirror 29 is moved by the movable mechanism 30 for scanning the laser light across the inner and outer rims of the glass master disc 35. The laser light is converged by the objective lens 31 so as to be illuminated on the glass master disc 35, which is run in rotation at CLV (constant linear velocity) by the spindle motor 32 as the rotational driving unit. The objective lens 31 is displaced along the optical axis of the laser light by the objective lens driving mechanism 33 by way of performing focusing control.

The above exposes the master disc 35 to light. In the optical disc, to which has been transcribed the pattern of the master disc 35, the 14-bit recording code sequences of 0X40h, 0X41h, 0X44h and 0X47h, shown in FIGS. 9A to 9D, are recorded in the recordable area for recording the discrimination data, whereby data are recorded so that at least the area of the UDI index, UDI payload and CRC, shown in FIG. 18, is all [1].

Figure 22:
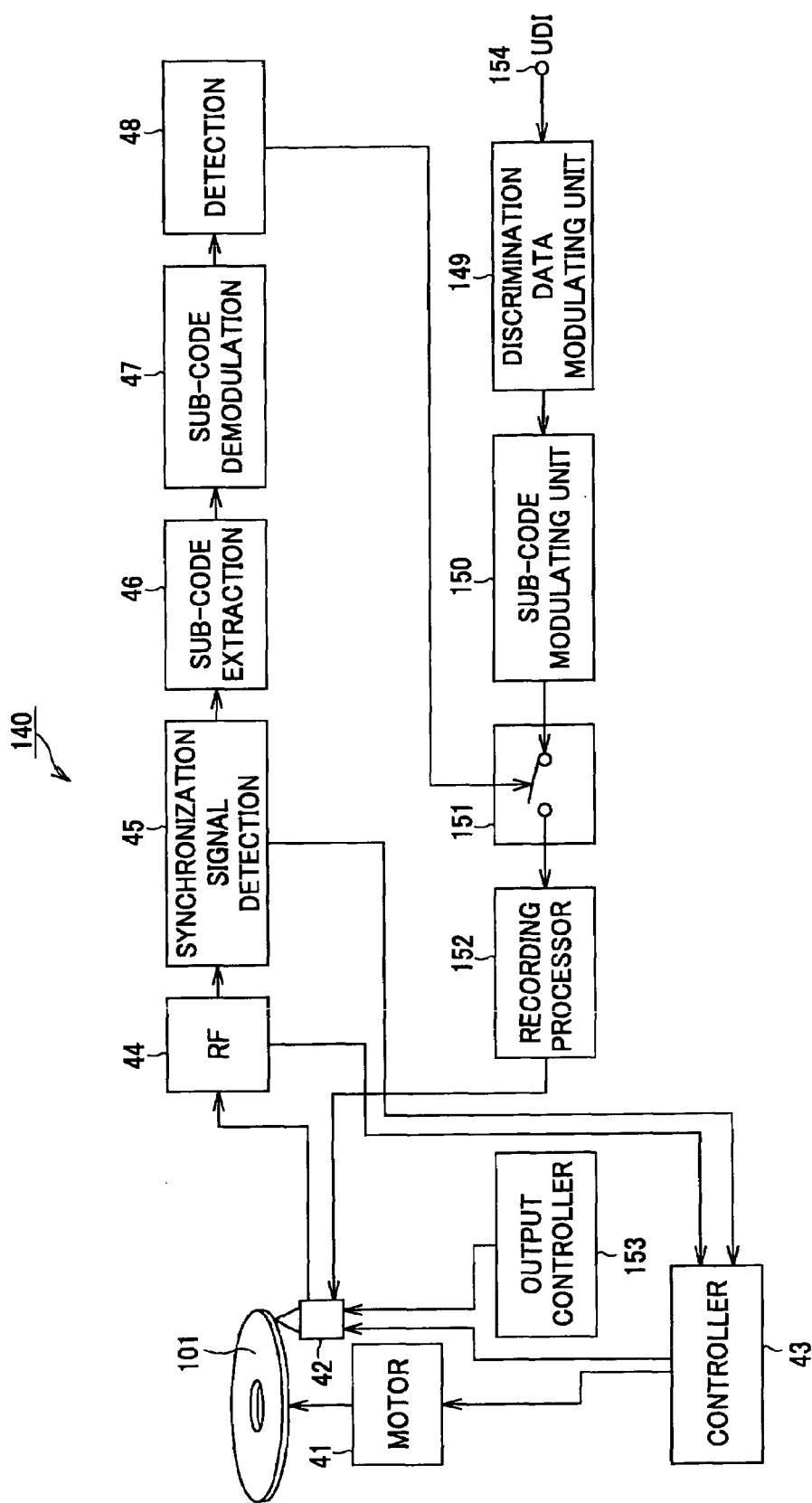
FIG. 22 is a block diagram showing another recording apparatus for discrimination data.

Referring to FIG. 22, a data recording apparatus for recording discrimination data on an optical disc used in the discrimination data recording step is now explained. Similarly to the data recording apparatus 40, this data recording apparatus 140 includes a spindle motor 41, for rotationally driving the optical disc 1, embodying the present invention, an optical pickup 42 for radiating a light beam to the optical disc 1 and for detecting the reflected return beam, a controller 43 for exercising focusing servo control and tracking servo control of the objective lens of the optical pickup 42 and for controlling the rotation of the spindle motor 41, an RF amplifier 44 for generating e.g., RF signals from a detection output of the optical pickup 42, a synchronization signal detection unit 45 for detecting the synchronization signal from the RF signal and for generating clocks, a sub-code extraction unit 46 for extracting sub-codes from the RF signals, a sub-code demodulating unit 47 for demodulating EFM modulated 14-bit sub-codes to 8 bits for generating sub-codes for P to W channels, and a detection unit 48 for detecting sub-codes of the R to W channels.

The data recording apparatus 140 includes, as a recording system for recording discrimination data for the optical disc 1, a discrimination data modulating unit 149 for modulating the discrimination data, a sub-code modulating unit 150 for modulating the sub-codes, a switching unit 151 for switching the inputs of the discrimination data recorded on the optical disc 101, a recording processor 152 for performing recording processing in recording the discrimination data on the optical disc 101 and an output controller 153 for controlling the outputting of the light beam radiated by the optical pickup 42.

The spindle motor 41 has its spindle shaft mounted in unison with the disc table. The disc table is engaged in a center opening of the optical disc 101 and thereby clamped as the center of rotation of the optical disc 101 is coincident with the center of rotation of the spindle shaft. The spindle motor 41 causes rotation of the optical disc 1 in unison with the optical disc 101.

The optical pickup 42 includes a semiconductor laser for radiating a light beam, an objective lens for collecting the light beam radiated from the semiconductor laser, and a photodetector for detecting the return light beam reflected back from the reflective film of the optical disc 101. The light beam, radiated from the semiconductor laser, is collected by the objective lens, so as to be illuminated on the signal recording surface of the optical disc 1. The semiconductor laser has its output controlled by an output controller 153. It is noted that, in reproducing data recorded on the optical disc 101, the semiconductor laser radiates a light beam at a standard output, under control by the output controller 153 when recording the discrimination data, the light beam is radiated at an output level higher than in reproduction to fuse the reflective film by way of thermal recording.

The return light beam, reflected back from the signal recording surface of the optical disc 1, is converted by the photodetector into electrical signals, which are output by the photodetector to the RF amplifier 44. The objective lens is held by an objective lens driving mechanism, such as a bi-axial actuator, and is displaced in the focusing direction parallel to the optical axis of the objective lens and in the tracking direction perpendicular to the optical axis of the objective lens.

The RF amplifier 44 generates RF signals, focusing error signals and tracking error signals, based on the output signal of the photodetector forming the optical pickup 62. For example, the focusing error signals are generated by e.g., an astigmatic method, while the tracking error signals are generated by a three-beam method, or a push-pull method. The RF amplifier 44 outputs focusing error signals and the tracking error signals to the servo controller 43.

The synchronization signal detection unit 45 detects the frame synchronization signals, shown in FIG. 1, from the RF signals, while detecting the synchronization signals, used in decoding the sub-codes shown in FIGS. 2 and 3. The synchronization signal detection unit 45 generates clocks from the synchronization signals.

The controller 43 generates the focusing servo signals and the tracking servo signals, based on the focusing error signals and the tracking error signals, input from the RF amplifier 44, to output the so generated signals to a driving circuit for the objective lens driving mechanism of the optical pickup 42. Thus, the objective lens, held by the objective lens driving mechanism, is displaced, based on the focusing servo signals and the tracking servo signals, in the focusing direction parallel to the optical axis of the objective lens and in the tracking direction perpendicular to the optical axis of the objective lens. The controller 43 also generates rotational servo signals, so that the clocks generated from the synchronization signals will be synchronized in frequency and phase with the reference clocks from the quartz oscillator. The spindle motor 61 accordingly causes rotation of the optical disc at for example the CLV.

The sub-code extraction unit 46 extracts, from the data input from the RF amplifier 44, the 14-bit sub-coding, provided next to the frame synchronization signals, to output the so extracted signals to the sub-code demodulating unit 47. Based on the EFM conversion table, the sub-code demodulating unit 47 converts the 14-bit data into 8-bit data. The sub-code demodulating unit 69 forms one block with 98 frames, to generate sub-codes of P, Q, R, S, T, U, V and W channels. That is, the sub-code demodulating unit 47 generates from P1-W1 to P96-W96, that is 96 bit sub-codes.

The detection unit 48 detects the mode for recording the discrimination data. That is, the detection unit 70 detects from the ADR of the Q-channel whether the mode is that of recording discrimination data. The detection unit 48 may also specify an area, in which to record the discrimination data, and set the apparatus to the discrimination data recording mode, by detecting whether or not the sub-codes of the R to W channels are of fixed values. The detection unit 48 may also specify whether or not the recording position is the land, or by the combination of the two methods.

The discrimination data modulating unit 149 modulates the discrimination data, input at an input terminal 154, in accordance with a predetermined modulation system, and outputs the resulting data to the sub-code modulating unit 150. It is noted that data input to the input terminal 154 is data of from $a_0$ to $a_7$, recorded in UDI index, in addition to the discrimination data recorded in the UDI payload, as shown in FIG. 19.

The sub-code modulating unit 150 demodulates the sub-codes of the frame, in which to record the discrimination data by illuminating the light beam, from the 8-bit data bit sequences into 14-bit channel sequences. That is, the sub-code modulating unit 150 performs the processing of changing the frame in which to record the discrimination data from for example 0X40h to 0X00h, from 0X41h to 0X01h, from 0X44h to 0X04h or from 0X47h to 0X07h, as already explained with reference to FIGS. 9A to 9D, for converting the 8 data bits to 14-bit recording code sequences, in accordance with the EFM conversion rule shown in FIGS. 8 and 9.

The switching unit 151 switches the discrimination data to be recorded on the optical disc 101. The switching unit 151 is turned on or off when the detection unit 48 has detected or has not detected the mode of recording the discrimination data, respectively, under control by the detection unit 48. That is, the switching unit 151 permits the discrimination to be output to the recording processor 152 only when recording the discrimination data. The recording processor 152 performs recording processing necessary for recording on the optical disc 101 to output the recording-processed data to the optical pickup 42.

Figure 23:
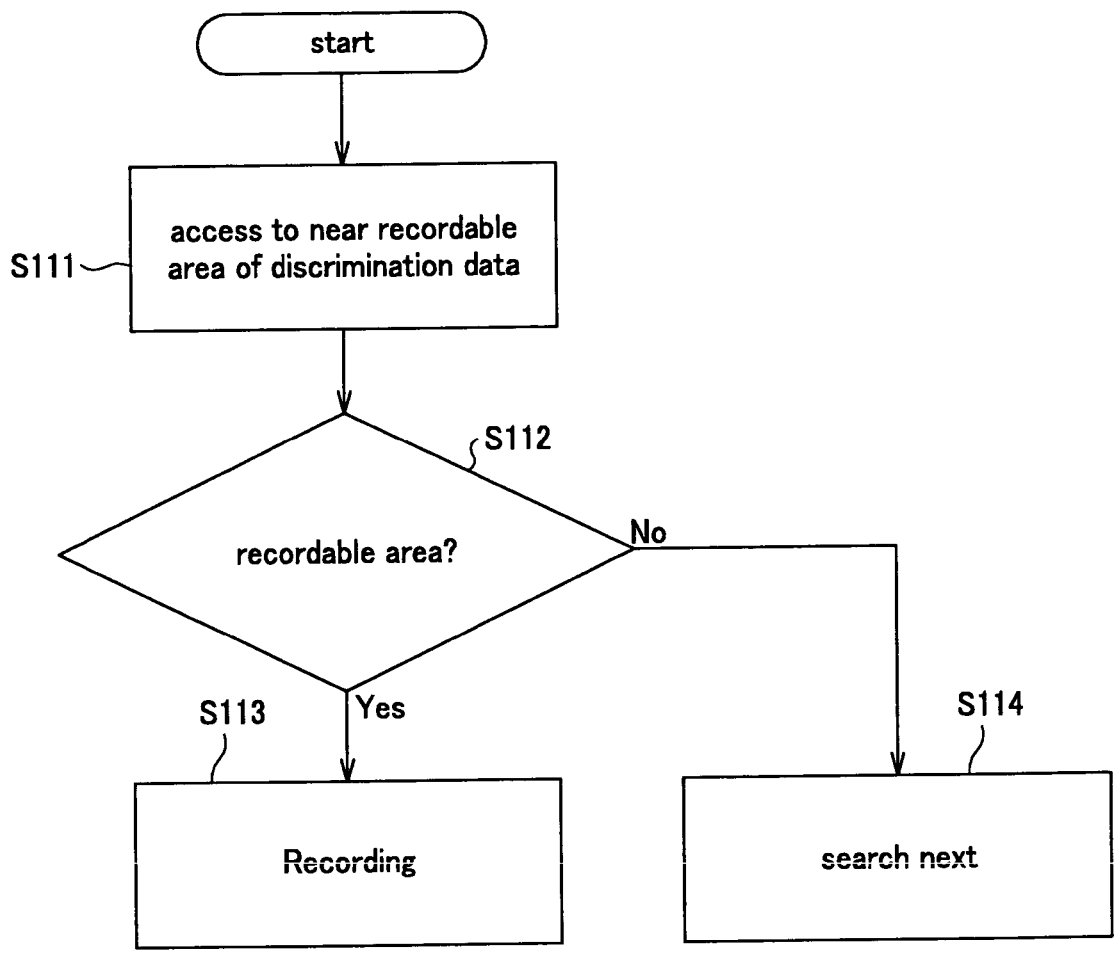
FIG. 23 is a flowchart for illustrating the recording operation for discrimination data of the data recording apparatus.

Referring to FIG. 23, the processing by the above-described data recording apparatus 140 for recording the discrimination data is now explained. First, when a user has pressed a discrimination data recording button, the data recording apparatus 140 actuates the spindle motor 41 to cause the rotation of the optical disc, loaded on the disc table, forming the disc loading unit, at a constant linear velocity. Simultaneously, the optical pickup 42 illuminates a light beam on the optical disc 101. It is noted that an output controller 153 controls the semiconductor laser of the optical pickup 42 to output the light beam at a standard output. The optical pickup 42 initiates data readout as focusing servo and tracking servo operations are performed under control by the controller 43.

The data recording apparatus 140 in a step S111 causes the optical pickup 42 to effect track jump to near the recordable area for the discrimination data, for recording the discrimination data in the recordable area, based on e.g., the TOC of the sub-codes, demodulated by the sub-code demodulating unit 47. The data recording apparatus 140 causes the sub-code extraction unit 46 to extract the sub-codes of the recordable area of the discrimination data and causes the sub-code demodulating unit 47 to demodulate the so extracted data to output the resulting 8-bit data to the detection unit 48. In a step S112, the detection unit 48 checks, using the discrimination data in the ADR of the sub-code of the Q channel, whether or not the area in question is the area for recording the discrimination data. If it is determined that the area in question is the area for recording the discrimination data, the detection unit 48 turns the switching unit 151 on to proceed to step S113. If it is determined that the area in question is not the area for recording the discrimination data, the detection unit 48 turns the switching unit 151 off to proceed to step S114. The detection unit 48 may also specify an area, in which to record the discrimination data, and set the apparatus to the discrimination data recording mode, by detecting whether or not the sub-codes of the R to W channels are of fixed values. The detection unit 48 may also specify whether or not the recording position is the land, or by the combination of the two methods.

If the area is the area for recording the discrimination data, and the discrimination data is input in a step S113 at an input terminal 154, the discrimination data modulating unit 149 modulates the discrimination data in accordance with a predetermined system. By the recording of the discrimination data, the sub-code modulating unit 150 performs the modulation processing of converting the sub-code of the frame, on which the light beam is illuminated, from the 8-bit data bit sequences into 14-bit data bit sequences. The sub-code modulating unit 150 inputs the modulated discrimination data through the switching unit 151 to the recording processor 152. The recording processor 152 outputs the input discrimination data to the optical pickup 42. The recording processor 152 switches the semiconductor laser output from the standard level to the high level, in order to effect thermal recording by fusing the reflective film. The data recording apparatus 140 records data in the sub-code recording area of the Q channel shown in FIG. 18, that is in 84 bits from the UDI index to the CRC by forming a simulated pit in the land. Specifically, the data recording apparatus 140 records data of from $a_0$ to $a_7$ in the UDI index, then records the discrimination data in the 56-bit UDI payload, then records the address information, such as frame numbers, in the 8-bit AFRAME and then records an error correction code in the 16-bit CRC.

If the mode is not that of recording the discrimination data, the detection unit 48 in a step S114 turns off the switching unit 151 to inhibit the recording of the discrimination data.

The method for recording these data is now explained with reference to FIG. 24. In this embodiment, 0X47h shown in FIG. 9D is changed to 0X07h. A pattern A prior to the recording of the discrimination data is shown in (A) of FIG. 24, in which 24-bit frame synchronization signals are followed by [000] coupling bits, followed by the sub-code of [00100100100100] (0X47h), followed in turn by [100] coupling bits. On the optical disc 101, there are recorded a 11T long pit P1, followed by a 11T long land L1, a 7T long pit P2, then by a 3T long land L2, then by a 3T long pit P3, then by a 3T long land L3, then by a 3T long pit P4 and finally by 3T to 11T long coupling bits of the land L4.

The data recording apparatus 140 illuminates a high output light beam from the pit P3 to the pit P4 to fuse the reflective film by way of performing thermal recording to virtually form a pit continuing from the pit P3 to the pit P4 in the land L3 to produce a post-recorded pattern A shown in FIG. 14B. Meanwhile, the light beam may be locally illuminated on the land L3. Consequently, the post-recording pattern A is the pattern of [00100100000000] (0X07h) recorded in the sub-code area. Thus, there are recorded, on the optical disc 101, a 11T long pit P1, followed by a 11T land L11, followed by a 7T long pit P12, then by a 3T land L12, then by 9T long pit P13 and then by a land L13 of the 3T to 11T coupling bits. That is, in the land L4 (L13), the length of the pits 13 is 11T long or shorter and the length of 11T is not exceeded from the land to the former portion of the channel bits of the succeeding block, in order to avoid violation of the EFM conversion rule.

Figure 24:
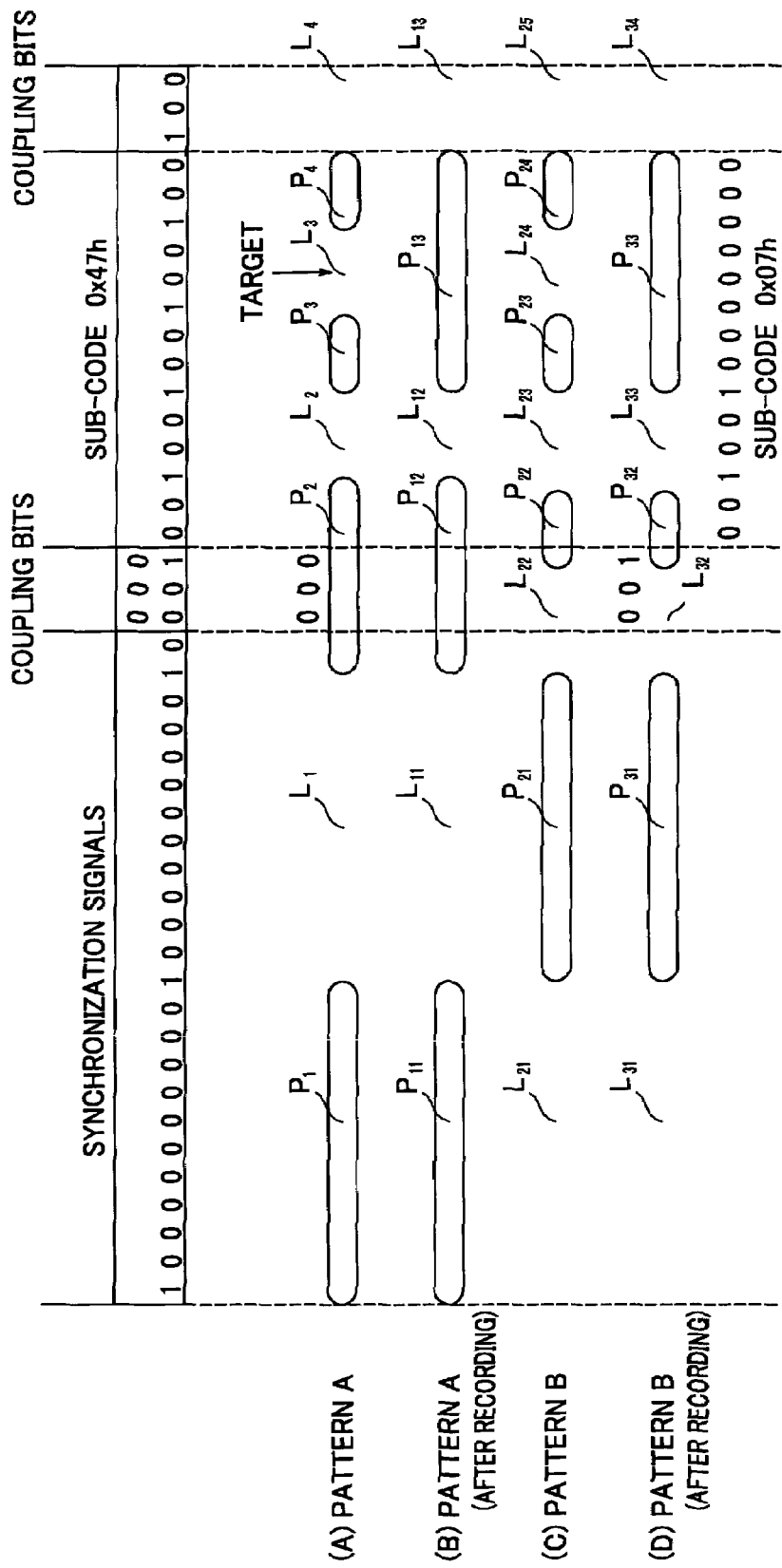
FIG. 24 illustrates a recording example of discrimination data for hanging 0X47h to 0X07h.

Turning to the case in which the pattern of the frame synchronization signals is the reverse of the above pattern, a pattern B prior to the recording of the discrimination data, shown in (C) of FIG. 24, begins with 24-bit frame synchronization signals, followed by coupling bits [001], then followed by the sub-code of [00100100100100] (0X47h), followed in turn by the coupling bits [100]. Thus, there are recorded, on the optical disc 101, a 11T long land L21, followed by a 11T long pit P21, by a 4T long land L22, then by a 3T long pit P22, then by a 3T long land L23, then by a 3T long pit P23, then by a 3T long land L24, then by a 3T long pit L24, and then followed by 3T to 11T long lands L25 of the coupling bits.

The data recording apparatus 140 illuminates a high output light beam from the pit P3 to the pit P4 to fuse the reflective film, by way of performing thermal recording, thereby virtually forming pits continuing from the pit P3 to the pit P4 on the site of the land L3, in order to produce a post-recording pattern B shown in (D) of FIG. 24. Meanwhile, the light beam may be locally illuminated on the land L3. Consequently, the post-recording pattern B is the pattern of [00100100000000] (0X07h) in the sub-code area. Thus, there are recorded, on the optical disc 101, a 11T long land 31, followed by a 11T long pit P31, then by a 4T long land P32, then by a 3T long pit P32, then by a 3T long land L33, then by a 9T long pit P33 and then followed by 3T to 11T long land L34 of the coupling bits. That is, the land L25 (L34) has a length of the pit 33 not longer than 11T so that 11T is not exceeded in the relationship with the former portion of the channel bits of the succeeding block, thereby avoiding violation of he EFM conversion rule.

Thus, the data recording apparatus 140 forms a pattern of pits and lands, corresponding to the discrimination data, by on/off of the high output light beam, to record the discrimination data in the Q channel sub-codes.

Figure 25:
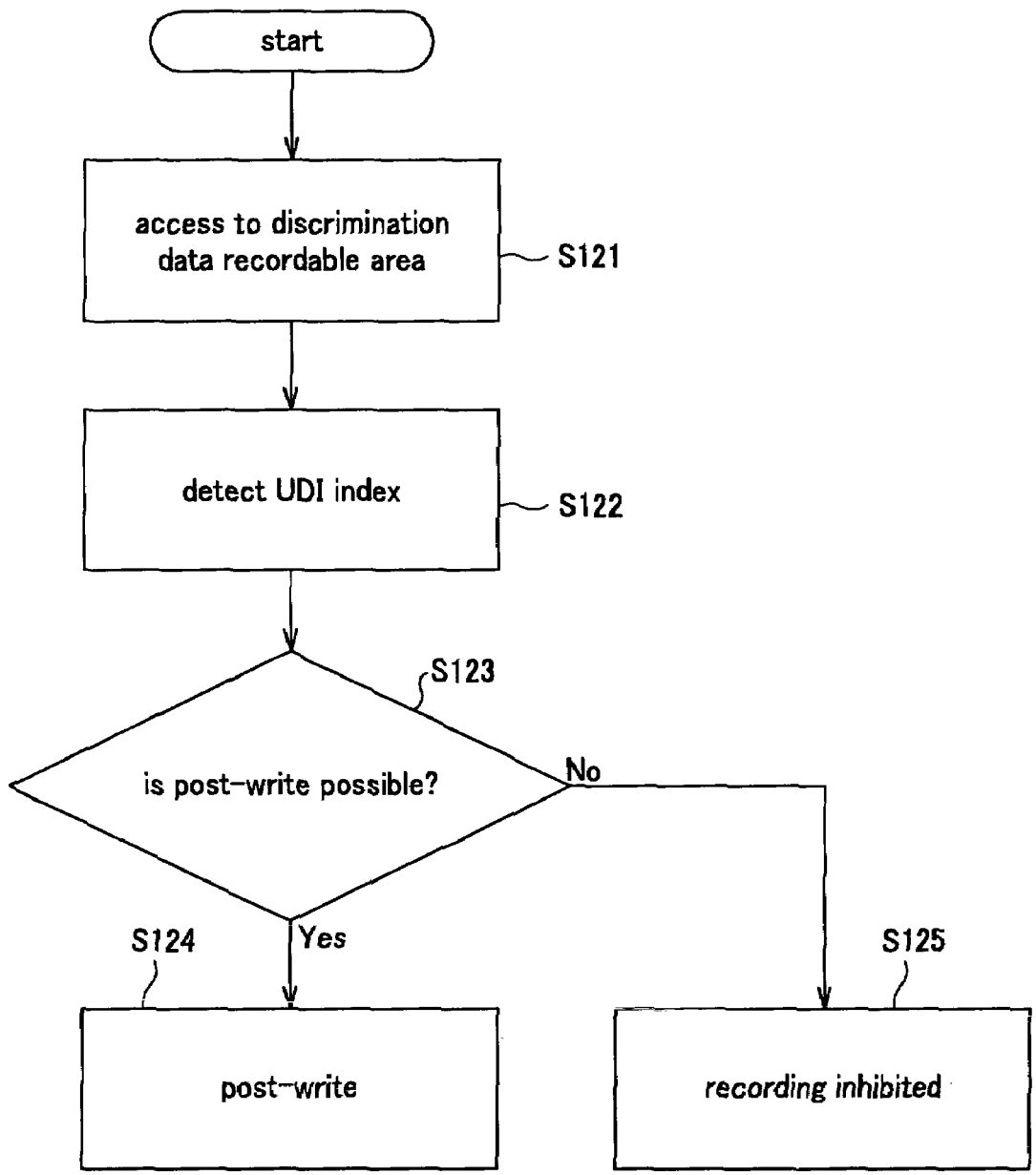
FIG. 25 is a flowchart for illustrating the sequence of post-recording discrimination data.

The data recording apparatus 140 references the UDI index $a_0$ to $a_7$ of the UDI index of the optical disc 101, having the discrimination data, recorded thereon, to post-record the discrimination data, as now explained with reference to FIG. 25.

In a step S121, the data recording apparatus 140 effectuates track jump to the recordable area for the discrimination data, and accesses an area where the discrimination data has been recorded. The data recording apparatus 140 causes the sub-code extraction unit 46 to extract the sub-codes of the recordable area of the discrimination data and causes the sub-code demodulating unit 47 to demodulate the extracted data to output the resulting data to the detection unit 48. The detection unit 48 detects the UDI index shown in FIGS. 18 and 19. In a step S123, the detection unit 48 detects the UDI index shown in FIGS. 18 and 19. In this step S123, the detection unit 48 checks whether or not the post-writing of e.g., the discrimination data is possible. For example, if the data length of the discrimination data is not up to the total number of frames (sectors) stated in the header, the detection unit 48 specifies the frame other than the area where the discrimination data has been recorded as being an non-recorded area. If, in the step S123, the detection unit 48 has verified that there is the non-recorded area, the detection unit 48 proceeds to a step S124 and, if otherwise, the detection unit 48 proceeds to a step S125.

If there is the non-recorded area, the detection unit 48 in the step S124 turns on the switching unit 151 to set a discrimination data post-write enabling state. When the discrimination data is input from the input terminal 154, the discrimination data modulating unit 149 modulates the discrimination data in accordance with a predetermined system. The sub-code modulating unit 150 performs demodulation processing of converting the sub-codes of the frame illuminated by the light beam from the 8-bit data bit sequences into 14-bit channel bit sequences by the recording of the discrimination data. The sub-code modulating unit 150 accesses the recording processor 152 through the switching unit 151. The recording processor 152 outputs the demodulated sub-codes to the optical pickup 42. The output controller 153 switches the output of the semiconductor laser from the standard level to the high level in order to effect thermal recording of the discrimination data by fusing the reflective film. The data recording apparatus 140 forms a simulated pit in the land to post-write discriminated data in the Q channel sub-code recordable area shown in FIG. 18. If there is no non-recorded area, the detection unit 48 turns off the switching unit 151 to prohibit the post-recording of the discrimination data.

Figure 26:
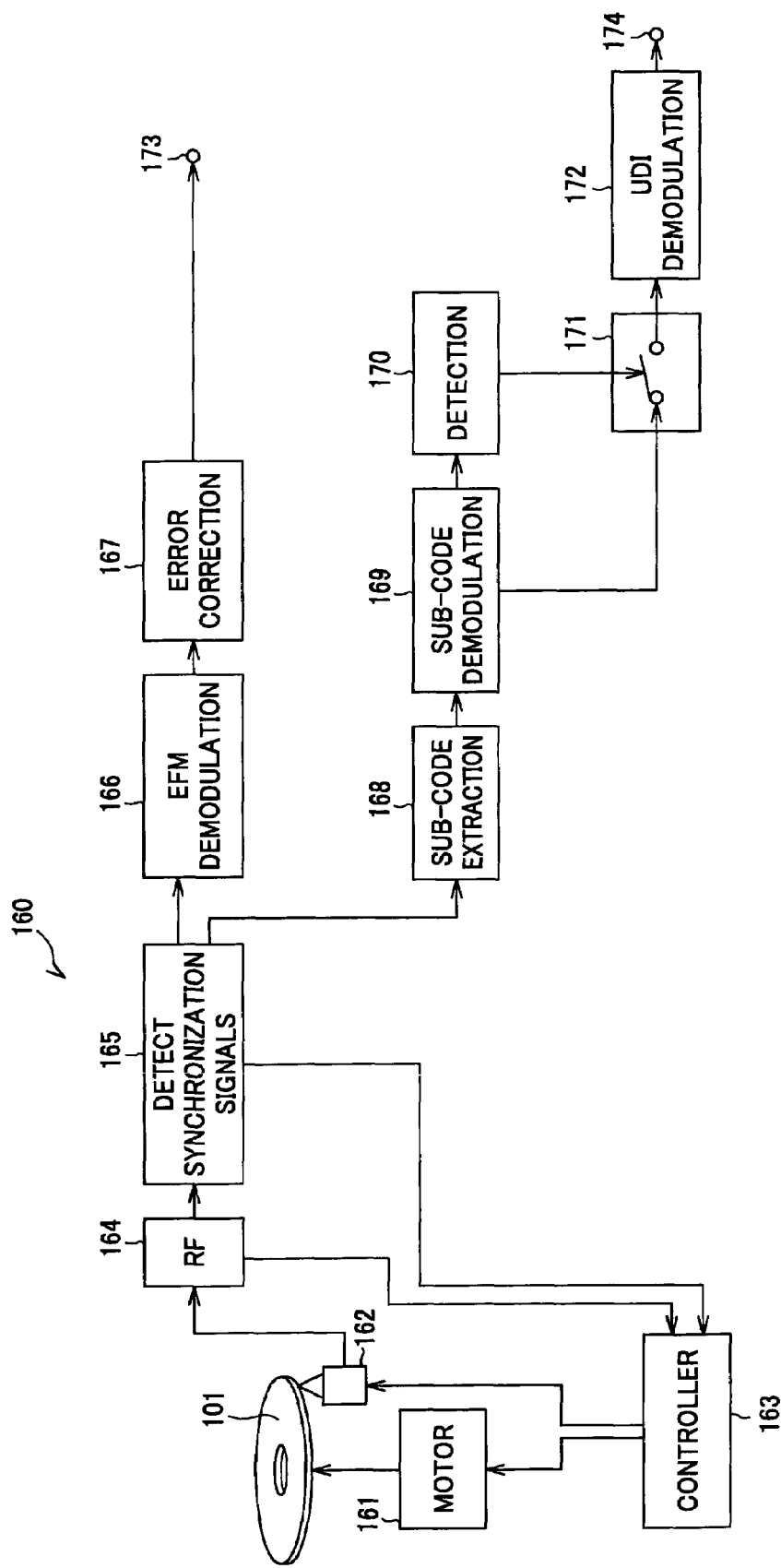
FIG. 26 is a block diagram showing another data reproducing apparatus for reproducing an optical disc according to the present invention.

Referring to FIG. 26, a data reproducing apparatus 160 for reproducing the optical disc 101, on which the discrimination has been recorded by the above-described data recording apparatus 140, is now explained. The data reproducing apparatus 160 includes a spindle motor 161, adapted for rotating the optical disc 101, having the discrimination data recorded thereon, an optical pickup 162 for radiating a light beam to the optical disc 101 and for detecting the reflected return light beam, a controller 163 for effecting focusing servo control and tracking servo control of the objective lens of the optical pickup 162 and for effecting rotational servo control of the spindle motor 161, an RF amplifier 164 for generating RF signals from an output of the optical pickup 162, a synchronization signal detection unit 165 for detecting synchronization signals from the RF signals for generating clocks, a demodulating unit 166 for demodulating recording data, such as contents data, modulated by EFM, and an error correction unit 167 for correcting errors of the demodulated data.

The data reproducing apparatus 160 includes a sub-code extraction unit 168 for extracting sub-codes from the RF signals, a sub-code demodulating unit 169 for demodulating the 14-bit sub-codes, modulated by EFM, into 8 bits to generate sub-codes of the R to W channels, a detection unit 170 for detecting sub-codes of the R to W channels, a switching unit 171 for switching the discrimination data recorded on the optical disc 101, and a demodulating unit 172 for demodulating the discrimination data.

The spindle motor 161 has its spindle shaft mounted in unison with the disc table. The disc table is engaged in a center opening of the optical disc 101 and thereby clamped as the center of rotation of the optical disc 101 is coincident with the center of rotation of the spindle shaft. The spindle motor 161 causes rotation of the optical disc 101 in unison with the disc table.

The optical pickup 162 includes a semiconductor laser, as a light source for radiating a light beam, an objective lens for collecting the light beam radiated from the semiconductor laser, and a photodetector for detecting the return light beam reflected back from the reflective film of the optical disc 101. The light beam, radiated from the semiconductor laser, is collected by the objective lens, so as to be illuminated on the signal recording surface of the optical disc 101. It is noted that, in reproducing data, the semiconductor laser radiates a light beam at a standard output. The return light beam, reflected back from the signal recording surface of the optical disc 1, is converted by the photodetector into electrical signals, which are output by the photodetector to the RF amplifier 164. The objective lens is held by an objective lens driving mechanism, such as a bi-axial actuator, and is displaced in the focusing direction parallel to the optical axis of the objective lens and in the tracking direction perpendicular to the optical axis of the objective lens.

The RF amplifier 164 generates RF signals, focusing error signals and tracking error signals, based on the output signal of the photodetector forming the optical pickup 162. For example, the focusing error signals are generated by e.g., an astigmatic method, while the tracking error signals are generated by a three-beam method, or a push-pull method. The RF amplifier 164 outputs the RF signals to the demodulating unit 166 for demodulating the EFM modulated data, while outputting the focusing error signals and the tracking error signals to the servo controller 163.

The synchronization signal detection unit 165 detects the frame synchronization signals, shown in FIG. 1, from the RF signals, while detecting the synchronization signals, used in decoding the sub-codes shown in FIGS. 2 and 3. The synchronization signal detection unit 165 generates clocks based on the detected synchronization signals.

The controller 163 generates the focusing servo signals and the tracking servo signals, based on the focusing error signals and the tracking error signals, input from the RF amplifier 164, to output the so generated signals to a driving circuit for the objective lens driving mechanism of the optical pickup 162. Thus, the objective lens, held by the objective lens driving mechanism, is displaced, based on the focusing servo signals and the tracking servo signals, in the focusing direction parallel to the optical axis of the objective lens and in the tracking direction perpendicular to the optical axis of the objective lens. The controller 163 also generates rotational servo signals, so that the clocks generated from the synchronization signals will be synchronized in frequency and phase with the reference clocks from the quartz oscillator. The spindle motor 161 accordingly causes rotation of the optical disc 101 at for example the CLV.

The demodulating unit 166 demodulates recording data, such as contents data, in accordance with the EFM algorithm. Specifically, the demodulating unit 166 converts the 14-bit recording code sequence into 8-bit data bits, in accordance with the EFM conversion table shown in FIGS. 8 and 9. The error correction unit 167 demodulates the modulated recording data in accordance with an algorithm, such as CIRC, to output the demodulated data to an output terminal 173. For example, if the recording data is audio data, the audio data, output at the output terminal 173, is converted by the D/A converter from digital signals to analog signals, and output via for example a loudspeaker, an earphone or a headphone.

The sub-code extraction unit 168 extracts the 14-bit sub-coding, provided next to the frame synchronization signals, from data input from the RF amplifier 164, to output the so extracted sub-coding to the sub-code demodulating unit 169. The sub-code demodulating unit 169 converts the 14-bit data into 8-bit data based on the EFM conversion table. The sub-code demodulating unit 69 forms one block with 98 frames, to generate sub-codes of P, Q, R, S, T, U, V and W channels. That is, the sub-code demodulating unit 47 generates from P1-W1 to P96-W96, that is 96 bit sub-codes.

The detection unit 170 detects the mode for recording the discrimination data. That is, the detection unit 170 detects from the ADR of the Q-channel whether the mode is that of recording discrimination data. The detection unit 170 may also specify an area, in which to record the discrimination data, and set the apparatus to the discrimination data recording mode, by detecting whether or not the sub-codes of the R to W channels are of fixed values. The detection unit 48 may also specify whether or not the recording position is the land, or by the combination of the two methods. If the mode is that of recording the discrimination data, the detection unit 170 may turn on the switching unit 171 to output the discrimination data input from the sub-code extraction unit 168 to the demodulating unit 172. If the mode is not that of recording the discrimination data, the area being accessed is assumed to be not the discrimination data recording area so that the detection unit turns off the switching unit 171 to inhibit the inputting to the demodulating unit 172 of the discrimination data input from the sub-code extraction unit 168.

The demodulating unit 172 is supplied with Q channel sub-codes from the sub-code demodulating unit 169 via switching unit 171. The demodulating unit 172 references $a_0$ to $a_7$, recorded in the UDI index, shown in FIG. 18, and demodulates the discrimination data, recorded in the UDI payload, while effecting error correction processing, using the CRC, to output the resulting data to an output terminal 174.

Figure 27:
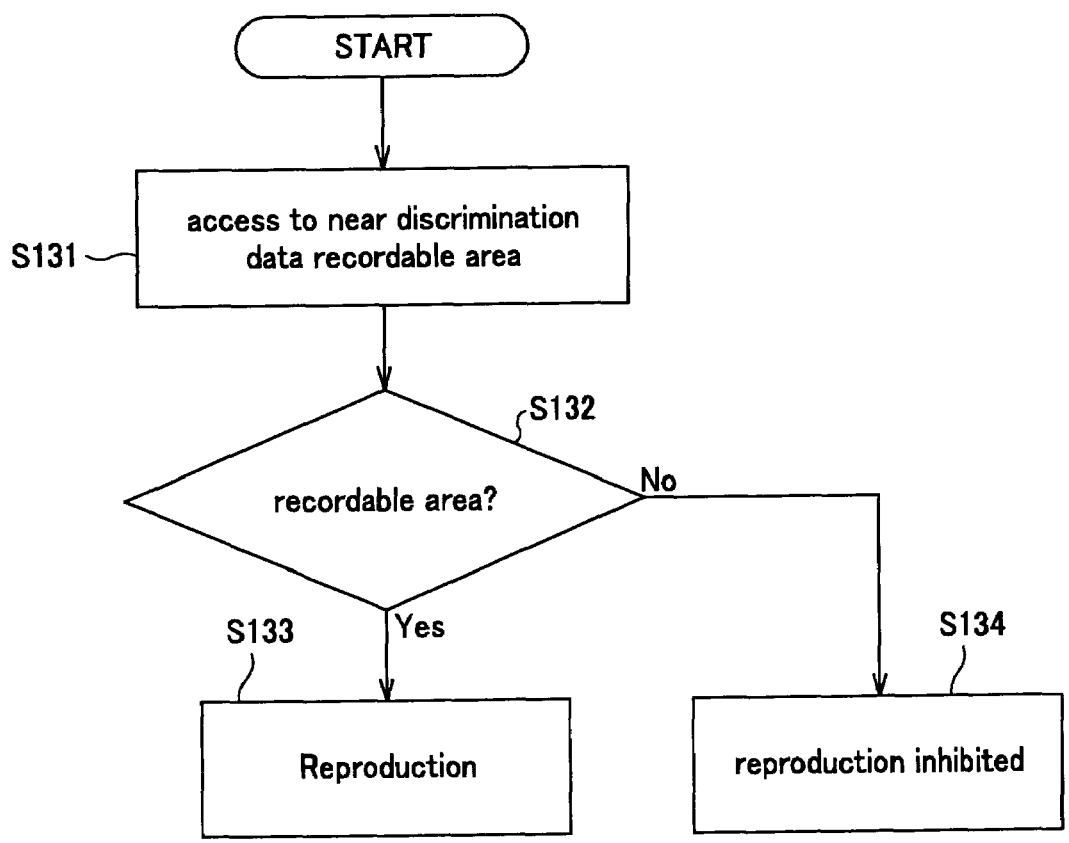
FIG. 27 is a flowchart for illustrating the reproducing operation of a data reproducing apparatus.

Referring to FIG. 27, the processing by the above-described data reproducing apparatus 160 for reading out the discrimination data is now explained. First, when a user has pressed a replay button, the data reproducing apparatus 160 actuates a motor 161 to cause rotation of the optical disc 101, loaded on the disc table, forming the disc loading unit, at a constant linear velocity. Simultaneously the optical pickup 162 illuminates the light beam on the optical disc 101. At this time, the semiconductor laser radiates the light beam with a standard output. The optical pickup 162 initiates data readout as focusing servo control and tracking servo control are exercised by the servo controller 163.

The data reproducing apparatus 160 in a step S131 effectuates track jump of the optical pickup 142, to near the recordable area for the discrimination data, based on the sub-code TOC, demodulated by the sub-code demodulating unit 169, in order to record the discrimination data in the recordable area. The data reproducing apparatus 160 causes the sub-code extraction unit 168 to extract the sub-codes of the recordable area for the discrimination data and demodulates the so extracted data in the sub-code demodulating unit 169 to output the resulting 8-bit data to the detection unit 170. In a step S132, the detection unit 170 verifies, using the discrimination data in the ADR of the Q channel sub-code, whether or not the area in question is the area where the discrimination has been recorded. If it is determined that the area in question is the area where the discrimination data has been recorded, the detection unit 170 turns on the switching unit 171 to proceed to a step S133. If it is determined that the area in question is not the area where the discrimination data has been recorded, the detection unit 170 turns off the switching unit 171 to proceed to a step S134. Meanwhile, the detection unit 170 may detect whether or not the sub-codes for the R to W channels are of fixed values to set the apparatus to the replay mode for the discrimination data.

In a step S133, the data reproducing apparatus 160 references $a_0$ to $a_7$ of the UDI index shown in FIGS. 18 and 19 to calculate the total number of frames to verify the length of the area where the discriminated data has been recorded. The data reproducing apparatus 160 outputs the discrimination data from the sub-code demodulating unit 169 through the switching unit 171 to the demodulating unit 172. The demodulating unit 172 demodulates the discrimination data to effect error correction to output the resulting data to the output terminal 174. The contents data, for example, recorded on the optical disc 101, are demodulated by the demodulating unit 166, then corrected for errors in the error correction unit 167, and then output at the output terminal 173. For example, if the contents data are e.g., audio data, the data are converted by the D/A converter from digital signals to analog signals and output via acoustic transducer, e.g., a loudspeaker, an earphone or a headphone.

In a step S134, the detection unit 170 of the data reproducing apparatus 160 turns off the switching unit 171 to inhibit the reproduction of the discrimination data. Meanwhile, the detection unit 170 may set this state as being an error state to display an error message on e.g., a monitor.

With the optical disc 101, embodying the present invention, the index (UDI index) is recorded as an index in an area for recording the discrimination data and e.g., the length of the discrimination data is recorded therein to assure facilitated expansion of the capacity of the discrimination data. That is, even if the recording speed is increased such that the recording volume per unit time is increased, the capacity may be enhanced readily by changing this index. If the data length of the discrimination data is not up to the total number of frames (sectors) recorded in the header, the frames other than the area where the discrimination data has been recorded may be specified as being the non-recorded area, so that further data, such as discrimination data, may be post-recorded in the so specified non-recorded area.

Referring to the drawings, a third embodiment of the optical disc, a method and an apparatus for recording data on this optical disc and a method and apparatus for reproducing the data recorded on the optical disc, is hereinafter explained.

In the optical disc, used here, as in the above-described optical disc, a lead-in area for recording TOC (table-of-contents) data is recorded on the inner rim side, and a data recording area for recording the recording data, such as contents data, is provided on a radially outer side of the lead-in area. A lead-out area is provided on the radially outer side of the data recording area. The data recorded to the same recording format as the CD, that is the 8-14 (eight-to-fourteen) modulated data (data modulated by EFM), are recorded to the recording format shown in FIG. 1.

The optical disc, used here, is manufactured by a process already explained with reference to FIG. 5.

Figure 28:
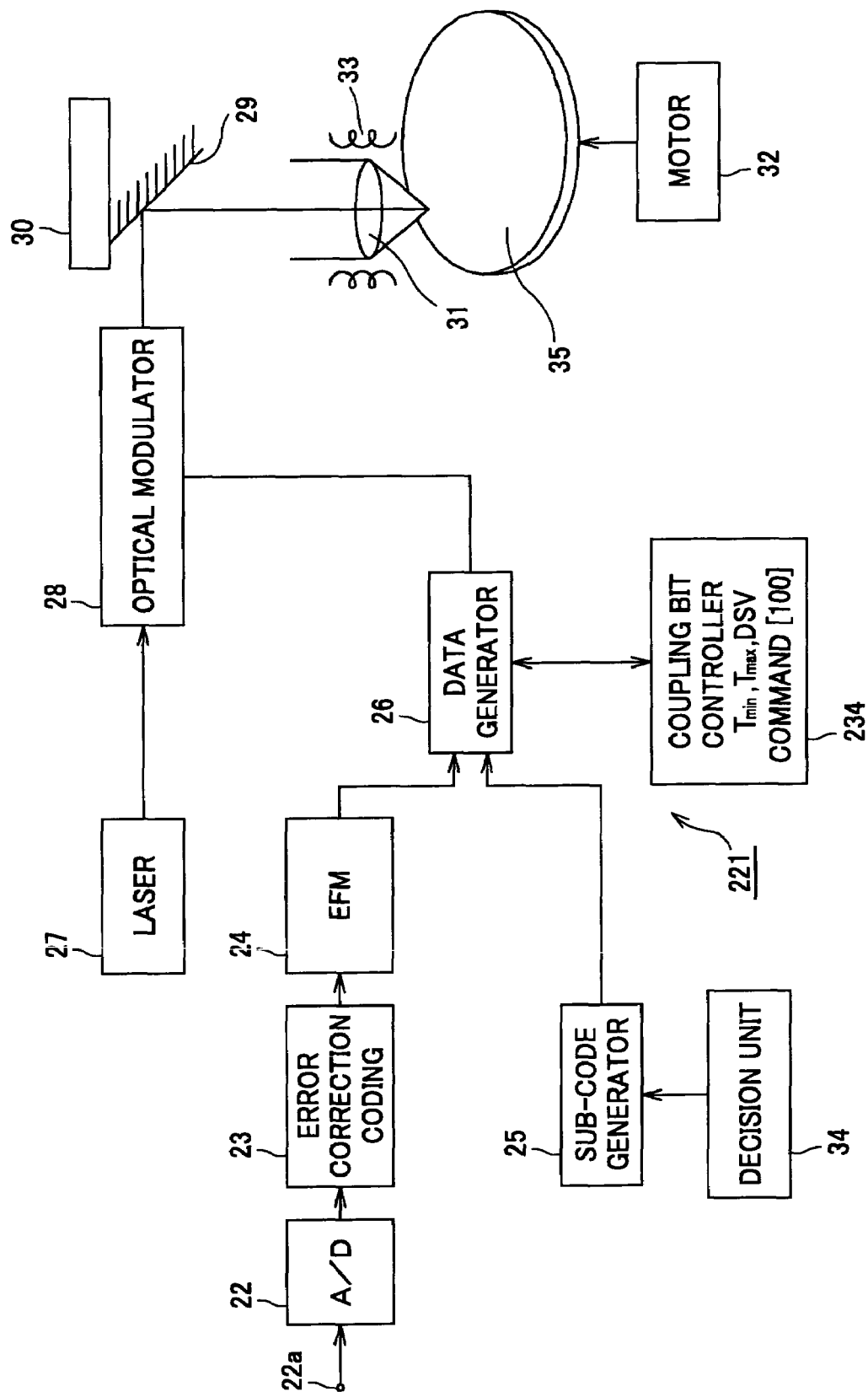
FIG. 28 is a block diagram showing still another cutting device for producing a stamper.

The master disc, used for manufacturing this optical disc, is prepared using a cutting device 221 configured as shown in FIG. 28. This cutting device 221 has a basic structure in common with the cutting device 21 and hence the portions common to those of the apparatus shown in FIG. 6 are depicted with the common reference numerals. The cutting device 221 includes a coupling bit controller 234 in addition to the components shown in FIG. 6.

The cutting device 221, shown in FIG. 28, also includes a laser source 27, such as a gas laser, for example, an argon laser or He—Cd laser, an optical modulator 28 for modulating the laser light based on data from the data modulator 26 by, for example, an EOM (Electrical Optical Modulator) exploiting the Pockels effect, or an AOM (Acoustic-Optical Modulator) exploiting ultrasonic waves, a mirror 29 for reflecting the modulated laser light, a movable mechanism 30 for moving the mirror 29, an objective lens 31 for collecting the laser light for illuminating a glass master disc 35, a spindle motor 32 for rotating the glass master disc 35, and an objective lens driving mechanism 33 for driving the objective lens 31 in the focusing direction which is the direction of the optical axis of the objective lens 31.

The error correction encoding circuit 23 encodes e.g., by sampling analog contents into samples and encoding the resulting samples by the combination of the cross-interleaving and the order four cross-interleaved Reed-Solomon codes (CIRC), using the algorithm of the cross-interleaved Reed-Solomon codes (CIRC), to output the resulting encoded data to the modulation circuit 24.

The modulation circuit 24 modulates the encoded output of the error correction encoding circuit 23 in accordance with the EFM algorithm to output the resulting modulated data to the data generator 26. Specifically, the modulation circuit 24 transforms a 8-bit sequence into a 14-bit recording code sequence, with the minimum run length Tmin(minimum length between transitions) being 2 and the maximum run length Tmax (maximum length between transitions) being 10.

The sub-code generator 25 generates sub-codes, such as the address information, responsive to the data for recording, and transforms the so generated sub-codes from a 8-bit data sequence into a 14-bit recording code sequence by EFM. The sub-code generator 25 generates data bits of an 8-bit sequence in the EFM conversion table shown in FIGS. 7 and 8, as sub-codes for an area for recording the discrimination data, and converts the data bits to a 14-bit recording code sequence.

Specifically, the sub-code generator 25 generates, as the sub-codes for the area for recording the discrimination data, data bits of the 8-bit sequence, obtained on demodulating the as-modulated 14-bit recording code sequence, having recorded the discrimination data, in which the second bit from the leading bit, that is the sub-code Q channel in the 8-bit sequence data bits, is complemented from [1] to [0], and in which the third bit from the leading bit to the trailing bit, that is the sub-code R to W channels, are of the same bit. This data is selected to satisfy the condition that, when the reflective film is fused to form a simulated pit by illuminating the light beam to the land between the pits in the 14-bit pattern resulting from the EFM, the newly formed pit length will satisfy the modulation rule of EFM which states that the maximum length between transitions Tmax and the minimum length between transitions Tmin shall be 10 and 2, respectively.

The sub-code generator 25 selects the 68th 0X44h [01000100] in the decimal notation of the EFM conversion table, as the sub-code of an area in which to record the discrimination data, as shown for example in FIG. 9C. The reason is that 0X44h on EFM gives a 14-bit pattern [01000100100100] and that, if the second land L of the pattern modulated with NRZI is irradiated with a light beam to fuse the reflective film to form a simulated pit, a 14-bit pattern [01000100000000] which on demodulation gives the same pattern as the fourth 0X04h [00000100] except the upper second bit Q channel.

The sub-code generator 25 selects the 71st 0X47h [01000111] in the decimal notation of the EFM conversion table, as the sub-code of an area in which to record the discrimination data, as shown for example in FIG. 9D. The reason is that 0X47h on EFM gives a 14-bit pattern [00100100100100] and that, if the second land L of the pattern modulated with NRZI is irradiated with a light beam to fuse the reflective film to form a simulated pit, a 14-bit pattern [00100100000000] which on demodulation gives the same pattern as the seventh 0X07h [00000111] except the upper second bit Q channel.

The sub-code generator 25 generates the above sub-code, as a sub-code for an area in which to record the discrimination data, converts a preset land into a pit to complement the Q-channel of the 8-bit sequence from [1] to [0] depending on the data to be recorded to record discrimination data. By setting the channels R to W so as to be fixed before and after the recording of the discrimination data, the recording and/or reproducing apparatus is able to detect the area where the discrimination data is to be or has been recorded.

Referring to FIG. 28, the data generator 26 is supplied from the modulation circuit 24 with the recording data modulated with EFM, while being supplied from the sub-code generator 25 with the sub-codes. The data generator 26 inserts coupling bits, input from the coupling bit controller 234, in-between 14-bit blocks of the recording code sequences. The data generator 26 generates data shown in FIG. 4, with the recording code sequences each being 17 bits, and outputs the so generated data to the optical modulator 28.

The coupling bit controller 234 generates 3-bit coupling bits, inserted inbetween the 14-bit blocks of the recording code sequences. The coupling bit controller 234 references two consecutive blocks of the recording code sequences, except the coupling bits next following the sub-coding of the discrimination data recording area, and selects, from among [000], [100], [010] and [001], such coupling bits which will satisfy the EFM conversion rule of the maximum length between transitions Tmax=10 and the minimum length between transitions Tmin=2 and which will reduce the absolute value of the DSV (digital sum value) to reduce the low frequency components further. The coupling bit controller outputs the so selected coupling bits to the data generator 26.

When selecting the coupling bits next following the sub-coding of the discrimination data recording area, the coupling bit controller 234 selects, from the above-mentioned combination of the four coupling bits, such coupling bits which will satisfy the EFM conversion rule of the maximum length between transitions Tmax=10 and the minimum length between transitions Tmin=2, and in which the preset bit is always the land. Specifically, the coupling bit controller selects the coupling bit pattern from the above-mentioned coupling bits excluding [000], that is from [100], [010] and [001], so that the selected coupling bits will give an optimum DSV. The reason is that the maximum length of [0]s of the former part of the recording code sequence is 8, while the number of [0]s of the latter part of the fourth 0X04h of FIG. 9C or the seventh 0X07h of FIG. 9D is 8, so that, if the coupling bits [000] are used, the maximum length between transitions Tmax of 10 is exceeded.

It is also possible for the coupling bit controller 234 to select [100] at all times as the coupling bits next following the sub-coding of the recording area of the discrimination data. The reason is that, in the EFM conversion table, shown in FIGS. 7 and 8, the maximum number of [0]s in the former portion of the recording code sequences is 8, so that, if [100] is used as the coupling bits, the number of 0s is 10 at the maximum, thus satisfying the conditions of the maximum length between transitions Tmax at all times. That is, the coupling bit controller 234 selects the coupling bit at least having [1] as the coupling bits next following the sub-coding of the recording area of the discrimination data. The reason is that, since the recording data is recorded with NRZI and inverted with [1], the maximum length between transitions Tmax of 10 between the sub-coding block and the succeeding block is not exceeded by employing the coupling bits, including [1], between the sub-coding block and the succeeding block.

Figure 29:
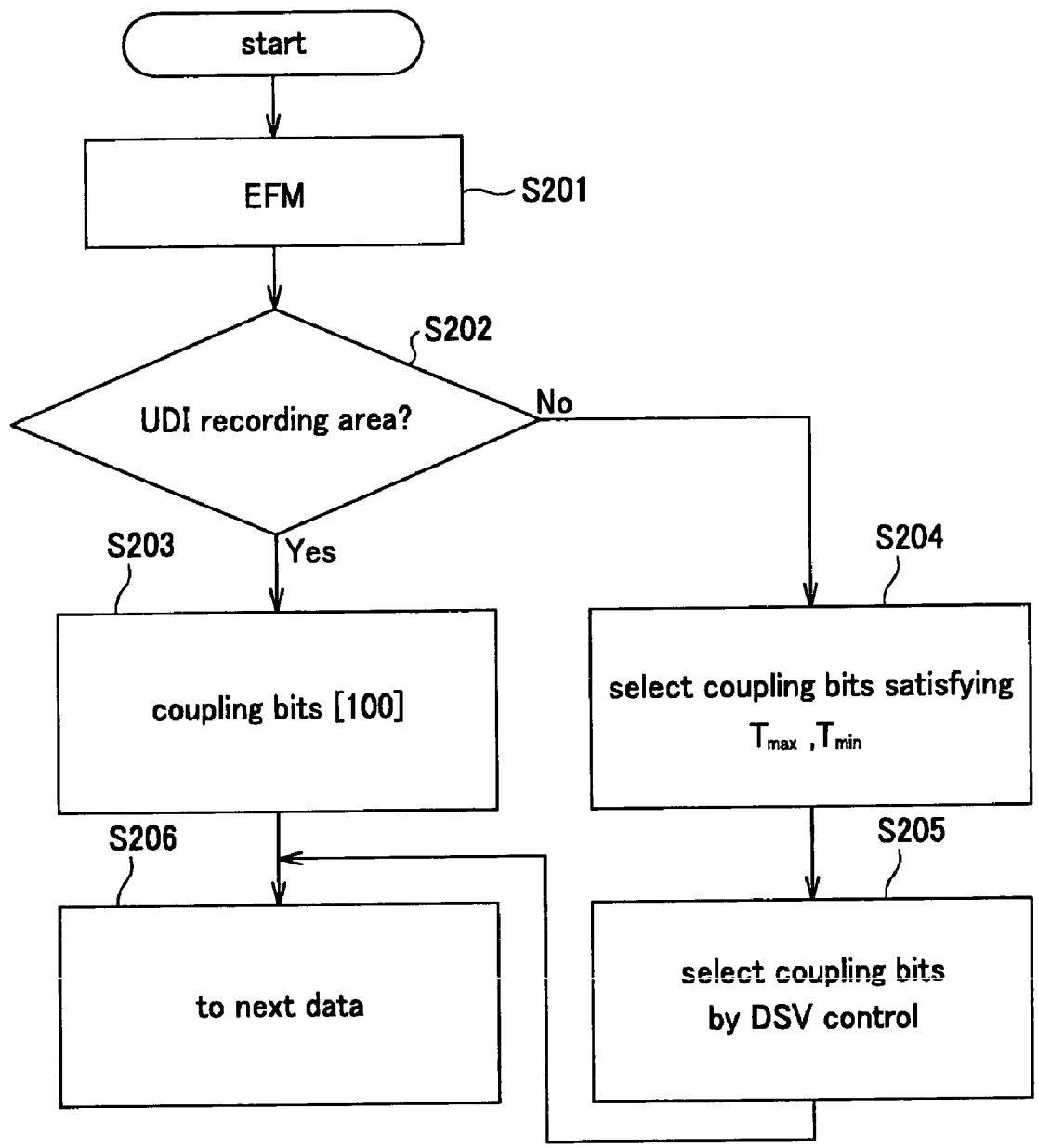
FIG. 29 is a flowchart for illustrating the sequence of selecting a coupling bit.

The operation of the above-described cutting device 221 is now explained with reference to FIG. 29. When the sampled data for recording is input via input terminal 22a to the A/D converter 22, the A/D converter 22 converts the data from analog signals to digital signals to output the resulting digital signals to the error correction encoding circuit 23. The error correction encoding circuit 23 encodes the samples with the combination of the cross-interleaving and the order four Reed-Solomon codes to output the resulting data to the modulation circuit 24. In a step S201, the modulation circuit 24 modulates the data with EFM. That is, the modulation circuit 24 converts the data for recording from 8 bits to 14 bits, based on the EFM conversion table shown in FIGS. 7 and 8, to output the resulting data to the data generator 26.

In a step S202, the cutting device 221 determines whether or not the area under consideration is the area for recording the discriminating data. If the area in question is the area for recording discrimination data, the cutting device 221 proceeds to a step S203. If the area in question is not the area for recording discrimination data, that is, if the area in question is the area for recording e.g., contents data with the usual mode, the cutting device 221 proceeds to a step S204.

In the step S203, the coupling bit controller 234 always selects [100] as the coupling bits next following the sub-coding of the recording area for the discrimination data, and outputs the data to the data generator 26. Meanwhile, the coupling bit controller 234 may select a pattern other than [000], that is one of [100], [010] and [001], which will give an optimum DSV, as the coupling bits.

If the area in question is not the area in which to record the discrimination area, the coupling bit controller 234 in a step S204 references 14-bit data of the neighboring block to select the coupling bits, which will satisfy the EFM conversion rule of the maximum length between transitions Tmax=10 and the minimum length between transitions Tmin=2, from [000], [100], [010] and [001]. In the step S205, the coupling bit controller 234 selects, from the coupling bits selected in the step S204, the coupling bits which will optimize the DSV, and outputs the so selected coupling bits to the data generator 26.

In a step S206, the coupling bit controller 234 performs the processing for the next data, that is the processing as from the step S202.

When supplied with data from the modulation circuit 24, the data generator 26 sums these data and inserts 3-bit coupling bits in-between the 14-bit blocks to generate recording data, which recording data is modulated with NRZI and output to the optical modulator 28.

The laser source 27 radiates the laser light which then is input to the optical modulator 28. The optical modulator 28 modulates the laser light based on the input from the data generator 26. That is, when [1] is input from the data generator 26, the optical modulator 28 modulates the laser light. The laser light modulated by the optical modulator 28 is incident on the mirror 29. This mirror 29 is moved by the movable mechanism 30 for scanning the laser light across the inner and outer rims of the glass master disc 35. The laser light is converged by the objective lens 31 so as to be illuminated on the glass master disc 35, which is run in rotation at CLV (constant linear velocity) by the spindle motor 32 as the rotational driving unit. The objective lens 31 is displaced along the optical axis of the laser light by the objective lens driving mechanism 33 by way of performing focusing control.

The above exposes the master disc 35 to light. In the optical disc 1, to which has been transcribed the pattern of the master disc 35, the 14-bit recording code sequences, such as 0X44h shown in FIG. 9C or 0X47h, shown in FIG. 9D, are recorded in the recordable area for recording the discrimination data, whereby data are recorded so that at least the area of the payload and the error correction code, shown in FIG. 14, is all [1].

Figure 30:
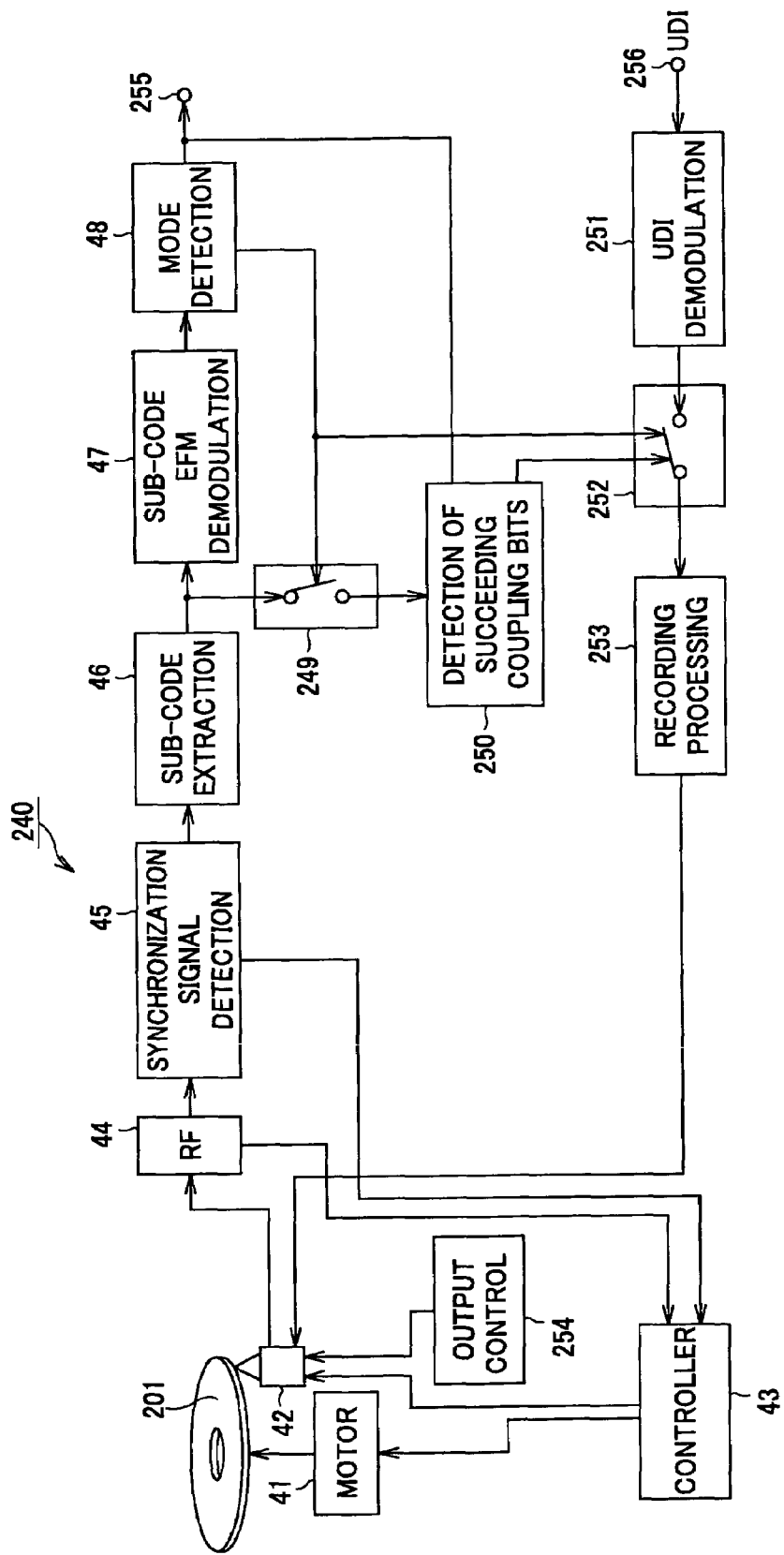
FIG. 30 is a block diagram showing still another recording apparatus for discrimination data.

Referring to FIG. 30, a data recording apparatus 240 for recording discrimination data on an optical disc used in the discrimination data recording step is now explained.

Similarly to the data recording apparatus 40, 140, this data recording apparatus 240 includes a spindle motor 41, for rotationally driving the optical disc 201, embodying the present invention, an optical pickup 42 for radiating a light beam to the optical disc 1 and for detecting the reflected return beam, a controller 43 for exercising focusing servo control and tracking servo control of the objective lens of the optical pickup 42 and for controlling the rotation of the spindle motor 41, an RF amplifier 44 for generating e.g., RF signals from a detection output of the optical pickup 42a, a synchronization signal detection unit 45 for detecting the synchronization signal from the RF signal and for generating clocks, a sub-code extraction unit 46 for extracting sub-codes from the RF signals, a sub-code demodulating unit 47 for demodulating EFM modulated 14-bit sub-codes to 8 bits for generating sub-codes for P to W channels, and a detection unit 48 for detecting sub-codes of the R to W channels. This structure is common to that of the above-described data recording apparatus 40, 140 and hence same reference numerals are used to depict the common components, while the explanation for the detailed structure is omitted for simplicity.

The data recording apparatus 240 includes a first switching unit 249 for changing over to the discrimination data recording mode, a coupling bit detection unit 250 for detecting the coupling bits next following the sub-coding, a modulator 251 for modulating the discrimination data, a second switching unit 252 for changing over the input of the discrimination data recorded on the optical disc 1, a recording processor 253 for performing recording processing in recording the discrimination data on the optical disc 201 and an output controller 254 for controlling the outputting of the light beam radiated by the optical pickup 42.

In the present data recording apparatus 240, the sub-code extraction unit 46 extracts, from the data input from the RF amplifier 44, the 14-bit sub-coding, provided next to the frame synchronization signals, and outputs the so extracted sub-coding to the sub-code demodulating unit 47 for specifying the recording area for the discrimination data, while outputting the extracted sub-coding data to the coupling bit detecting unit 250 through the first switching unit 249 for detecting the succeeding bits of the sub-coding.

The sub-code demodulating unit 47 converts the sub-code of the area where the discrimination data has been recorded, from the 14-bit data to the 8-bit data, based on the EFM conversion table. The sub-code demodulating unit 47 forms one block with 98 frames, and generates the sub-codes of P, Q, R, S, T, U, V and W channels. That is, the sub-code demodulating unit 47 generates P1-W1 to P96-W96, that is 96 bit sub-codes. The sub-code demodulating unit 47 outputs e.g., the address information, extracted from the sub-codes, to the controller 43. This allows the controller 43 to cause the optical pickup 42 to access the recording area for the discrimination data.

The detection unit 48 detects data specifying whether or not the mode is that for recording the discrimination data. That is, the detection unit 48 detects data specifying whether or not the mode is that for recording discrimination data with the Q channel ADR.

If the mode is not that for recording discrimination data, the detection unit 48 outputs e.g., an error message at an output terminal 255 to enable the monitor to display the error message. If the mode is that for recording discrimination data, the detection unit 48 outputs a message intimating this at an output terminal 255 for display e.g., on a monitor. The detection unit 48 turns on the first and second switching units 249, 252 only when the mode is that for recording the discrimination data.

The coupling bit detection unit 250 checks whether or not the succeeding coupling bit of the sub-coding of the area for recording the discrimination data is of a preset value, for example, the aforementioned [100]. Of course, the coupling bit detection unit 250 may check whether the coupling bit is different than [000], that is whether or not the coupling rod has [1]. The reason is that, if the coupling bit is other than the bit of a predetermined value, and the discrimination data is recorded, Tmax may exceed 10, thus violating the EFM conversion rule. If the coupling bit next following the sub-coding is or is not of a preset value, the coupling bit detection unit 250 turns the second switching unit 252 on or off, respectively. That is, if the coupling bit next following the sub-coding is not of a preset value, the second switching unit 252 inhibits the discrimination data from being input from the modulating unit 251 to the recording processor 253. When the coupling bits are not of preset values, the coupling bit detection unit 250 outputs an error message from the output terminal 255 for display on a monitor for intimation to the user.

The modulating unit 251 modulates the discrimination data, input from the input terminal 256, in accordance with a preset modulation system, to output the modulated data via second switching unit 252 to the recording processor 253. The recording processor 253 performs recording processing necessary for recording on the optical disc 1 and outputs the so processed data to the optical pickup 42. Meanwhile, the data input from an input terminal 256 is data shown in FIG. 4.

Figure 31:
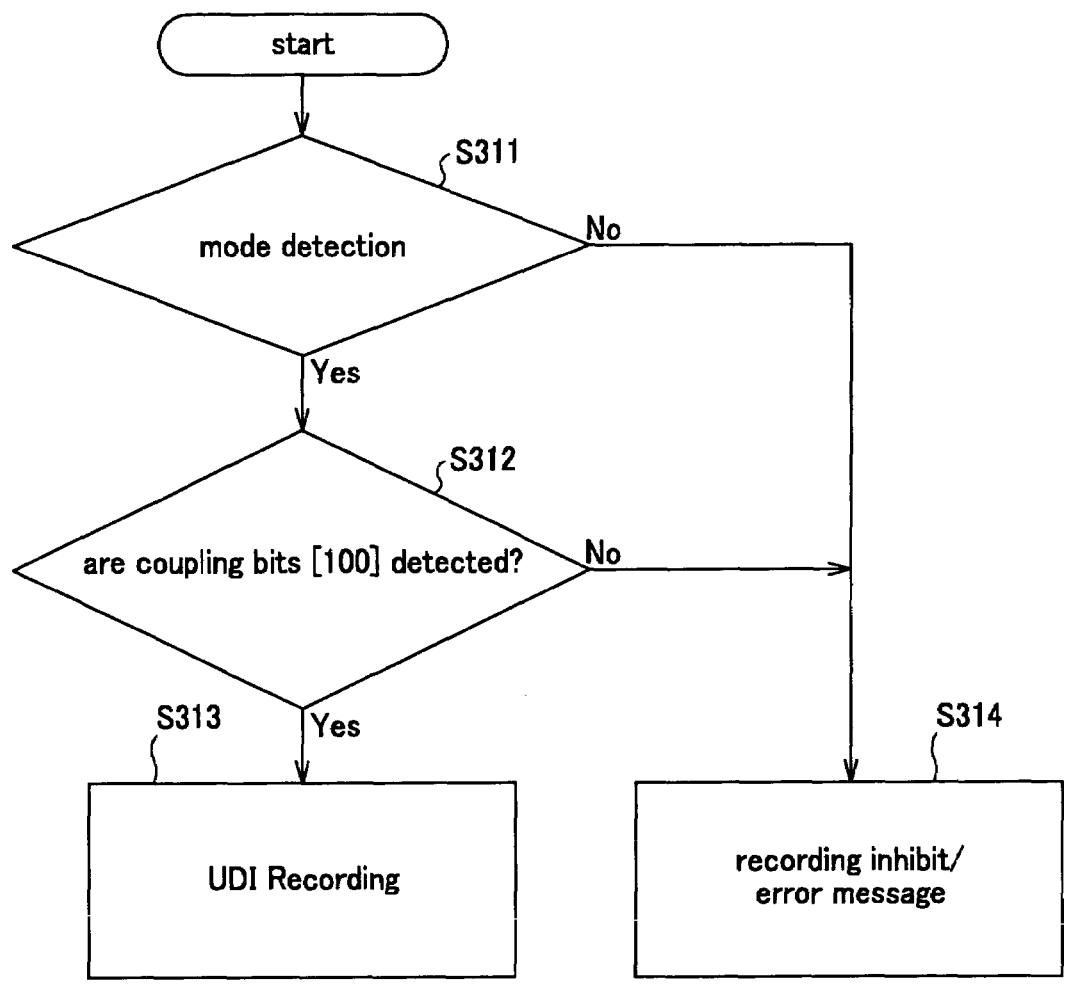
FIG. 31 is a flowchart for illustrating the operation of recording discrimination data on an optical disc in a data recording apparatus.

Referring to FIG. 31, the operation of recording the discrimination data by the above-described data recording apparatus 240 is now explained.

First, when a user has pressed a discrimination data recording button, the data recording apparatus 240 actuates the spindle motor 41 to cause the rotation of the optical disc, loaded on the disc table, forming the disc loading unit, at a constant linear velocity. Simultaneously, the optical pickup 42 illuminates a light beam on the optical disc 101. It is noted that an output controller 254 controls the semiconductor laser of the optical pickup 42 to output the light beam at a standard output. The optical pickup 42 initiates data readout as focusing servo and tracking servo operations are performed under control by the controller 43.

The data recording apparatus 240 causes the optical pickup 42 to effect track jump to the recordable area for the discrimination data, for recording the discrimination data in the preset area, based on e.g., the TOC of the sub-codes demodulated by the sub-code demodulating unit 47. The data recording apparatus 240 causes the sub-code extraction unit 46 to extract the sub-codes of the recordable area of the discrimination data and causes the sub-code demodulating unit 47 to demodulate the so extracted data to output the 8-bit data to the detection unit 48. In a step S311, the detection unit 48 checks, using the discrimination data in the ADR of the sub-code of the Q channel, whether or not the area in question is the area for recording the discrimination data. If it is determined that the area in question is the area for recording the discrimination data, the detection unit 48 turns the first and second switching units 249, 252 on to proceed to step S312. If it is determined that the area in question is not the area for recording the discrimination data, the detection unit 48 turns the first and second switching units 249, 252 off to proceed to step S214.

The detection unit 48 may also specify an area, in which to record the discrimination data, and set the apparatus to the discrimination data recording mode, by detecting whether or not the sub-codes of the R to W channels are of fixed values. The detection unit 48 may also specify whether or not the recording position is the land, or by the combination of the two methods.

In the step S312, the coupling bit detection unit 250 verifies whether or not, in the discrimination data recording area, whether or not the succeeding coupling bits of the sub-coding are the aforementioned [100]. Of course, the coupling bit detection unit 250 may verify whether or not the coupling bits are different from [000], that is whether or not the coupling bit includes [1]. When the coupling bits are of a preset value, the coupling bit detection unit 250 turns on the second switching unit 252 on to proceed to step S313 to enable the recording processing of the discrimination data. When the coupling bits are not of a preset value, the coupling bit detection unit 250 turns off the second switching unit 252 on to proceed to step S314 to disable the recording processing of the discrimination data. That is, when the mode is that of recording discrimination data, but the coupling bits are not of a preset value, and the discrimination data is recorded, Tmax may exceed 10 to give rise to the risk of violating the EFM conversion rule, so that, in this step S314, the second switching unit 252 is turned off even though the first switching unit 249 is on.

In, in the step S313, the discrimination data is input from the input terminal 256, the modulating unit 251 modulates the discrimination data in accordance with a preset system.

The modulating unit 251 outputs modulated discrimination data to the recording processor 253 through the second switching unit 252. The recording processor 253 outputs the modulated discrimination data to the optical pickup 42. For thermally recording the discrimination data by dissolving the reflective film, the output controller 254 changes over the output of the semiconductor laser from the standard level to the high level. The data recording apparatus 240 forms a simulated pit in the land to record data in 84 bits of the recording area of the Q channel sub-code, shown in FIG. 4, that is from the fourth bit from the trailing end of the UDI index to the CRC. Specifically, the data recording apparatus 240 records e.g., the recordable time and the pre-recorded time in the four bits from the trailing end of the UDI index and records the discrimination data in the 56-bit UDI payload, while recording the address information, such as the frame numbers, in the 8-bit AFRAME and recording the error correction code in the 16-bit CRC.

If the mode is not that of recording the discrimination data, the detection unit 48 in a step S314 outputs e.g., an error message at an output terminal 255 to cause the error message to be displayed on a monitor. At this time, the detection unit 48 turns the first and second switching units 249, 252 off to inhibit the recording of the discrimination data. When the coupling bits are not of preset values, the coupling bit detection unit 250 outputs an error message from the output terminal 255 for display on a monitor for intimation to the user. The coupling bit detection unit 250 turns the second switching unit 252 off to inhibit the recording processing for discrimination data.

The method for recording these data is now explained with reference to FIG. 32. Meanwhile, the embodiment shown in this figure changes 0X47h shown in FIG. 4D to 0X07h. Before recording the discrimination data, the pattern A is such that, as shown in (A) of FIG. 32, there are recorded 24 bits of frame synchronization signals, followed by coupling bits of [000], followed by a sub-code of [00100100100100] (0X47h) followed in turn by coupling bits [100]. On the optical disc 1, there are recorded a 11T long pit P1, followed by a 11T long land L1, followed by a 7T long pits P2, followed by a 3T long land L2, followed by 7T long pit P3, followed by a 3T long land L3, followed by a 3T long pit P4 and finally followed by 3T to 11T land Las coupling bits. The data recording apparatus 240 illuminates a light beam of a high output from the pit P3 to the pit P4 to fuse the reflective film to effect thermal recording to form a simulated pit consecutive to the pits P3 and P4 to give a post-recording pattern A shown in (B)of FIG. 32. Meanwhile, the light beam may locally illuminate the land L3. Thus, in the post-recording pattern A, there is recorded a pattern [00100100000000] (0X07h) in the sub-code area. That is, on the optical disc 1, there are recorded a 11T long pit P11, followed by a 11T long land L11, followed by a 7T long pit P12, followed by a 3T long land L12, followed by a 9T long pit P13, and finally followed by 3T to 11T long land L13, as coupling bits. That is, the land LA (L13) has a length of the pit 13 not longer than 11T so that 11T is not exceeded when the pit 13 and the former portion of the channel bits of the succeeding block are taken together, in order to avoid violation of the EFM conversion rule.

Turning to the case in which the pattern of the frame synchronization signals is the reverse of the above pattern, a pattern B prior to the recording of the discrimination data begins with 24-bit frame synchronization signals, followed by coupling bits [001], followed by a sub-code [00100100100100] (0X47h)and followed by coupling bits of [100]. On the optical disc 201, there are recorded a 11T long land L21, followed by a 11T long pit P21, followed by a 4T land L22, followed by a 3T pit P22, followed by a 3T land L23, followed by a 3T pit P23, followed by a 3T land L24, followed by a 3T pit P24, and finally followed by a 3T to 11T land L25 as coupling bits. The data recording apparatus 240 illuminates a light beam of a high output from the pit P3 to the pit P4 to fuse the reflective film to effect thermal recording to form a simulated pit consecutive to the pits P23 and P24 to give a post-recording pattern B shown in (D) of FIG. 32. Thus, in the post-recording pattern B, there is recorded a pattern [00100100000000] (0X07h) in the sub-code area. That is, on the optical disc 201, there are recorded a 11T long land L31, followed by a 11T long pit P31, followed by a 4T long land L32, followed by a 3T pit P32, followed by a 3T land L33, followed by a 9T pit p33, and finally followed by 3T to T11 land L34 as coupling bits. That is, the land L25 (L34) has a length of the pit 33 not longer than 11T so that 11T is not exceeded when the pit 33 and the former portion of the channel bits of the succeeding block are taken together, in order to avoid violation of the EFM conversion rule.

Thus, the data recording apparatus 240 forms a pattern of pits and lands, corresponding to the discrimination data, by the on/off of the high output light beam, thereby recording the discrimination data in the Q channel sub-code.

By the above method, the recording area for the discrimination data is specified, using the coupling bits next following the sub-coding in the sub-codes, to record the discrimination data in the so specified area.

Figure 33:
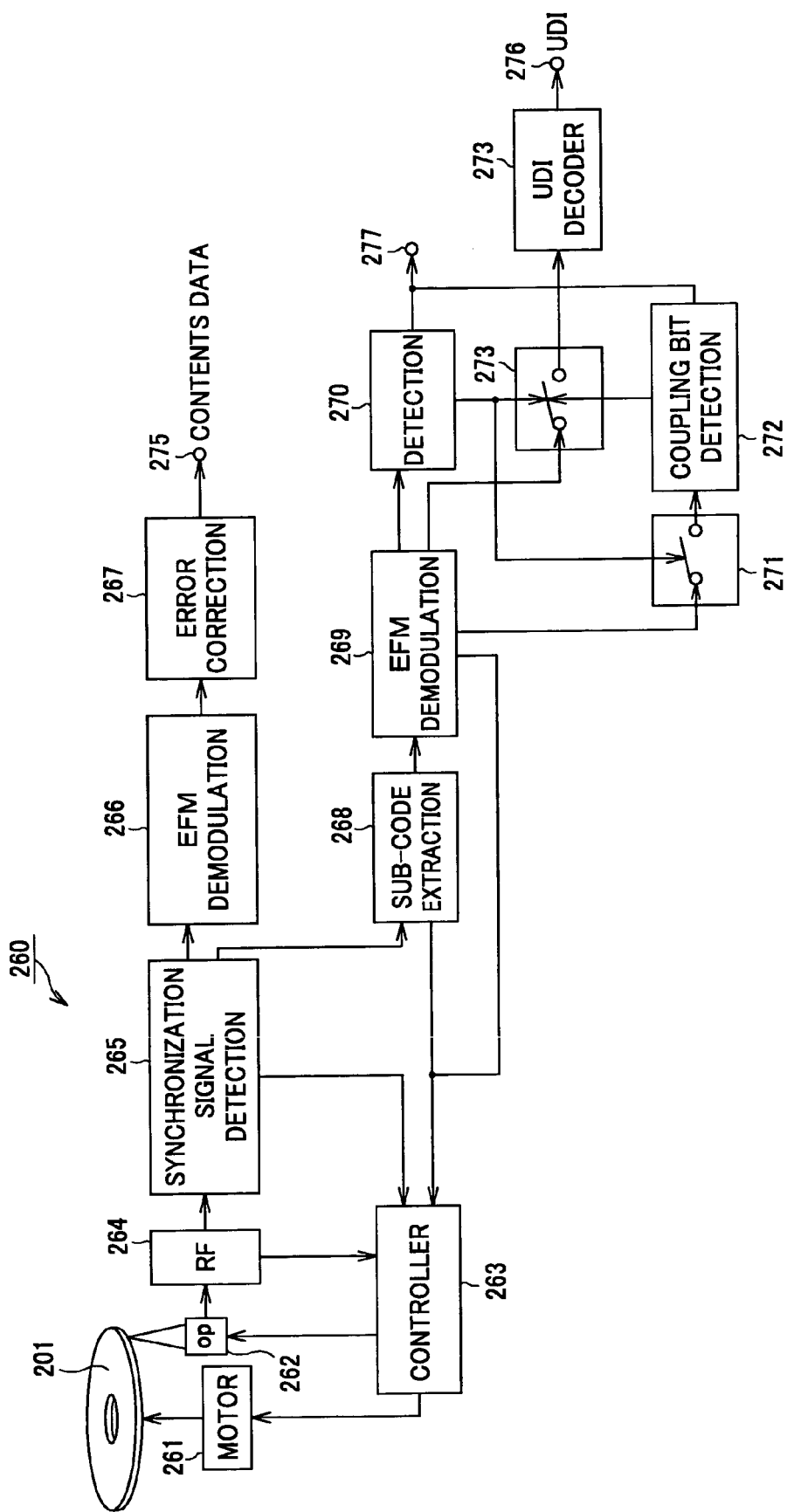
FIG. 33 is a block diagram showing still another data reproducing apparatus used for reproducing the optical disc embodying the present invention.

Referring to FIG. 33, a data reproducing apparatus 260 for reproducing the optical disc 201, on which the discrimination has been recorded by the above-described data recording apparatus 240, is now explained. The data reproducing apparatus 260 includes a spindle motor 261, adapted for rotating the optical disc 201, having the discrimination data recorded thereon, an optical pickup 262 for radiating a light beam to the optical disc 201 and for detecting the reflected return light beam, a controller 263 for effecting focusing servo control and tracking servo control of the objective lens optical pickup 262 and for effecting rotational servo control of the spindle motor 261, an RF amplifier 264 for generating RF signals from an output of the optical pickup 262, a synchronization signal detection unit 265 for detecting synchronization signals from the RF signals for generating clocks, a demodulating unit 266 for demodulating recording data, such as contents data, modulated by EFM, and an error correction unit 267 for correcting errors of the demodulated data.

The data reproducing apparatus 260 includes a sub-code extraction unit 268 for extracting sub-codes from the RF signals, a sub-code demodulating unit 269 for demodulating the 14-bit sub-codes, modulated by EFM, into 8 bits to generate sub-codes of the R to W channels, a detection unit 270 for detecting sub-codes of the P to W channels, a switching unit 271 for switching the discrimination data recorded on the optical disc 201, a coupling bit detection unit 272 for detecting the coupling bits next following the sub-coding, a second switching unit 273 for switching the inputting of the discrimination data recorded on the optical disc 1, and a decoder 274 for decoding the discrimination data.

The spindle motor 261 rotationally drives the optical disc 201 as the optical disc 210 is centered with respect to the disc, and is mounted in this state on the disc table, as on the disc table of the above-described respective data reproducing apparatus.

The optical pickup 262 condenses the light beam, radiated from the semiconductor laser, by the objective lens, to illuminate the light beam on the signal recording surface of the optical disc, as in the above-described respective data reproducing apparatus. The optical pickup 262 detects the return light beam, reflected back from the signal recording surface of the optical disc 1, by a photodetector, and converts the detection signal into electrical signals, which are then output to the RF amplifier 264.

The RF amplifier 264 generates RF signals, focusing error signals and tracking error signals, based on the output signal of the photodetector forming the optical pickup 262. For example, the focusing error signals are generated by e.g., an astigmatic method, while the tracking error signals are generated by a three-beam method, or a push-pull method. The RF amplifier 264 outputs the RF signals to the demodulating unit 266 for demodulating the EFM modulated data, while outputting the focusing error signals and the tracking error signals to the servo controller 263.

The synchronization signal detection unit 265 detects the frame synchronization signals, shown in FIG. 1, from the RF signals, while detecting the synchronization signals, used in decoding the sub-codes shown in FIGS. 2 and 3. The synchronization signal detection unit 265 generates clocks based on the detected synchronization signals.

The controller 263 generates the focusing servo signals and the tracking servo signals, based on the focusing error signals and the tracking error signals, input from the RF amplifier 264, to output the so generated signals to a driving circuit for the objective lens driving mechanism of the optical pickup 262. Thus, the objective lens, held by the objective lens driving mechanism, is displaced, based on the focusing servo signals and the tracking servo signals, in the focusing direction parallel to the optical axis of the objective lens and in the tracking direction perpendicular to the optical axis of the objective lens. The controller 263 also generates rotational servo signals, so that the clocks generated from the synchronization signals will be synchronized in frequency and phase with the reference clocks from the quartz oscillator. The spindle motor 261 accordingly causes rotation of the optical disc at for example the CLV.

The demodulating unit 266 demodulates recording data, such as contents data, in accordance with the EFM algorithm. Specifically, the demodulating unit 266 converts the 14-bit recording code sequence into 8-bit data bits, in accordance with the EFM conversion table shown in FIGS. 8 and 9. The error correction unit 267 demodulates the modulated recording data in accordance with an algorithm, such as CIRC, to output the demodulated data to an output terminal 275. For example, if the recording data is audio data, the audio data, output at the output terminal 275, is converted by the D/A converter from digital signals to analog signals, and output via an acoustic transducer, such as a loudspeaker, an earphone or a headphone.

The sub-code extraction unit 268 extracts the 14-bit sub-coding, provided next to the frame synchronization signals, from data input from the RF amplifier 264, to output the so extracted sub-coding to the sub-code demodulating unit 269. The sub-code demodulating unit 269 converts the 14-bit data into 8-bit data based on the EFM conversion table. The sub-code demodulating unit 269 forms one block with 98 frames, to generate sub-codes of P, Q, R, S, T, U, V and W channels. That is, the sub-code demodulating unit 269 generates from P1-W1 to P96-W96, that is 96 bit sub-codes.

The detection unit 270 detects the mode for reproducing the discrimination data. That is, the detection unit 270 detects, from the Q channel ADR, whether or not the mode is that of reproducing the discrimination data. On detecting the discrimination data specifying the discrimination data reproducing mode, the detection unit 270 turns on the first and second switching units 271, 273. On failure in detecting the discrimination data specifying the discrimination data reproducing mode, the detection unit 270 assumes that the area under consideration is not the recording area for the discrimination data and turns off the When the first and second switching units 271, 273. If the mode is not the discrimination data recording mode, the detection unit 270 outputs e.g., an error message at an output terminal 277 to enable this error message to be displayed on the monitor. When the mode is that of recording the discrimination data, the detection unit 270 outputs a message intimating this for display on the monitor.

The coupling bit detection unit 272 checks whether or not the coupling bits next following the sub-coding of the area where the discrimination data has been recorded is of a preset value, for example, the aforementioned [100]. The coupling bit detection unit 272 may, of course, verify whether the coupling bits are different than the aforementioned [100], that is whether the coupling bits include [1]. The reason is that, if the coupling bits are of a value different than the preset value, Tmax may exceed 10 to violate the EFM conversion rule to render it impossible to demodulate the discrimination data, and that, if the coupling bits are of a value different than the preset value, the disk may not be an authorized one. If the coupling bits next following the sub-coding are of preset values, the coupling bit detection unit 272 turns on the second switching unit 273 and, if otherwise, the coupling bit detection unit 272 turns off the second switching unit 273. That is, when the coupling bits next following the sub-coding are not of preset values, the second switching unit 273 disables the inputting of the discrimination data to the decoder 274 from the sub-code demodulating unit 269. When the coupling bits are not of a preset value, the coupling bit detection unit 272 output an error message at the output terminal 277 for display on the monitor for intimation to the user.

The Q channel sub-codes are input to the decoder 274 from the sub-code demodulating unit 269 through the second switching unit 273. The decoder 274 references e.g., the pre-recorded time, recorded in the UDI index, to demodulate the discrimination data recorded in the UDI payload, while correcting the demodulated discrimination data using CRC for errors to output the resulting data at an output terminal 276.

Figure 34:
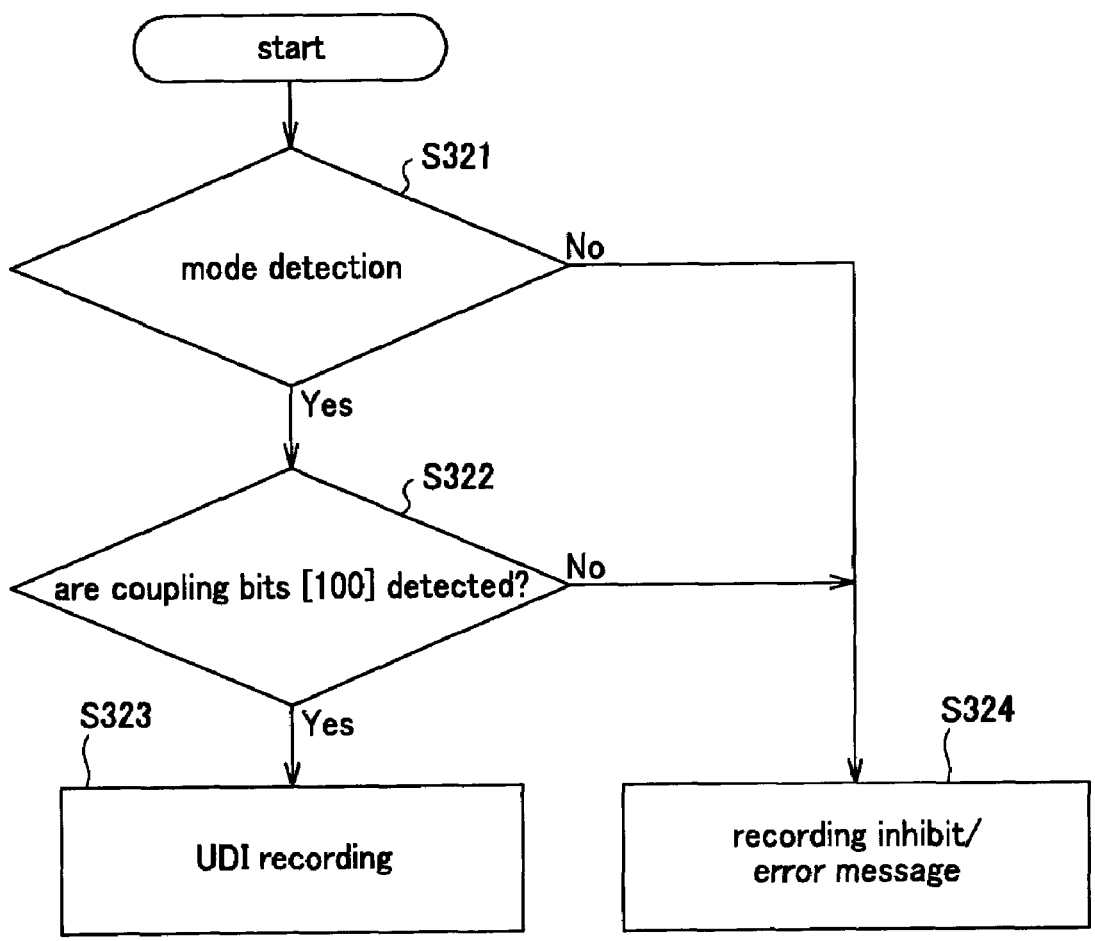
FIG. 34 is a flowchart for illustrating the reproduction controlling method employing Q channel sub-codes.

Referring to FIG. 34, the data readout operation of the above-described data reproducing apparatus 260 is now explained. First, when a user has pressed a replay button, the data reproducing apparatus 260 actuates a spindle motor 261 to cause rotation of the optical disc 201, loaded on the disc table, forming the disc loading unit, at a constant linear velocity. Simultaneously the optical pickup 262 illuminates the light beam on the optical disc 201. At this time, the semiconductor laser radiates the light beam with a standard output. The optical pickup 262 initiates data readout as focusing servo control and tracking servo control are exercised by the servo controller 263.

The data reproducing apparatus 260 effectuates track jump of the optical pickup 142, to the recordable area for the discrimination data, based on the sub-code TOC, demodulated by the sub-code demodulating unit 169, in order to reed out the discrimination data. The data reproducing apparatus 260 causes the sub-code extraction unit 268 to extract the sub-codes of the recordable area for the discrimination data and demodulates the so extracted data in the sub-code demodulating unit 269 to output the resulting 8-bit data to the detection unit 170. In a step S312, the detection unit 270 verifies, using the discrimination data in the ADR of the Q channel sub-code, whether or not the area in question is the area where the discrimination has been recorded. If it is determined that the area in question is the area where the discrimination data has been recorded, the detection unit 170 turns on the switching unit 171 to proceed to a step S322. If it is determined that the area in question is not the area where the discrimination data has been recorded, the detection unit 270 turns off the first and second switching units 271, 273 to proceed to a step S324.

Meanwhile, the detection unit 270 may detect whether or not the sub-codes for the R to W channels are of fixed values to set the apparatus to the replay mode for the discrimination data. The detection unit 48 may also specify whether or not the recording position is the land, or by the combination of the two methods.

In the step S322, the coupling bit detection unit 272 verifies whether or not, in the discrimination data recording area, the succeeding coupling bits of the sub-coding are the aforementioned [100]. Of course, the coupling bit detection unit 250 may verify whether or not the coupling bits are different from [000], that is whether or not the coupling bit includes [1]. When the coupling bits are of a preset value, the coupling bit detection unit 270 turns on the second switching unit 273 on to proceed to a step S323 to enable the recording processing of the discrimination data. When the coupling bits are not of a preset value, the coupling bit detection unit 270 turns off the second switching unit 273 on to proceed to a step S324 to disable the recording processing of the discrimination data. That is, when the mode is that of recording discrimination data, but the coupling bits are not of a preset value, Tmax may exceed 10 to give rise to the risk of violating the EFM conversion rule. Moreover, the disc may not be an authorized one. Thus, the second switching unit 275 is turned off even though the first switching unit 271 is on.

In the step S323, the data reproducing apparatus 260 outputs the discrimination data from the sub-code demodulating unit 269 through the switching unit 273 to the decoder 274. The decoder 274 demodulates the discrimination data to effect error correction to output the resulting data to the output terminal 276. The contents data, for example, recorded on the optical disc 201, are demodulated by the demodulating unit 266, then corrected for errors in the error correction unit 267, and then output at the output terminal 275. For example, if the contents data are e.g., audio data, the data are converted by the D/A converter from digital signals to analog signals, which analog signals are output via an acoustic transducer, such as a loudspeaker, earphone or a headphone.

If the mode is not that of reproducing the discrimination data, the detection unit 270 in a step S324 outputs e.g., an error message, at an output terminal 277, to enable this error message to be displayed on the monitor. At this time, the detection unit 270 turns off the first and second switching units 271, 273 to inhibit replay of the discrimination data. If the coupling bits are not of the preset value, the detection unit 270 outputs an error message at the output terminal 277 for display on the monitor for intimation to the user. The coupling bit detection unit 272 turns off the second switching unit 273 to disable replay of the discrimination data.

Figure 32:
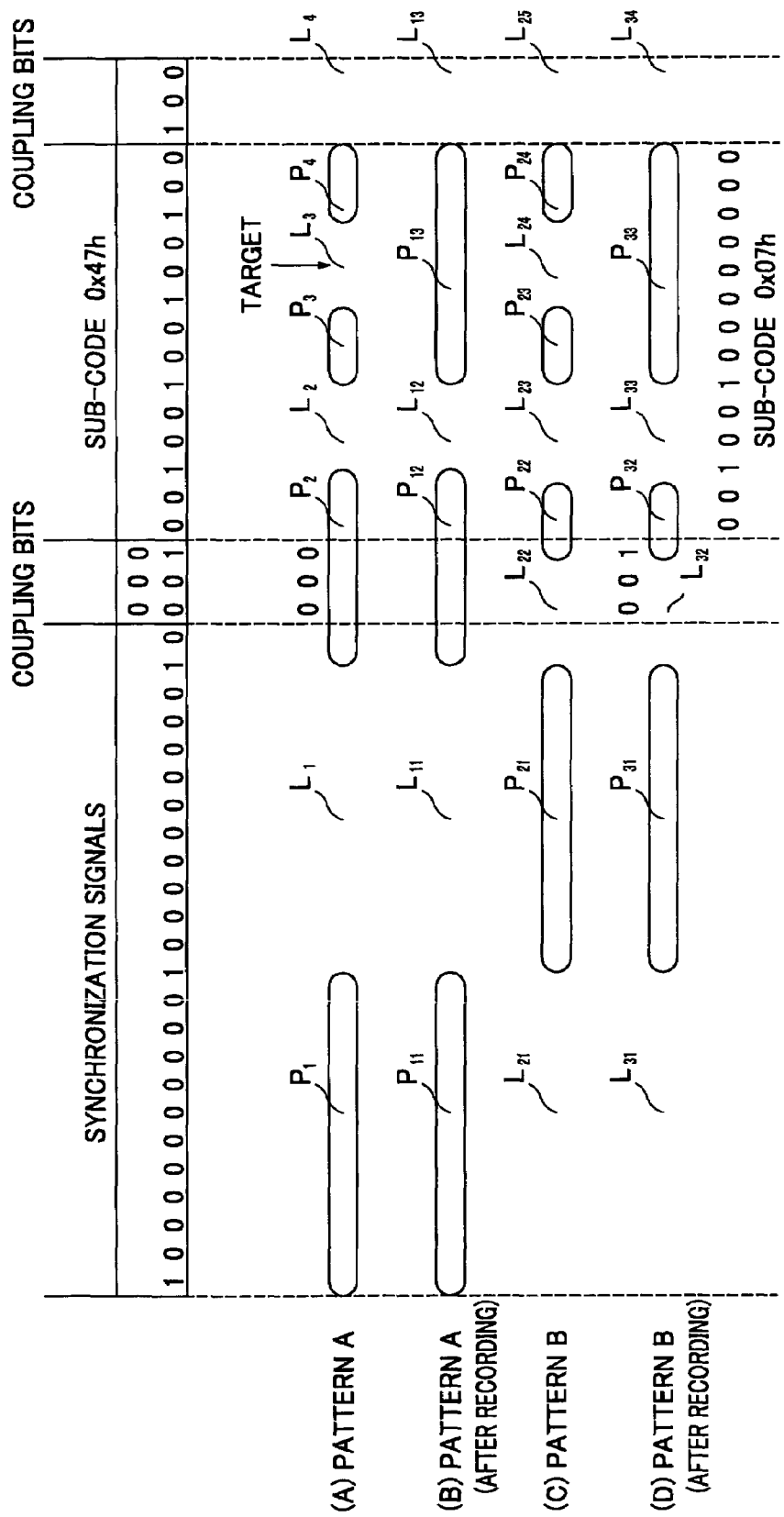
FIG. 32 illustrates a recording example of discrimination data for changing 0X47h to 0X07h.

In recording the discrimination data in the sub-coding shown in FIG. 1, in the optical disc 201, embodying the present invention, the discrimination data can be recorded, as the EFM conversion rule stating that the maximum length between transitions Tmax=10 is observed, as shown in FIG. 32. That is, in the area for recording the discrimination data, a coupling bit containing at least [1] is selected as the coupling bits next following the sub-coding, whereby recording may be made at all times so as not to violate the EFM conversion rule. That is, with the above method, the discrimination can be recorded so as not to affect the succeeding data.

Referring to the drawings, a fourth embodiment of the optical disc, a method and an apparatus for recording data on this optical disc and a method and apparatus for reproducing the data recorded on the optical disc, is hereinafter explained.

In the optical disc, used here, as in the above-described optical disc, a lead-in area for recording TOC (table-of-contents) data is recorded on the inner rim side, and a data recording area for recording the recording data, such as contents data, is provided on a radially outer side of the lead-in area. A lead-out area is provided on the radially outer side of the data recording area. The data recorded to the same recording format as the CD, that is the 8-14 (eight-to-fourteen) modulated data (data modulated by EFM), are recorded to the recording format shown in FIG. 1.

The optical disc, used here, is manufactured by a process already explained with reference to FIG. 5.

Figure 35:
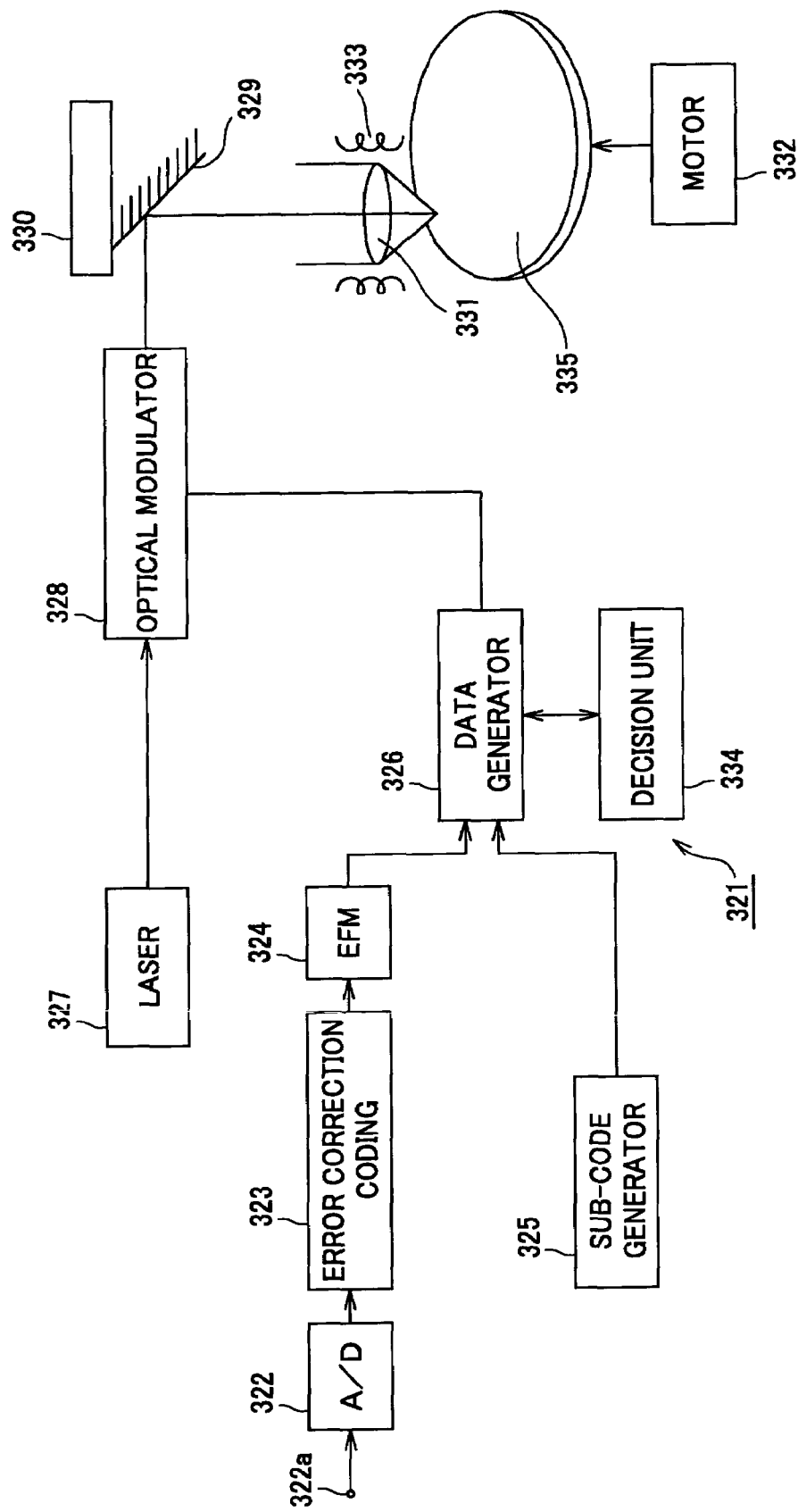
FIG. 35 is a block diagram showing a further cutting device for producing a stamper.

The master disc, used for manufacturing this optical disc, is prepared using a cutting device 321 configured as shown in FIG. 35. This cutting device 321 has a basic structure in common with the cutting device 21 already explained with reference to FIG. 6. Reference is now made to FIG. 35 for further explanation.

The cutting device 321 also includes a laser source 327, such as a gas laser, for example, an argon laser or He—Cd laser, an optical modulator 328 for modulating the laser light based on data from the data modulator 326 by, for example, an EOM (Electrical Optical Modulator) exploiting the Pockels effect, or an AOM (Acoustic-Optical Modulator) exploiting ultrasonic waves, a mirror 329 for reflecting the modulated laser light, a movable mechanism 330 for moving the mirror 329, an objective lens 331 for collecting the laser light for illuminating a glass master disc 335, a motor 32 for rotating the glass master disc 335, and an objective lens driving mechanism 333 for driving the objective lens 331 in the focusing direction which is the direction of the optical axis of the objective lens 331.

The error correction encoding circuit 323, forming this cutting device 321, samples analog contents and encodes the resulting samples by the combination of the cross-interleaving and the order four cross-interleaved Reed-Solomon codes (CIRC), using the algorithm of the cross-interleaved Reed-Solomon codes (CIRC), to output the resulting encoded data to the modulation circuit 324.

The modulation circuit 324 modulates the encoded output of the error correction encoding circuit 323 in accordance with the EFM algorithm to output the resulting modulated data to the data generator 326. Specifically, the modulation circuit 324 transforms a 8-bit sequence into a 14-bit recording code sequence, with the minimum run length Tmin (minimum length between transitions) being 2 and the maximum run length Tmax (maximum length between transitions) being 10.

The sub-code generator 325 generates sub-codes, such as the address information, responsive to the data for recording, and transforms the so generated sub-codes in the form of a 8-bit data sequence into a 14-bit recording code sequence by EFM. The sub-code generator 325 generates data bits of an 8-bit sequence in the EFM conversion table shown in FIGS. 7 and 8, as sub-codes for an area for recording the discrimination data, to convert the 8-bit sequence to a 14-bit recording code sequence. Specifically, the sub-code generator 325 generates, as the sub-codes for the area for recording the discrimination data, data bits of the 8-bit data sequence in the EFM conversion table shown in FIGS. 7 and 8, and transforms the so generated data bits into a 14-bit recording code sequence. Specifically, the sub-code generator 325 generates, as the sub-codes for the area for recording the discrimination data, data bits of the 8-bit sequence, obtained on demodulating the as-modulated 14-bit recording code sequence, having recorded the discrimination data, in which the second bit from the leading bit, that is the sub-code Q channel, is complemented from [1] to [0], and in which the third bit from the leading bit to the trailing bit, that is the sub-code R to W channels, are of the same bit. This data is selected to satisfy the condition that, when the reflective film is fused to form a simulated pit by illuminating the light beam to the land between the pits in the 14-bit pattern resulting from the EFM, the newly formed pit length will satisfy the modulation rule of EFM which states that the maximum length between transitions Tmax and the minimum length between transitions Tmin shall be 10 and 2, respectively.

The sub-code generator 325 selects the 64th number 0X40h [01000000] in the decimal notation of the EFM conversion table, as the sub-code of an area in which to record the discrimination data, as shown for example in FIG. 9A. The reason is that 0X40h on EFM gives a 14-bit pattern [01001000100100] and that, if the third land L of the pattern modulated with NRZI is irradiated with a light beam to fuse the reflective film to form a simulated pit, a 14-bit pattern [01001000100000] which on demodulation gives the same pattern as the 0th 0X00h [00000000] except the upper second bit Q channel.

The sub-code generator 325 also selects the 68th number 0X44h [01000100] in the decimal notation of the EFM conversion table, as the sub-code of an area in which to record the discrimination data, as shown for example in FIG. 9C. The reason is that 0X44h on EFM gives a 14-bit pattern [01000100100100] and that, if the second land L of the pattern modulated with NRZI is irradiated with a light beam to fuse the reflective film to form a simulated pit, a 14-bit pattern [01000100000000] is produced, which on demodulation gives the same pattern as the fourth 0X04h [00000100] except the upper second bit Q channel.

The sub-code generator 325 selects the 71st number 0X47h [01000000] in the decimal notation of the EFM conversion table, as the sub-code of an area in which to record the discrimination data, as shown for example in FIG. 9D. The reason is that 0X40h on EFM gives a 14-bit pattern [00100100000000] and that, if the second land L of the modulated with NRZI is irradiated with a light beam to fuse the reflective film to form a simulated pit, a 14-bit pattern [00100100000000] which on demodulation gives the same pattern as the seventh 0X07h [00000111] except the upper second bit Q channel.

The sub-code generator 325 generates the above sub-code, as a sub-code for an area in which to record the discrimination data, converts a preset land into a pit to complement the Q-channel of the 8-bit sequence from [1] to [0] depending on the data to be recorded to record discrimination data. By setting the channels R to W so as to be fixed before and after the recording of the discrimination data, the recording and/or reproducing apparatus is able to detect the area where the discrimination data is to be or has been recorded.

Referring to FIG. 35, the data generator 326 is supplied with recording data, modulated with EFM, from the modulating circuit 324, while being supplied with sub-codes from the sub-code generator 325. The data generator 326 inserts 3-bit coupling bits in-between the 14-bit blocks of the recording code sequences. Specifically, the data generator 326 selects, from among [000], [100], [010] and [001], such coupling bits which will satisfy the EFM conversion rule of the maximum length between transitions Tmax=10 and the minimum length between transitions Tmin=2 and which will reduce the absolute value of the DSV (digital sum value) to reduce the low frequency components, and inserts the so selected 3-bit coupling bits in-between the 14-bit blocks of the recording code sequences. The coupling bit controller forms the recording code sequences, each made up by 17 bits, to generate data shown in FIG. 1, and outputs the so generated data to the optical modulator 328.

If the area under consideration is the recording area for discrimination data, the data generator 326 generates coupling bits used ahead of the preset sub-code, such as 0X40h, 0X44h or 0X47h. This data generator 326 is connected to a decision unit 334 for verifying the coupling bits for the area in which to record he discrimination data. When the data generator 326 selects the pattern of the coupling bits inserted inbetween the synchronization signals and the sub-codes, the decision unit 334 checks whether or not such coupling bits are to be selected, from the combination of the above-mentioned four coupling bits, which satisfy the EFM conversion rule, that is that the maximum length between transitions Tmax=10 and the minimum length between transitions Tmin=2 and in which a preset bit is always the land.

The case in which the 64th 0X40h in the decimal notation of the EFM conversion table is used as the sub-code of the discrimination data recording area is explained with reference to FIG. 36. In an instance shown in FIG. 36A, a 11T pit is provided next to the 11T land of the synchronization signals. In order for the lower three bits of [100] in the 14-bit recording code sequence to be a virtual pit for recording the discrimination data, the sub-codes of 0X40h need to be a land at all times. To this end, the sub-code of 0X40h needs to be a pattern beginning with a land. On the other hand, the trailing end of the synchronization signals is inverted to a land at [1] of the second lower bit. Thus, the data generator 326 selects [000] as coupling bits between the synchronization signals and the sub-code, which guarantees that the EFM conversion rule will be met and also that the sub-code of 0X40h begins with the land.

In the example shown in FIG. 36B, a 11T land is provided next to the 11T pit of the synchronization signals. The lower three bits of [100] in the sub-code of 0X40h need be a land at all times and hence need to be of a pattern beginning with the land. On the other hand, the trailing end of the synchronization signals is inverted to a pit at [1] of the lower second bit. Thus, the data generator 326 selects [010] as coupling bits between the synchronization signals and the sub-code which assures that the EFM conversion rule will be met and also that the sub-code of 0X40h begins with the land.

The case in which the 68th 0X44h in the decimal notation of the EFM conversion table is used as the sub-code of the recording area of the discrimination data is explained with reference to FIG. 37. In an instance shown in (A) of FIG. 37, a 11T pit is provided next to the 11T land of the synchronization signals. In order for the [100] beginning from the upper ninth bit to the eleventh bit in the 14-bit recording code sequence to be a virtual pit for recording the discrimination data, the sub-codes of 0X44h need to be a land at all times. To this end, the sub-code of 0X44h needs to be of a pattern beginning with a pit. On the other hand, the trailing end of the synchronization signals is inverted to a land at [1] of the second lower bit. Thus, the data generator 326 selects [010] as coupling bits between the synchronization signals and the sub-code, which guarantees that the EFM conversion rule will be met and also that the sub-code of 0X44h begins with the pit.

Figure 37:
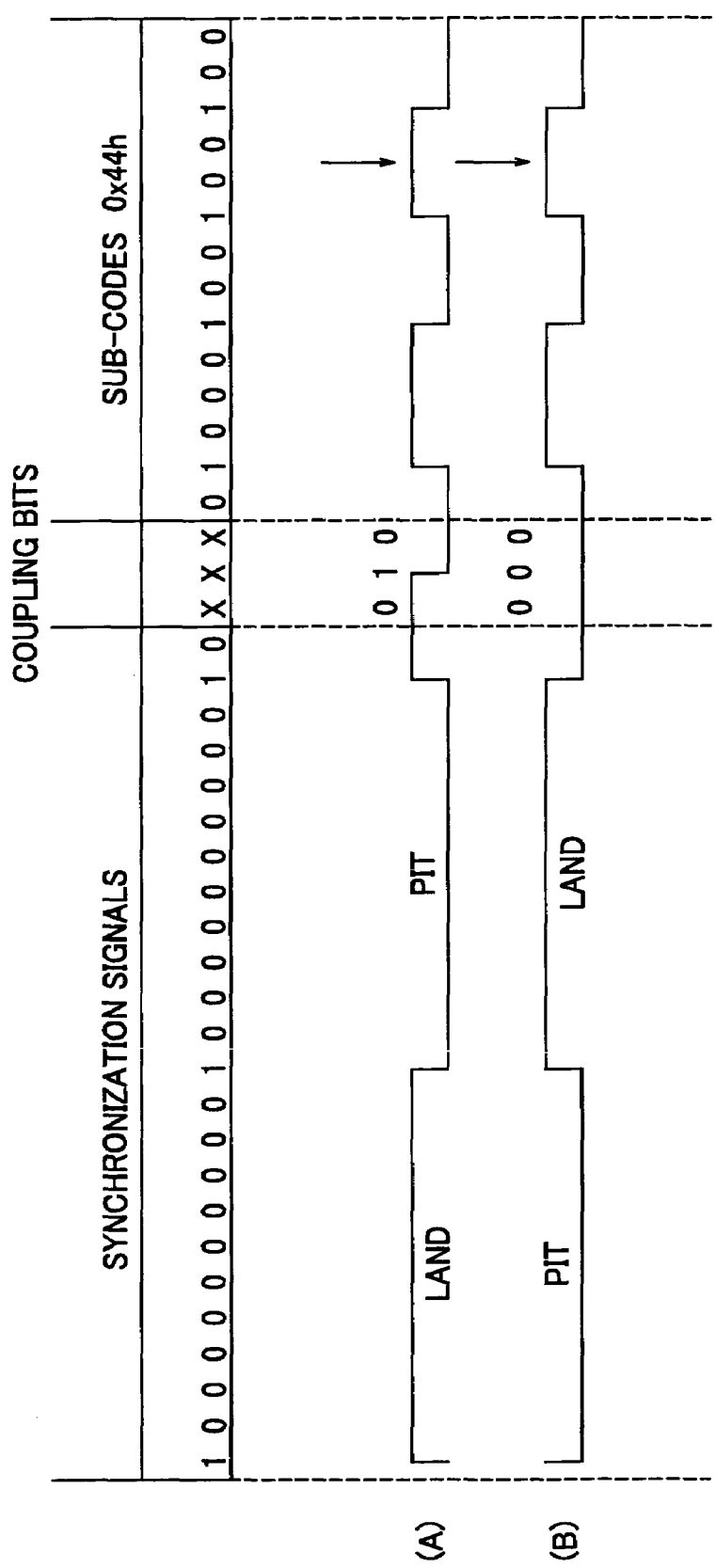
FIG. 37 illustrates a method for selecting coupling bits when employing the 68th 0X44h in the decimal notation of the EFM conversion table as a sub-code of the recording area for the discrimination data.

In the example shown in (B) FIG. 37, a 11T land is provided next to the 11T pit of the synchronization signals. The three bits from the ninth to the eleventh bits of [100] in the sub-code of 0X44h need be a land at all times and hence need to be of a pattern beginning with the pit. On the other hand, the trailing end of the synchronization signals is inverted to a pit at [1] of the lower second bit. Thus, the data generator 326 selects [000] as coupling bits between the synchronization signals and the sub-code which assures that the EFM conversion rule will be met and that the sub-code of 0X44h begins with the pit.

The case in which the 71st 0X47h in the decimal notation of the EFM conversion table is used as the sub-code of the recording area of the discrimination data is explained with reference to FIG. 38. In an instance shown in (A) of FIG. 38, a 11T pit is provided next to the 11T land of the synchronization signals. In order for the [100] beginning from the upper ninth bit to the eleventh bit in the 14-bit recording code sequence to be a virtual pit for recording the discrimination data, the sub-codes of 0X47h need to be a land at all times. To this end, the sub-code of 0X47h needs to be of a pattern beginning with a pit. On the other hand, the trailing end of the synchronization signals is inverted to a land at [1] of the second lower bit. Thus, the data generator 326 selects [010] or [001] as coupling bits between the synchronization signals and the sub-code which assures that the EFM conversion rule will be met and that the sub-code of 0X47h begins with the pit.

Figure 38:
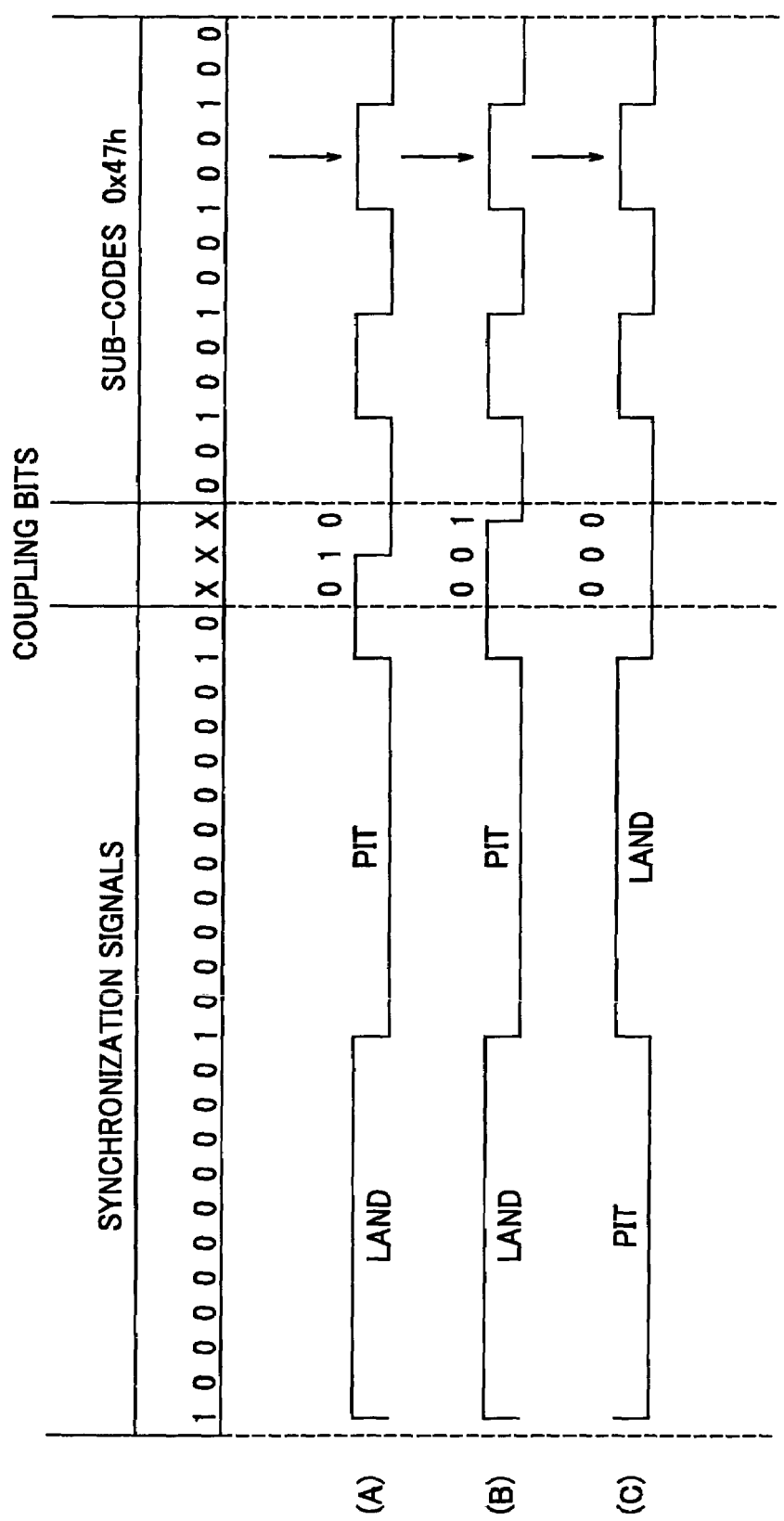
FIG. 38 illustrates a method for selecting coupling bits when employing the 71st 0X47h in the decimal notation of the EFM conversion table as a sub-code of the recording area for the discrimination data.

In the example shown in (C) of FIG. 38, a 11T land is provided next to the 11T pit of the synchronization signals. The three bits from the ninth to the eleventh bits of [100] in the sub-code of 0X47h need be a land at all times and hence need to be of a pattern beginning with the pit. On the other hand, the trailing end of the synchronization signals is inverted to a pit at [1] of the lower second bit. Thus, the data generator 326 selects [000] as coupling bits between the synchronization signals and the sub-code which assures that the EFM conversion rule will be met and that the sub-code of 0X40h begins with the pit.

With the above-described cutting device 321, when sampled data for recording are input via input terminal 322a to the A/D converter 322, the A/D converter 322 converts the data from analog signals to digital signals and outputs the resulting signals to the error correction encoding circuit 323. The error correction encoding circuit 323 applies the samples to encoding comprising the combination of the cross-interleaving and order four Reed-Solomon codes to output the resulting data to the modulation circuit 324. The modulation circuit 324 modulates the data by EFM. The modulation circuit 324 converts the data for recording from 8 bits to 14 bits, in. The EFM conversion table, shown in FIGS. 7 and 8, to output the so converted data to the data generator 326. The sub-code generator 325 generates sub-codes of 8 bits, such as the address information, in meeting with data for recording, and converts the generated data to 14-bit data which is output to the data generator 326. The data generator 326, supplied with the data from the modulation circuit 324 and data such as sub-codes from the sub-code generator 325, sum these data together, and inserts the coupling bits in-between the 14-bit blocks to generate recording data which is output to the optical generator 328 after modulation with NRZI.

The laser source 327 radiates the laser light which then is input to the optical modulator 328. The optical modulator 328 modulates the laser light based on the input from the data generator 326. That is, when [1] is input from the data generator 26, the optical modulator 328 modulates the laser light. The laser light modulated by the optical modulator 328 is incident on the mirror 329. This mirror 329 is moved by the movable mechanism 330 for scanning the laser light across the inner and outer rims of the glass master disc 335. The laser light is converged by the objective lens 331 so as to be illuminated on the glass master disc 335, which is run in rotation at CLV (constant linear velocity) by the spindle motor 332 as the rotational driving unit. The objective lens 331 is displaced along the optical axis of the laser light by the objective lens driving mechanism 333 by way of performing focusing control.

The data recording apparatus for recording discrimination data on an optical disc used in the discrimination data recording process is explained with reference to FIG. 39.

Similarly to the data recording apparatus 40, 140 or 240, this data recording apparatus 340 includes a spindle motor 341, for rotationally driving the optical disc 301, an optical pickup 342 for radiating a light beam to the optical disc 301 and for detecting the reflected return beam, a servo controller 343 for exercising focusing servo control and tracking servo control of the objective lens of the optical pickup 342 and for controlling the rotation of the spindle motor 341, an RF amplifier 344 for generating e.g., RF signals from a detection output of the optical pickup 342, a synchronization signal detection unit 345 for detecting the synchronization signal from the RF signal and for generating clocks, a sub-code extraction unit 346 for extracting sub-codes from the RF signals, a detection unit 347 for detecting the recording position of the discrimination data, and a sub-code demodulating unit 348 for demodulating the EFM modulated 14-bit sub-codes to 8 bits and for generating the sub-codes of the P to W channels.

Figure 39:
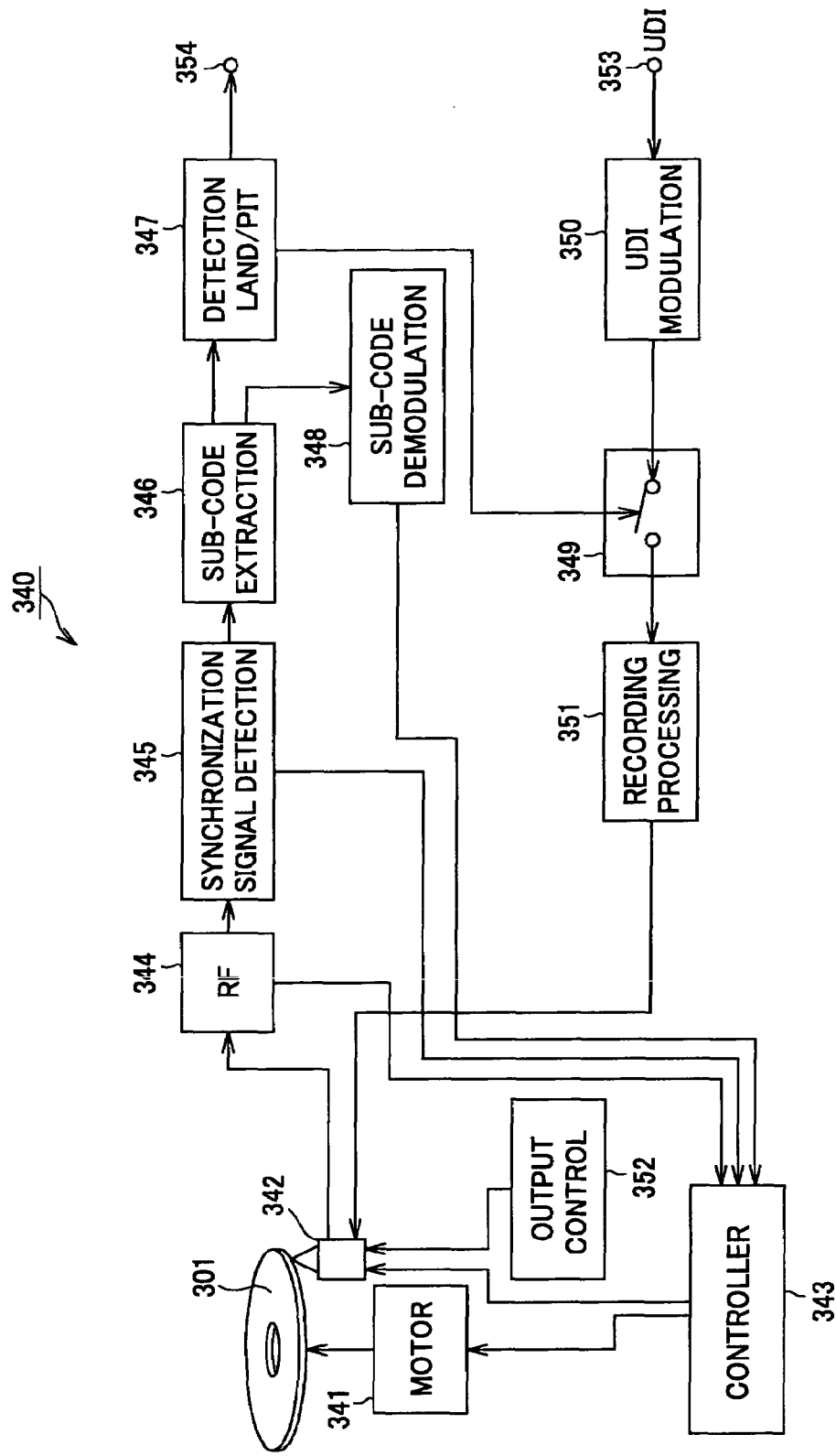
FIG. 39 is a block diagram showing a further recording apparatus for discrimination data.

The data recording apparatus 340, shown in FIG. 39, also includes, as a recording system for recording discrimination data for the optical disc 301, a switching unit 349 for modulating the discrimination data, recorded on the optical disc 301, a modulating unit 350 for switching the input to the discrimination data, a recording processor 351 for performing recording processing in recording the discrimination data on the optical disc 301, a recording processor 351 for performing recording processing in recording the discrimination data on the optical disc 301 and an output controller 352 for controlling the outputting of the light beam radiated by the optical pickup 342.

The spindle motor 341 has its spindle shaft mounted in unison with the disc table. The disc table is engaged in a center opening of the optical disc 301 and thereby clamped as the center of rotation of the optical disc 1 is kept in coincidence with the center of rotation of the spindle shaft. The spindle motor 61 causes rotation of the optical disc 301 in unison with the optical disc 301.

The optical pickup 342 includes a semiconductor laser, as a light source for radiating a light beam, an objective lens for collecting the light beam radiated from the semiconductor laser, and a photodetector for detecting the return light beam reflected back from the reflective film of the optical disc 301.

The light beam, radiated from the semiconductor laser, is collected by the objective lens, so as to be illuminated on the signal recording surface of the optical disc 301.

The laser output of the semiconductor laser is controlled by the output controller 352. When reading out data for recording the discrimination, under control by the output controller 352, the semiconductor laser radiates a light beam at a standard output. When recording discrimination data recorded on the optical disc 301, the semiconductor laser radiates a light beam at an output level higher than in reproduction in order to fuse the reflective film to effect thermal recording.

The return light beam, reflected back from the signal recording surface of the optical disc 301, is converted into electrical signals, by a photodetector, which then outputs the converted electrical signals to the RF amplifier 344. The objective lens is supported by an objective lens driving mechanism, such as a bi-axial actuator, and is displaced in the focusing direction parallel to the optical axis of the objective lens and in a tracking direction perpendicular to the optical axis of the objective lens.

The RF amplifier 344 generates RF signals, focusing error signals and tracking error signals, based on an output signal of the photodetector forming the optical pickup 342. The focusing error signals are generated by for example an astigmatic method, while the tracking error signals are generated by a three beam method or by a push-pull method. The RF amplifier 344 outputs the focusing error signals and the tracking error signals to the controller 343.

From the RF signals, the synchronization signal detection unit 345 detects frame synchronization signals, shown in FIG. 1, while detecting synchronization signals used in decoding sub-codes shown in FIGS. 2 and 3. The synchronization signal detection unit 345 generates clocks from the synchronization signals.

Based on the focusing error signals and the tracking error signals, supplied from the RF amplifier 344, the controller 343 generates focusing servo signals and tracking servo signals, and outputs these servo signals to a driving circuit of the objective lens driving mechanism of the optical pickup 342. Based on the focusing servo signals and tracking servo signals, the objective lens, held by the objective lens driving mechanism, is displaced in the focusing direction parallel to the optical axis of the objective lens and in the tracking direction perpendicular to the optical axis of the objective lens. The controller 343 also generates rotational servo signals, so that the clocks generated from the synchronization signals will be synchronized in frequency and phase with the reference clocks from the quartz oscillator. The spindle motor 341 accordingly causes rotation of the optical disc at for example the CLV.

The sub-code extraction unit 346 extracts the 14-bit sub-coding, provided next to the frame synchronization signals, from data input from the RF amplifier 344, and outputs the so extracted sub-coding to the detection unit 347, while outputting it to the sub-code demodulating unit 348 for specifying the recording area of the discrimination data.

The detection unit 347 detects whether or not the position in which to record the discrimination data is the land. That is, the detection unit 347 checks whether or not the position indicated by the arrow in FIGS. 36 to 38 is the land. The detection unit 347 outputs the results of detection via output terminal 54 to e.g., a monitor to enable e.g., an error message to be displayed thereon. The detection unit 347 may decide that, if the position directly ahead of the recording position of the discrimination data is the pit, the recording position is the land.

Based on the EFM conversion table, the sub-code demodulating unit 348 converts the sub-code of the area, where the discrimination data has been recorded, from 14 bit data to 8-bit data. The sub-code demodulating unit 348 forms one block from 98 frames and generates sub-codes of P, Q, R, S, T, U, V and W channels. That is, the sub-code demodulating unit 348 generates P1-W1 to P96-W96, that is 96 bit sub-codes. The sub-code demodulating unit 348 outputs the address information, extracted from the sub-codes, to the controller 343. This allows the controller 343 to cause the optical pickup 342 to access the recording area for the discrimination data.

The modulating unit 350 modulates the discrimination data, input from the input terminal 353, in accordance with the preset modulation system, to output the resulting data via switching unit 349 to the recording processor 351. The switching unit 349 is changed over responsive to an output from the detection unit 347. That is, when the recording position of the discrimination data is the land, the detection unit 347 turns on the switching unit 349 to enable the discriminated data, modulated by the modulating unit 350, to be output to the recording processor 351. When the recording position of the discrimination data is off, the detection unit 347 turns off the switching unit 349 to disable the outputting of the discrimination data, modulated by the modulating unit 350, to the recording processor 351.

The recording processor 351 executes the recording processing necessary for recording on the optical disc 301 to output the so processed data to the optical pickup 342.

Turning to the processing by the above-described data recording apparatus 340, when a user has pressed a discrimination data recording button, the data recording apparatus 340 actuates the spindle motor 341 to cause the rotation of the optical disc 301, loaded on the disc table, forming the disc loading unit, at a constant linear velocity. Simultaneously, the optical pickup 342 illuminates a light beam on the optical disc 301. It is noted that the output controller 352 controls the semiconductor laser of the optical pickup 42 to output the light beam at a standard output. The optical pickup 342 initiates data readout as focusing servo and tracking servo control operations are performed under control by the controller 343.

Figure 40:
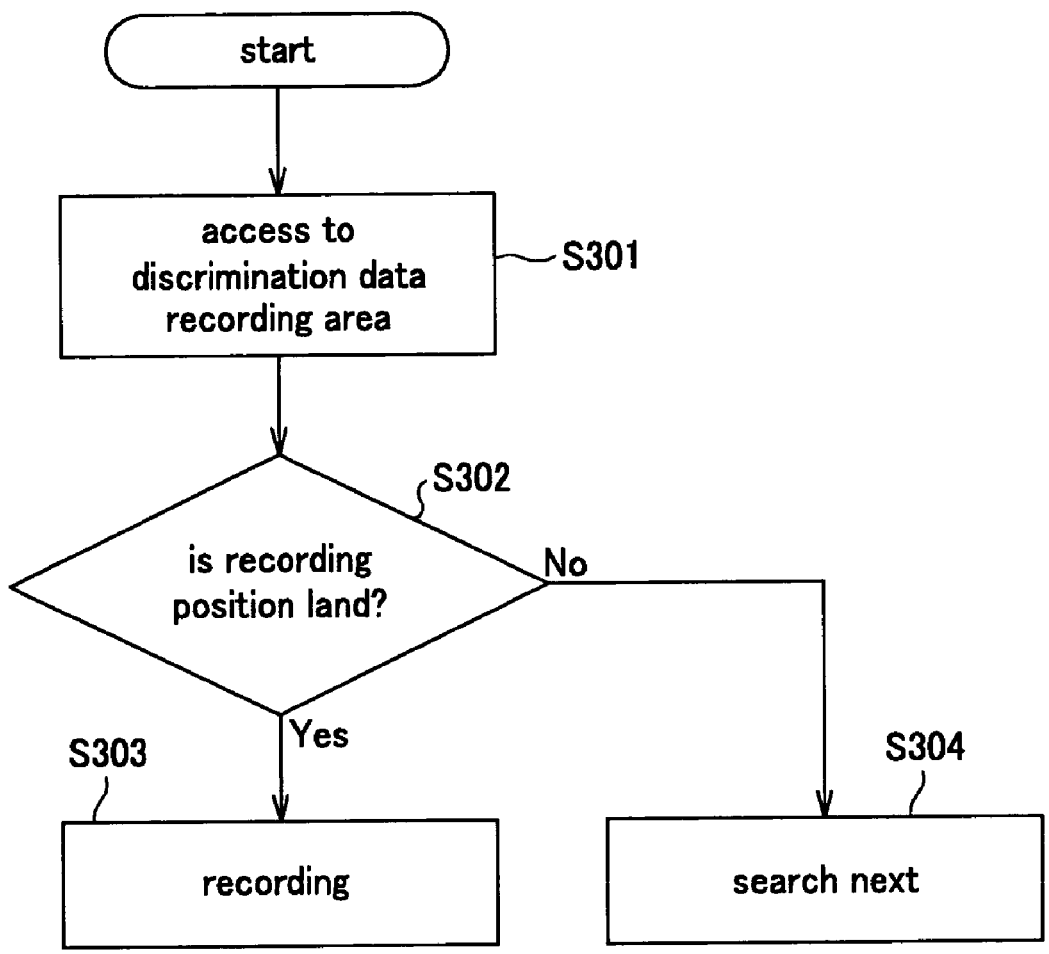
FIG. 40 is a flowchart for illustrating the operation of recording discrimination data on an optical disc in a data recording apparatus.

In a step S301, the optical pickup 342 effectuates track jump to a recording area for the discrimination data based on e.g., the TOC of the sb-code demodulated by the sub-code demodulating unit 348, in order to record the discrimination data in a preset area, under control by the controller 343 of the data recording apparatus 340, as shown in FIG. 40. The sub-code extraction unit 346 of the data recording apparatus 340 extracts the sub-codes of the discrimination data recording area by the sub-code extraction unit 346 to output the 14-bit data to the detection unit 347. In the next step S302, the detection unit 347 checks whether or not the position indicated by the arrow mark in FIGS. 36 to 38 is the land. If the recording position is the land, the detection unit 347 in a step S303 turns on the switching unit 349, whereas, if the recording position is the pit, the detection unit 347 in a step S304 turns off the switching unit 349, and searches the next position. On the other hand, if the discrimination data is input from the input terminal 353, the modulating unit 350 modulates the discrimination data in a preset format. When the detection unit 347 has turned on the switching unit 349, the modulating unit 350 outputs the modulated discrimination data to the recording processor 351 via switching unit 349. The recording processor 351 outputs the data it has processed to the optical pickup 342.

Meanwhile, the recording area for the discrimination data may be specified using the discrimination data in the ADR of the Q channel sub-codes. Alternatively, the area in which to record the discrimination data may be specified by detecting whether or not the sub-codes of the R to W channels are of fixed values to specify the area in which to record the discrimination data to set the apparatus to the discrimination data recording mode.

For thermally recording the discrimination data by dissolving the reflective film, the output controller 352 changes over the output of the semiconductor laser from the standard level to the high level. The data recording apparatus 340 forms a simulated pit in the land to record data in 84 bits of the recording area of the Q channel sub-code, that is from the fourth bit from the trailing end of the UDI index to the CRC. Specifically, the data recording apparatus 340 records e.g., the recordable time and the pre-recorded time in the four bits from the trailing end of the UDI index and records the discrimination data in the 56-bit UDI payload, while recording the address information, such as the frame numbers, in the 8-bit AFRAME and recording the error correction code in the 16-bit CRC.

Figure 41:
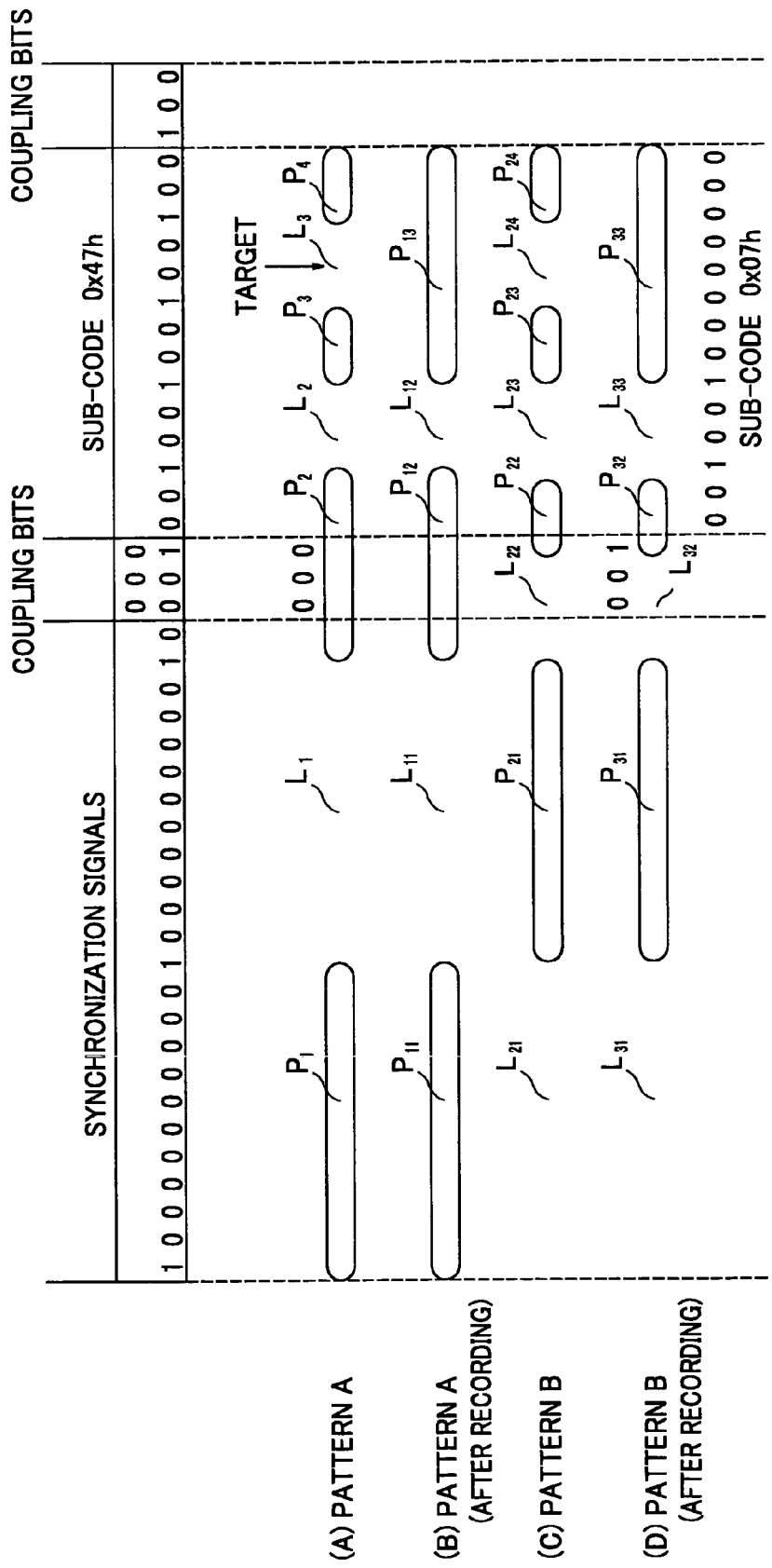
FIG. 41 illustrates a recording example of for recording discrimination data by changing 0X47h to 0X07h.

The method for recording these data is now explained with reference to FIG. 41. Meanwhile, the embodiment shown in this figure changes 0X47h shown in FIG. 4D to 0X07h. Before recording the discrimination data, the pattern A is such that, as shown in FIG. 41, there are recorded 24 bits of frame synchronization signals, followed by coupling bits of [000], followed by a sub-code of [00100100100100] (0X47h) followed in turn by coupling bits [100]. On the optical disc 301, there are recorded a 11T long pit P1, followed by a 11T long land L1, followed by a 7T long pit P2, followed by a 3T long land L2, followed by a 3T long pit P3, followed by a 3T long land L3, and followed by a 3T long pit P4. The data recording apparatus 40 illuminates a light beam of a high output from the pit P3 to the pit P4 to fuse the reflective film to effect thermal recording to form a simulated pit consecutive to the pits P3 and P4 on the site of the land L3 to give a post-recording pattern A shown in (B) of FIG. 41. Thus, in the post-recording pattern A, there is recorded a pattern [00100100000000] (0X07h) in the sub-code area. That is, on the optical disc 301, there are recorded a 11T long pit P11, followed by a 11T long land L11, followed by a 7T long pit P12, followed by a 3T long land L12, and followed by a 9T long pit P13.

Turning to the case in which the pattern of the frame synchronization signals is the reverse of the above pattern, a pattern B prior to the recording of the discrimination data begins with 24-bit frame synchronization signals, followed by coupling bits [001], followed by a sub-code [00100100100100] (0X47h) and followed by coupling bits of [100]. On the optical disc 301, there are recorded a 11T long land L21, followed by a 11T pit P21, followed by a 4T pit L22, followed by a 3T pit P22, followed by a 3T land L23, followed by a 3T pit P23, followed by a 3T land L24, and followed by a 3T pit P24. The data recording apparatus 40 illuminates a light beam of a high output from the pit P23 to the pit P24 to fuse the reflective film to effect thermal recording to form a simulated pit consecutive to the pits P23 and P24 to give a post-recording pattern B shown in (D) of FIG. 41. Thus, in the post-recording pattern B, there is recorded a pattern [00100100000000] (0X07h) in the sub-code area. That is, on the optical disc 301, there are recorded a 11T long land L31, followed by a 11T long pit P31, followed by a 4T long land L32, followed by a 3T pit P32, followed by a 3T land L33, and followed by a 9T pit P33.

Thus, the data recording apparatus 340 forms a pattern of pits and lands, corresponding to the discrimination data, by the on/off of the high output light beam, thereby recording the discrimination data in the Q channel sub-code.

By the above method, the recording area for the discrimination data is specified, using e.g., the address information in the sub-codes, to record the discrimination data in the so specified area.

Figure 42:
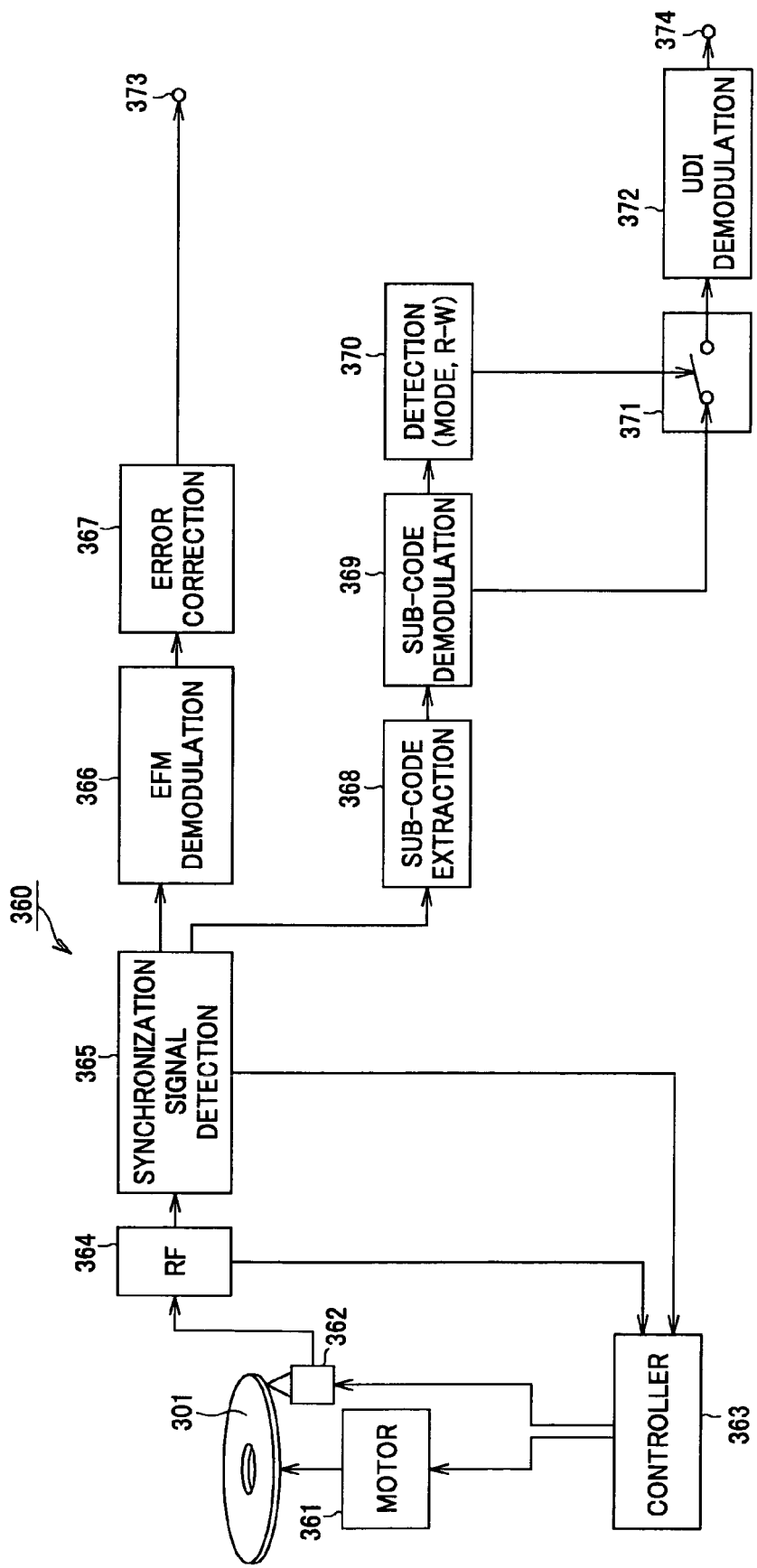
FIG. 42 is a block diagram showing a further data reproducing apparatus for reproducing an optical disc according to the present invention.

Referring to FIG. 42, a data reproducing apparatus 360 for reproducing the optical disc 1, on which the discrimination has been recorded by the above-described data recording apparatus 340, is now explained.

Similarly to the data reproducing apparatus 60, 160, 260, the data reproducing apparatus 360 includes a spindle motor 361, adapted for rotating the optical disc 301, having the discrimination data recorded thereon, an optical pickup 362 for radiating a light beam to the optical disc 301 and for detecting the reflected return light beam, a controller 363 for performing focusing servo control and tracking servo control of the objective lens optical pickup 362 and for performing rotational servo control of the spindle motor 361, an RF amplifier 364 for generating RF signals from an output of the optical pickup 362, a synchronization signal detection unit 365 for detecting synchronization signals from the RF signals for generating clocks, a demodulating unit 366 for demodulating recording data, such as contents data, modulated by EFM, and an error correction unit 367 for correcting errors of the demodulated data.

The data reproducing apparatus 360 includes a sub-code extraction unit 368 for extracting sub-codes from the RF signals, a sub-code demodulating unit 369 for demodulating the 14-bit sub-codes, modulated by EFM, into 8 bits to generate sub-codes of the R to W channels, a detection unit 370 for detecting sub-codes of the R to W channels, a switching unit 371 and a demodulating unit 372 for demodulating the discrimination data.

The spindle motor 361 rotationally drives the optical disc 301 as the optical disc 301 is centered with respect to the disc, and is mounted in this state on the disc table, as on the disc table of the above-described respective data reproducing apparatus.

The optical pickup 362 condenses the light beam, radiated from the semiconductor laser, by the objective lens, to illuminate the light beam on the signal recording surface of the optical disc 301, as in the above-described respective data reproducing apparatus. The optical pickup 362 detects the return light beam, reflected back from the signal recording surface of the optical disc 301, by a photodetector, and converts the detection signal into electrical signals, which are then output to the RF amplifier 364. When reproducing data, the semiconductor laser radiates a light beam at a standard output. The objective lens is supported by an objective lens driving mechanism, such as a bi-axial actuator, and is displaced in the focusing direction parallel to the optical axis of the objective lens and in a tracking direction perpendicular to the optical axis of the objective lens.

The RF amplifier 364 generates RF signals, focusing error signals and tracking error signals, based on the output signal of the photodetector forming the optical pickup 362. For example, the focusing error signals are generated by e.g., an astigmatic method, while the tracking error signals are generated by a three-beam method, or a push-pull method. The RF amplifier 364 outputs the RF signals to the demodulating unit 366 for demodulating the EFM modulated data, while outputting the focusing error signals and the tracking error signals to the servo controller 363.

The synchronization signal detection unit 365 detects the frame synchronization signals, shown in FIG. 1, from the RF signals, while detecting the synchronization signals, used in decoding the sub-codes shown in FIGS. 2 and 3. The synchronization signal detection unit 365 generates clocks based on the detected synchronization signals.

The controller 363 generates the focusing servo signals and the tracking servo signals, based on the focusing error signals and the tracking error signals, input from the RF amplifier 364, to output the so generated signals to a driving circuit for the objective lens driving mechanism of the optical pickup 362. Thus, the objective lens, held by the objective lens driving mechanism, is displaced, based on the focusing servo signals and the tracking servo signals, in the focusing direction parallel to the optical axis of the objective lens and in the tracking direction perpendicular to the optical axis of the objective lens. The controller 363 also generates rotational servo signals, so that the clocks generated from the synchronization signals will be synchronized in frequency and phase with the reference clocks from the quartz oscillator. The spindle motor 361 accordingly causes rotation of the optical disc at for example the CLV.

The demodulating unit 366 demodulates recording data, such as contents data, in accordance with the EFM algorithm. Specifically, the demodulating unit 366 converts the 14-bit recording code sequence into 8-bit data bits, in accordance with the EFM conversion table shown in FIGS. 7 and 8. The error correction unit 367 demodulates the modulated recording data in accordance with an algorithm, such as CIRC, to output the demodulated data to an output terminal 373. For example, if the recording data is audio data, the audio data, output at the output terminal 373, is converted by the D/A converter from digital signals to analog signals, and output via for example a loudspeaker, an earphone or a headphone.

The sub-code extraction unit 368 extracts the 14-bit sub-coding, provided next to the frame synchronization signals, from data input from the RF amplifier 364, to output the so extracted sub-coding to the sub-code demodulating unit 369. The sub-code demodulating unit 369 converts the 14-bit data into 8-bit data based on the EFM conversion table. The sub-code demodulating unit 369 forms one block with 98 frames, to generate sub-codes of P, Q, R, S, T, U, V and W channels. That is, the sub-code demodulating unit 369 generates from P1-W1 to P96-W96, that is 96 bit sub-codes.

The detection unit 370 detects the mode of recording the discrimination data. That is, the detection unit 370 detects whether or not the mode is that of reproducing the discrimination data by the Q channel ADR to specify the area where the discrimination data has been recorded. On detecting the discrimination data specifying the mode for reproducing the discrimination data, the detection unit 370 turns on the switching unit 371 to output the discrimination data input from the sub-code extraction unit 368 to the demodulation unit 372. If the detection unit 370 has failed in detecting the discrimination data specifying the mode of reproducing the discrimination data, the detection unit 370 assumes that the area in question is not the recording area for the discrimination data and turns off the switching unit 371 to inhibit the inputting to the demodulation unit 372 of the discrimination data input from the sub-code extraction unit 368.

The detection unit 370 may specify the area of recording of the discrimination data by detecting the sub-code R to W channels and by detecting whether or not these sub-codes are of fixed values as saved in a memory. That is, the detection unit 370 detects whether the R to W channels are [000000] for FIG. 9A, [000100] for FIG. 9C or [000111] for FIG. 9D. If the data of the R to W channels, input from the sub-code demodulating unit 369, is of a fixed value, the detection unit 370 turns the switching unit 371 on to input the discrimination data input from sub-code extraction unit 368 to the demodulation unit 372. If the data of the R to W channels, input from the sub-code demodulating unit 369, is not of a fixed value, the detection unit 370 deems that the recording area is not that for the discrimination data and turns the switching unit 371 off to inhibit the inputting of the discrimination data from the sub-code extraction unit 368 to the demodulation unit 372.

The demodulating unit 372 for the discrimination data is supplied from the sub-code demodulating unit 369 with the Q channel sub-codes through the switching unit 371. The demodulating unit 372 for the discrimination data refers to e.g., the prerecorded time recorded in the UDI index shown in FIG. 4 to demodulate the discrimination data recorded in the UDI payload, while performing error correction processing, using CRC, to output the demodulated discrimination data at an output terminal 374.

The data readout operation by the data reproducing apparatus 360 is now explained. When a replay button is pressed by a user, the data reproducing apparatus 360 actuates the spindle motor 361 to cause rotation of the optical disc 301 loaded on the disc table forming the disc loading section at a constant linear velocity. Simultaneously, the optical pickup 362 illuminates a light beam on the optical disc 301. At this time, the optical pickup 362 illuminates the light beam at a standard output. The optical pickup 362 begins to read out data as focusing control and tracking control are exercised by the servo controller 363.

Figure 43:
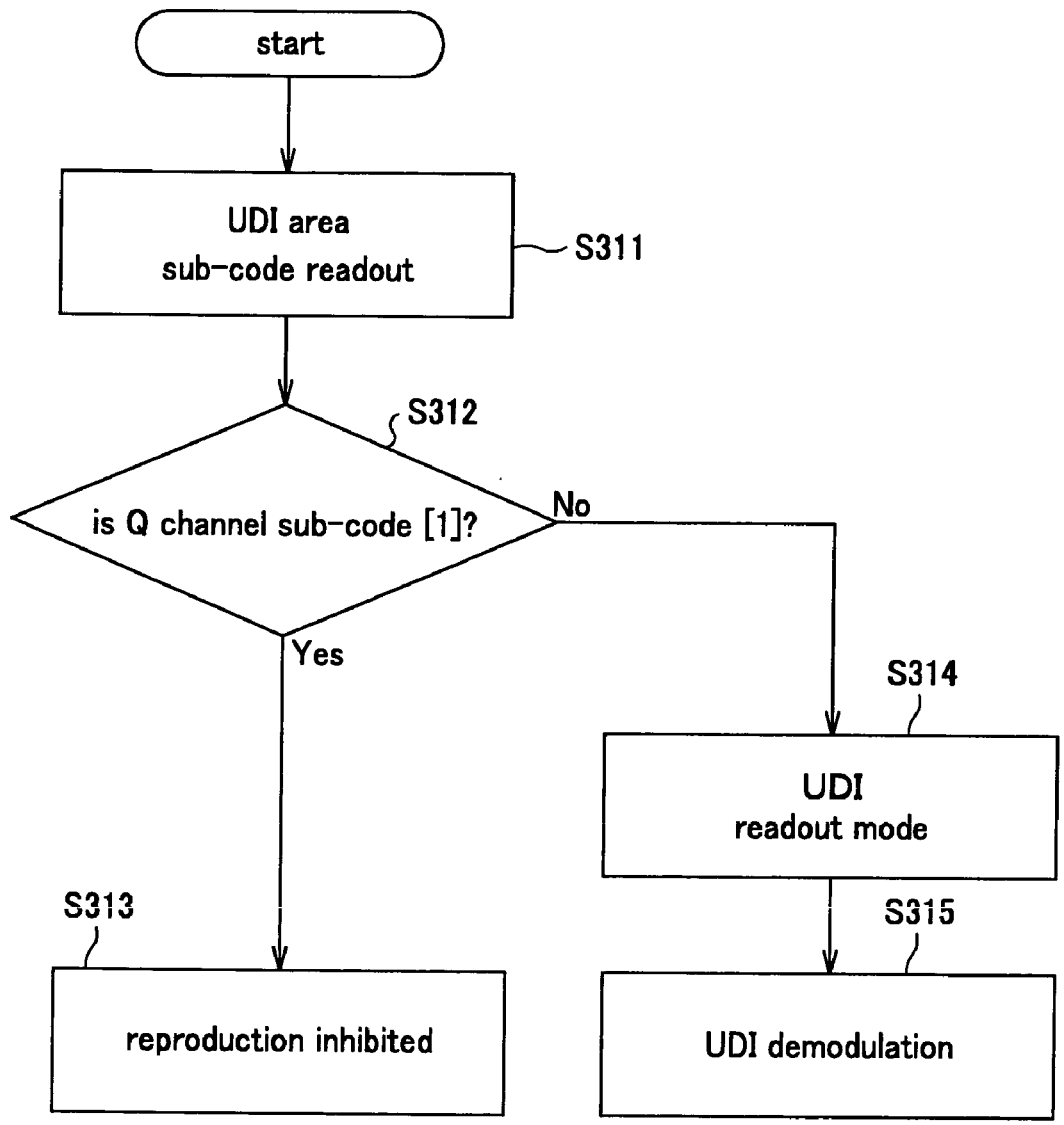
FIG. 43 is a flowchart for illustrating the reproduction controlling method using sub-codes of the Q-channel.

Referring to FIG. 43, the data reproducing apparatus 360 in a step S311 accesses the recording area for the discrimination data, while extracting the sub-codes from the sub-code extraction unit 368 and demodulating the so extracted sub-codes in the sub-code demodulating unit 369. In a step S312, the detection unit 370 reads out the sub-code Q channel to check whether or not at least the recordable area shown in FIG. 4 in its entirety is [1]. The reason is that, in the optical disc 301 where the discrimination data has not been recorded, no simulated pit is formed by fusing the reflective film to record the discrimination data, so that at least the recordable area of the Q channel is all [1]. Of course, if the entire frame of the Q channel is the recordable area, it is sufficient to check whether or not the sub-codes of the Q channel are all [1]. If the recordable area of the Q channel is all [1], the data reproducing apparatus 360 proceeds to a step S313 and, if otherwise, to a step S314.

If the recordable area of the Q channel is all [1], the data reproducing apparatus 360 in a step S313 turns off the switching unit 371 to inhibit the readout of the discrimination data as well as to inhibit the reproduction of e.g., the contents data recorded on the optical disc 301. It is noted that the optical disc 301, the recordable area of the Q channel of which is all [1], is an optical disc on which no discrimination data has been recorded and hence was distributed illicitly before the recording of the discrimination data.

If the recordable area of the Q channel is not all [1], and the detection unit 370 in a step S314 has detected with the ADR of the Q channel that an area under consideration is the recording area for the discrimination data, the data reproducing apparatus 360 sets a reproducing mode of reading out the discrimination data. Then, in a step S315, the data reproducing apparatus 360 reads out and demodulates the discrimination data and subsequently permits the reproduction of the contents data recorded on the optical disc 301.

With the above-described method, in which it is checked whether or not the entire recordable area of the Q channel is all [1], it is possible to impose limitations on the reproduction of the optical disc illicitly distributed prior to the recording of the discrimination data, as an example. With this method, it is possible to impose limitations on the reproduction of the illicit optical disc manufactured by a stamper prepared on peeling off a protective film or a reflective film of the optical disc 301 and on transcribing the pit pattern of lands and recesses of the disc substrate. Since the discrimination data are recorded by virtually forming pits by fusing the reflective film, and are not of a pattern of lands and recesses, these discrimination data are not transcribed to the stamper.

Figure 44:
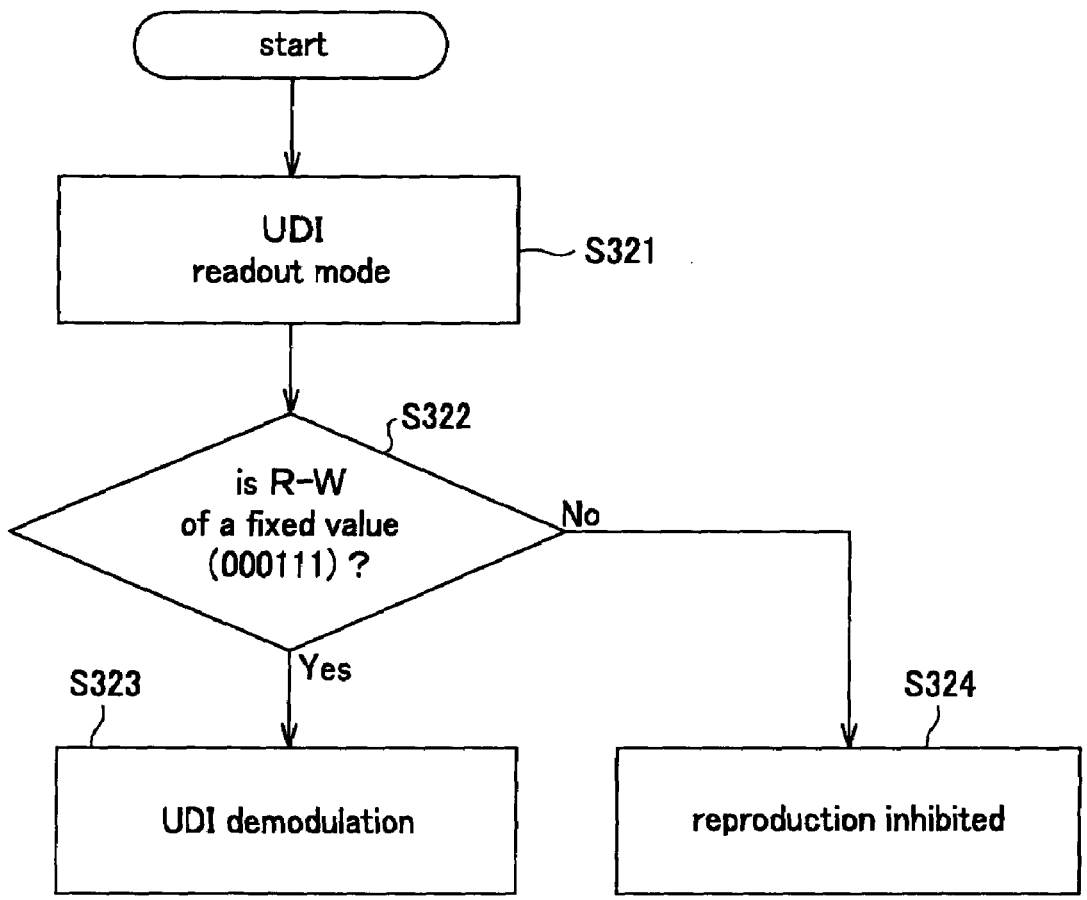
FIG. 44 is a flowchart for illustrating the reproduction controlling method using the sub-codes of R to W channels.

In this data reproducing apparatus 360, data reproduction may be controlled as follows: If, in a step S321 of FIG. 44, the detection unit 370 of the data reproducing apparatus 360 detects, with the Q channel ADR, that the area under consideration is the recording area for the discrimination data, the data reproducing apparatus 360 sets the reproduction mode of reading out the discrimination data. In a step S322, the data reproducing apparatus 360 extracts the R to W channels of the sub-codes to check whether or not the sub-codes of the R to W channels, as read out from the optical disc 301, are of preset fixed values. For example, if the combination of 0X47h and 0X00h, shown in FIG. 9D, is used, the detection unit 370 checks whether or not the sub-codes of the R to W channels are [000111]. When the detection unit 370 of the data reproducing apparatus 360 has determined that the sub-codes as read out are of a fixed value, that is that the sub-codes of the R to W channels are [000111], the data reproducing apparatus 360 proceeds to a step S323. When the detection unit 370 of the data reproducing apparatus 360 has determined that the sub-codes as read out are not of a fixed value, that is that the sub-codes of the R to W channels are not [000111], the data reproducing apparatus 360 proceeds to a step S324.

If the data reproducing apparatus 360 has determined that the sub-codes of the R to W channels are of fixed values, the data reproducing apparatus 360 in a step S323 determines that the optical disc 301 currently loaded is an authorized disc and turns on the switching unit 371 to enable the readout of the discrimination data. If the Q channel sub-codes are input from the sub-code demodulating unit 369 through the switching unit 371, the discrimination data demodulating unit 372 references e.g., the pre-recorded time as recorded on the UDI index shown in FIG. 4 to demodulate the discrimination data recorded in the UDI payload, while correcting the demodulated data for errors using CRC to output the resulting data at the output terminal 74. The data reproducing apparatus 360 initiates reproducing processing of the contents data recorded on e.g., the optical disc 1.

If the detection unit 370 of the data reproducing apparatus 360 has determined that the sub-codes of the R to W channels are not coincident with the fixed values, the data reproducing apparatus 360 in a step S324 decides that the currently loaded optical disc 301 is an illicit disc or an optical disc of a different sort. Accordingly, the data reproducing apparatus 360 inhibits the readout of the discrimination data and the processing downstream of the reproducing processing of the contents data recorded on the optical disc 301. With this method, it is possible to limit the reproduction of the illicitly distributed optical disc or the optical disc of different sorts.

Figure 36:
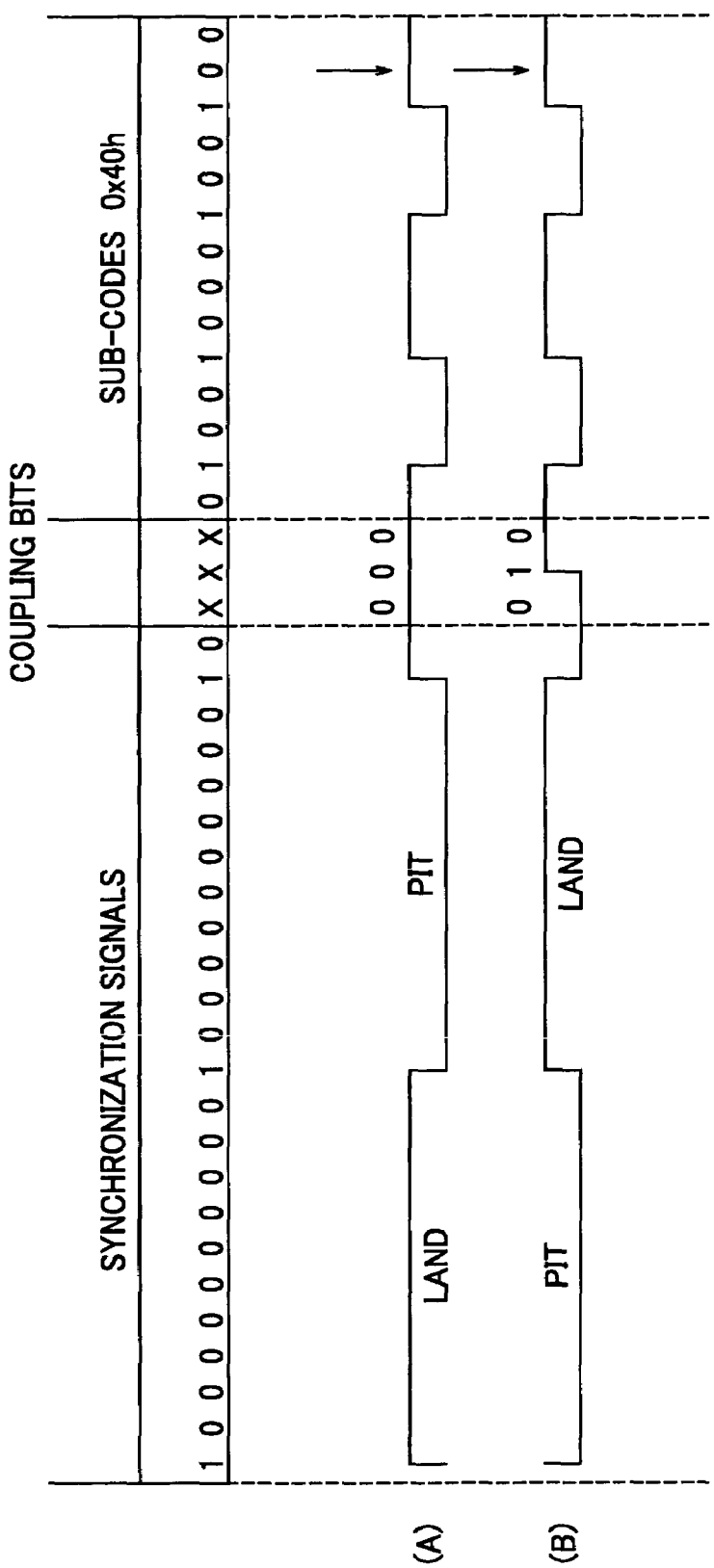
FIG. 36 illustrates a method for selecting coupling bits when employing the 64th 0X40h in the decimal notation of the EFM conversion table as a sub-code of the recording area for the discrimination data.

With the optical disc 301 according to the present invention, described above, such discrimination data which satisfy the EFM conversion rule of the maximum length between transitions Tmax of 10 and the minimum length between transitions of 2 and in which the preset bit always becomes the land, as shown in FIGS. 36 to 38, is selected in recording the discrimination data in the sub-coding shown in FIG. 1. Thus, the discrimination data can be recorded on the optical disc 301 so that the preset land is inverted to a pit. Since the position of the discrimination data is fixed when recording the discrimination data, it is sufficient to change over the output periodically, thus simplifying the control. The discrimination data is not recorded by pits and lands forming a pattern of crests and recesses, but the reflective film is fused to inhibit reflection of the light beam. Consequently, no discrimination data is transcribed to the illicit optical disc manufactured using a stamper prepared by peeling the protective film or the reflective film of the optical disc 301 and by transcribing the pit pattern of crests and recesses, thereby limiting the reproduction of the optical disc manufactured by people with ill intention.

Although the present invention has been described in connection with the optical disc, a data recording apparatus for recording discrimination data on the optical disc, and a data reproducing apparatus for reproducing the data recorded on the optical disc, according to the present invention, the present invention is not limited to such configuration. For example, in the above-described embodiment, the data is modulated with EFM for recording the data. However, as for the modulation system, there is no particular limitation to the modulation system provided that the modulation system allows for conversion of a M bit block into N bits, where M<N, such as 8-16 modulation or 8-10 modulation. The channel in which to record the discrimination data may be different than the Q channel, while the fixed value is not limited to the sub-codes of the R to W channels. Although [1] in the Q channel is changed to [0] in the 8-bit sequence, it is also possible to change [0] to [1].

Although the discrimination data is post-recorded on the replay-only optical disc, in which e.g., the contents data are recorded by forming a pit pattern on the disc substrate, it is possible to record e.g., contents data on a write-once or recordable optical disc and to record discrimination data by fusing the reflective film therein for use as an optical disc embodying the present invention.

While the invention has been described in accordance with certain preferred embodiments thereof illustrated in the accompanying drawings and described in the above description in detail, it should be understood by those ordinarily skilled in the art that the invention is not limited to the embodiments, but various modifications, alternative constructions or equivalents can be implemented without departing from the scope and spirit of the present invention as set forth and defined by the appended claims.

INDUSTRIAL APPLICABILITY

In recording further data in a recording medium in which data modulated from M bit data to N bit data, where M<N, are already recorded, the further data are recorded such that certain bits in the N-bit data are changed and the remaining bits of the N bits are fixed, so that it is possible to record data for discriminating main data, such as contents data, in an area where data has already been recorded, as compatibility with the pre-existing format is maintained. As a result, reliable protection of the main data, such as contents data, recorded on each recording medium, may be achieved.

The invention claimed is:

1. A method of recording discrimination data to a recording medium, comprising:
   pre-recording data modulated from M bit data to N bit data to the recording medium, where M<N,
   recording further discrimination data in such a manner that a certain bit or bits of said N bits are changed on the disc by altering a reflectance property of a reflective layer of the disc, with the remaining bits of said N-bit data being un-changed with respect to the pre-recorded state.

2. The recording method according to claim 1 wherein said N-bit data are pre-recorded as a pattern of crests and recesses comprised of pit parts and land parts delimited in-between said pit parts.

3. The recording method according to claim 2 wherein further data are recorded by changing the land part of said N-bit data to the pit part.

4. The recording method according to claim 3 wherein discrimination data are recorded by changing a certain bit or bits of said N-bit data.

5. The recording method according to claim 4 wherein said discrimination data include data for specifying an area for recording the discrimination data.

6. The recording method according to claim 4 wherein main data including contents data and sub-code data are recorded by modulation on said N-bit data on said recording medium and wherein said certain bit or bits is a bit or bits pertinent to said sub-code data.

7. The recording method according to claim 6 wherein said N-bit data recorded on said recording medium is data obtained on modulating said M-bit data by 8-14 modulation.

8. The recording method according to claim 1 wherein said N-bit data include coupling bits.

9. The recording method according to claim 8 wherein said N-bit data are pre-recorded on said recording medium as a pattern of crests and recesses composed of bit parts and land parts between said bit parts and wherein the coupling bits are selected so that an area where said certain bit or bits are changed and recorded is a land.

10. The recording method according to claim 9 wherein further bits are recorded by changing a land part of said N-bit data into a pit part.

11. The recording method according to claim 10 wherein said N-bit data recorded on said recording medium is data of said M bits modulated on 8-14 modulation.

12. The recording method according to claim 11 wherein said N-bit data are changed from 0X47h to 0X07h or vice versa as a result of changing said certain bit or bits.

13. The recording method according to claim 11 wherein said N-bit data are changed from 0X44h to 0X04h or vice versa as a result of changing said certain bit or bits.

14. The recording method according to claim 11 wherein said N-bit data are changed from 0X40h to 0X00h or vice versa as a result of changing said certain bit or bits.

15. The recording method according to claim 8 wherein said N-bit data are pre-recorded on said recording medium as a pattern of crests and recesses composed of bit parts and land parts between said bit parts and wherein said coupling bits positioned between said N-bit data in which said certain bit or bits have been changed and N-bit data next following said first-stated N-bit data are selected so as to be changed from the land part to the pit part or vice versa.

16. The recording method according to claim 15 wherein said further data are recorded by changing said land part of said N-bit data to a pit part.

17. The recording method according to claim 16 wherein said N-bit data recorded on said recording medium is data obtained on modulating said M-bit data by 8-14 modulation.

18. The recording method according to claim 17 wherein a pattern different than [000] is selected as said coupling bits.

19. The recording method according to claim 17 wherein a pattern of [100] is selected as said coupling bits.

20. The recording method according to claim 1 wherein it is verified whether or not the remaining data portion of said N bits is of a fixed value and wherein, if the remaining pattern of said N bits is determined to be of said fixed value, the data of said certain bit or bits is changed to effect recording.

21. The recording method according to claim 20 wherein, if the remaining data portion of said N bits is determined to be not of said fixed value, the recording operation is not effected.

22. The recording method according to claim 20 wherein, if the remaining data portion of said N bits is determined to be of said fixed value, the data of said certain bit or bits is changed to effect recording of said discrimination data.

23. The recording method according to claim 22 wherein main data including contents and sub-code data are recorded by modulation thereof to said N-bit data on said recording medium and wherein said certain bit or bits is a bit or bits pertinent to said sub-code data.

24. The recording method according to claim 22 wherein it is verified whether or not said certain bit or bits are of a preset value and wherein, if said certain bit or bits are of a preset value, said discrimination data is recorded.

25. A recording apparatus comprising:
a head unit configured to scan a recording medium having pre-recorded thereon data obtained by modulating M-bit data into N-bit data, where M<N, as a pattern of crests and recesses composed of bit parts and land parts between said bit parts;
a controller configured to control whether or not discrimination data is to be recorded to the recording medium based on data read out from said head unit; and
a signal processing unit configured to process said discrimination data for recording, and for supplying output data to said head unit;
said head unit recording said discrimination data so that said certain bit or bits of said pre-recorded N-bit data are changed on the disc by altering a reflectance property of a reflective layer of the disc, with the remaining bits of said N-bit data being fixed.

26. The recording apparatus according to claim 25 wherein said discrimination data are recorded by changing said land part of said N-bit data into a pit part by said head unit.

27. The recording apparatus according to claim 25 wherein said discrimination data includes data for specifying an area of recording the discrimination data.

28. The recording apparatus according to claim 25 wherein main data including contents data and sub-code data are recorded by modulation on said N-bit data on said recording medium and wherein said certain bit or bits is a bit or bits pertinent to said sub-code data.

29. The recording apparatus according to claim 28 wherein the N-bit data recorded on said recording medium is data obtained on modulating said M-bit data by 8-14 modulation.

30. The recording apparatus according to claim 25 wherein said N-bit data include coupling bits.

31. The recording apparatus according to claim 30 wherein said signal processor selects said coupling bits so that the area in which said certain bit or bits are changed by way of recording is a land.

32. The recording apparatus according to claim 28 wherein said discrimination data is recorded by changing said land part of said N-bit data to said pit part by said head unit.

33. The recording apparatus according to claim 32 wherein said N-bit data recorded on said recording medium is data obtained on modulating said M-bit data by 8-14 modulation.

34. The recording apparatus according to claim 33 wherein said N-bit data are changed from 0X47h to 0X07h or vice versa as a result of changing said certain bit or bits.

35. The recording apparatus according to claim 33 wherein said N-bit data are changed from 0X44h to 0X04h or vice versa as a result of changing said certain bit or bits.

36. The recording apparatus according to claim 33 wherein said N-bit data are changed from 0X40h to 0X00h or vice versa as a result of changing said certain bit or bits.

37. The recording apparatus according to claim 30 wherein said signal processor selects said coupling bits positioned between said N-bit data in which said certain bit or bits have been changed and N-bit data next following said first-stated N-bit data so that said coupling bits are changed from the land part to the pit part or vice versa.

38. The recording apparatus according to claim 37 wherein said discrimination data are recorded by said head unit changing said land part of said N-bit data to a pit part.

39. The recording apparatus according to claim 38 wherein said N-bit data recorded on said recording medium is data obtained on modulating said M-bit data by 8-14 modulation.

40. The recording apparatus according to claim 39 wherein said signal processor selects a pattern different than [000] as said coupling bits.

41. The recording apparatus according to claim 39 wherein said signal processor selects a pattern of [100] as said coupling bits.

42. The recording apparatus according to claim 25 wherein said controller verifies whether or not the remaining data portion of said N bits is of a fixed value and wherein, if the remaining pattern of said N bits is determined to be of said fixed value, the data of said certain bit or bits is changed to effect recording.

43. The recording apparatus according to claim 42 wherein said controller includes a decision unit for verifying whether or not the remaining data portion of said N bits is of a fixed value and a switching circuit unit which is changed over based on the result of decision by said decision unit and wherein said switching circuit unit is changed over so that said discrimination data is input to said signal processor when the remaining pattern of said N bits is determined to be of said fixed value.

44. The recording apparatus according to claim 42 wherein, if the remaining data portion of said N bits is verified to be not said fixed value, said controller does not perform a recording operation.

45. The recording apparatus according to claim 42 wherein, if the remaining data portion of said N bits is determined to be of said fixed value, the data of said certain bit or bits is changed to effect recording.

46. The recording apparatus according to claim 45 wherein main data including contents data and sub-code data are recorded by modulation thereof to said N-bit data on said recording medium and wherein said certain bit or bits is a bit or bits pertinent to said sub-code data.

47. The recording apparatus according to claim 45 wherein said controller verifies whether or not said certain bit or bits are of a preset value and wherein, if said certain bit or bits are of a preset value, said discrimination data is recorded.

48. The recording apparatus according to claim 25 wherein said controller includes a detection unit for detecting whether or not the recording position of said discrimination data on said recording medium is a land part an wherein, if said detection unit has detected that said recording position is the land part, said discrimination data is recorded on said recording medium.

49. A method for reproducing data modulated from M bit data to N bit data, where M<N, from a recording medium having said data pre-recorded thereon, said recording medium also having further data recorded thereon expressed apart from the pre-recorded data as a reflectance property of a reflective layer of the medium so that a certain bit or bits of said re-recorded N-bit data are changed, with the remaining portion of the bits of the N-bit data being fixed with respect to the pre-recorded state, said method comprising:
  reading out the pre-recorded data from said recording medium;
  extracting the remaining portion of the bits of the N-bit data of the read-out data;
  determining whether or not the remaining portion of the bits of the N-bit data extracted is of a fixed value; and
  determining whether or not there is an error if the extracted remaining portion of the N-bit data is of a fixed value.

50. The reproducing method according to claim 49 wherein discrimination data is recorded by changing a certain bit or bits of said N-bit data.

51. The reproducing method according to claim 50 wherein main data including contents data and sub-code data are recorded by modulation thereof to said N-bit data on said recording medium and wherein said certain bit or bits is a bit or bits pertinent to said sub-code data.

52. The reproducing method according to claim 50 wherein said N-bit data recorded on said recording medium is data obtained on modulating said M-bit data by 8-14 modulation.

53. The reproducing method according to claim 49 wherein the extracted remaining portion of said N-bit data is compared to a stored fixed value; and wherein
  it is verified whether or not the extracted remaining portion of said N-bit data is coincident with said fixed value.

54. A method for reproducing data modulated from M bit data to N bit data, where M<N, from a recording medium having said data pre-recorded thereon, said recording medium also having further data recorded thereon expressed apart from the pre-recorded data as a reflectance property of a reflective layer of the medium so that a certain bit or bits of said pre-recorded N-bit data are changed, with the remaining portion of the bits of the N-bit data being fixed with respect to the pre-recorded state, said method comprising:
  reading out the pre-recorded data from said recording medium;
  extracting the remaining portion of the bits of the N-bit data of said read-out data;
  determining whether or not the remaining portion of the bits of the N-bit data extracted is a fixed value; and
  reproducing said further recorded data if the extracted remaining portion of the N-bit data is of said fixed value.

55. The reproducing method according to claim 54 wherein the extracted remaining portion of said N-bit data is compared to a stored fixed value; and wherein
  it is verified whether or not the extracted remaining portion of said N-bit data is coincident with said fixed value.

56. The reproducing method according to claim 54 wherein, if the extracted remaining portion of the N-bit data is determined to be not of a fixed value, the reproduction of said recording medium is inhibited.

57. The reproducing method according to claim 54 wherein, if the extracted remaining portion of the N-bit data is determined to be not of a fixed value, the next following N-bit data are accessed.

58. The reproducing method according to claim 54 wherein discrimination data are recorded on said recording medium by changing said certain bit or bits of said N-bit data.

59. The reproducing method according to claim 58 wherein main data including contents and sub-code data are recorded by being modulated to said N-bit data and wherein said certain bit or bits are the bit or bits pertinent to said sub-code data.

60. The reproducing method according to claim 59 wherein said N-bit data recorded on said recording medium is data obtained on modulating said M-bit data on 8-14 modulation.

61. A method for reproducing data modulated from M bit data to N bit data, where M<N, from a recording medium having said data pre-recorded thereon, said recording medium also having further data recorded thereon expressed apart from the pre-recorded data as a reflectance property of a reflective layer of the medium so that a certain bit or bits of said pre-recorded N-bit data are changed, with the remaining portion of the bits of the N-bit data being fixed with respect to the pre-recorded state, said method comprising:

reading out the pre-recorded data from said recording medium;

detecting whether or not said certain bit or bits of the N-bit data read out is of a fixed value; and reproducing the further recorded data if said certain bit or bits is not of said fixed value.

62. The reproducing method according to claim 61 wherein, if said certain bit or bits is not of said preset value, reproduction of said further recorded data is inhibited.

63. The reproducing method according to claim 61 wherein, if said certain bit or bits is of said preset value, reproduction of said recording medium is inhibited.

64. The reproducing method according to claim 61 wherein discrimination data is recorded on said recording medium by changing a certain bit or bits of said N-bit data.

65. The reproducing method according to claim 64 wherein main data including contents and sub-code data are recorded by modulation thereof to said N-bit data and wherein said certain bit or bits are bits pertinent to said sub-code data.

66. The reproducing method according to claim 65 wherein said N-bit data recorded on said recording medium is data obtained on modulating said M-bit data by 8 to 14 modulation.

67. A reproducing apparatus comprising:

a head unit configured to read out data modulated from M bit data to N bit data, where M<N, from a recording medium having said data pre-recorded thereon, said recording medium also having further data recorded thereon expressed apart from the pre-recorded data as a reflectance property of a reflective layer of the medium so that a certain bit or bits of said pre-recorded N-bit data are changed, with the remaining portion of the bits of the N-bit data being fixed with respect to the pre-recorded state;

a demodulating unit configured to demodulate the data read out by said head unit; and a controller configured to extract the remaining portion of the bits of the pre-recorded N-bit data read out by said head unit, verifying whether or not the remaining portion of the bits of the N-bit data extracted is of a fixed value, and for supplying said further recorded data to said demodulating unit if the extracted remaining portion of the bits of the N-bit data is verified to be of said fixed value.

68. The reproducing apparatus according to claim 67 wherein said controller has a storage unit for storing said fixed value; said controller comparing the extracted remaining portion of the bits of the N-bit data to said fixed value stored in said storage unit for verifying whether or not the extracted remaining portion of the bits of the N-bit data coincides with said fixed value.

69. The reproducing apparatus according to claim 67 wherein, if the extracted remaining portion of the bits of the N-bit data is determined to be not of said fixed value, said controller inhibits the reproduction of said recording medium.

70. The reproducing apparatus according to claim 67 wherein, if the extracted remaining portion of the bits of the N-bit data is determined to be not of said fixed value, said controller accesses the next N-bit data.

71. The reproducing apparatus according to claim 67 wherein discrimination data is recorded on said recording medium by changing a certain bit or bits of said N-bit data.

72. The reproducing apparatus according to claim 71 wherein main data including contents data and sub-code data are recorded by modulation thereof to said N-bit data and wherein said certain bit or bits are pertinent to said sub-code data.

73. The reproducing apparatus according to claim 72 wherein said N-bit data recorded on said recording medium is data obtained on modulating said M-bit data by 8-14 modulation.

74. A recording medium including pre-recorded data modulated from M bit data to N bit data, where M<N, and on which further data are recorded as discrimination data by altering a reflectance property of a reflective layer of the recording medium so that a certain bit or bits of said pre-recorded N-bit data are changed, with the remaining portion of the bits of the N-bit data being fixed with respect to the pre-recorded state, wherein a recording reproducing apparatus accessing the medium recognizes the discrimination data for processing relative to the pre-recorded data.

75. The recording medium according to claim 74 wherein said N-bit data are pre-recorded as a pattern of crests and recesses comprised of pit parts and land parts delimited in-between said pit parts.

76. The recording medium according to claim 75 wherein further data are recorded by changing a land part of said N-bit data to a pit part.

77. The recording medium according to claim 76 wherein discrimination data are recorded by changing a certain bit or bits of said N-bit data.

78. The recording medium according to claim 77 wherein said discrimination data include data for specifying an area for recording the discrimination data.

79. The recording medium according to claim 77 wherein main data including contents data and sub-code data are recorded by modulation thereof to said N-bit data on said recording medium and wherein said certain bit or bits is a bit or bits pertinent to said sub-code data.

80. The recording medium according to claim 79 wherein said N-bit data recorded on said recording medium is data obtained on modulation of said M-bit data on 8-14 modulation.

81. The recording medium according to claim 74 wherein said N-bit data includes coupling bits.

82. The recording medium according to claim 81 wherein said N-bit data are pre-recorded on said recording medium as a pattern of crests and recesses composed of bit parts and land parts between said bit parts and wherein the coupling bits are selected so that an area where said certain bit or bits are changed and recorded is a land.

83. The recording medium according to claim 82 wherein further bits are recorded by changing a land part of said N-bit data into a pit part.

84. The recording medium according to claim 83 wherein said N-bit data is data obtained on modulating said M-bit data with 8-14 modulation.

85. The recording medium according to claim 84 wherein said N-bit data is changed from 0X47h to 0X07h or vice versa as a result of changing said certain bit or bits.

86. The recording medium according to claim 84 wherein said N-bit data are changed from 0X44h to 0X04h or vice versa as a result of changing said certain bit or bits.

87. The recording medium according to claim 84 wherein said N-bit data are changed from 0X40h to 0X00h or vice versa as a result of changing said certain bit or bits.

88. The recording apparatus according to claim 81 wherein said N-bit data are pre-recorded on said recording medium as a pattern of crests and recesses composed of bit parts and land parts between said bit parts and wherein said coupling bits positioned between said N-bit data in which said certain bit or bits have been changed and N-bit data next following said first-stated N-bit data are changed from the land part to the pit part or vice versa.

89. The recording medium according to claim 88 wherein said further data are recorded by changing said land part of said N-bit data to a pit part.

90. The recording medium according to claim 89 wherein said N-bit data recorded on said recording medium are data obtained on modulating said M-bit data by 8-14 modulation.

91. The recording medium according to claim 90 wherein a pattern different than [000] is selected as said coupling bits.

92. The recording medium according to claim 90 wherein a pattern of [100] is selected as said coupling bits.

* * * * *

UNITED STATES PATENT AND TRADEMARK OFFICE
CERTIFICATE OF CORRECTION

| | | |
|---|---|---|
| PATENT NO. | : 7,324,423 B2 | Page 1 of 1 |
| APPLICATION NO. | : 10/451147 | |
| DATED | : January 29, 2008 | |
| INVENTOR(S) | : Yoichiro Sako et al. | |

It is certified that error appears in the above-identified patent and that said Letters Patent is hereby corrected as shown below:

Column 60, line 12, change "re-recorded" to -- pre-recorded --.

Signed and Sealed this

Thirtieth Day of September, 2008

JON W. DUDAS
*Director of the United States Patent and Trademark Office*